US00RE38320E

(19) United States
(12) Reissued Patent
Nishi et al.

(10) Patent Number: US RE38,320 E
(45) Date of Reissued Patent: Nov. 18, 2003

(54) PROJECTION EXPOSURE APPARATUS WHEREIN FOCUSING OF THE APPARATUS IS CHANGED BY CONTROLLING THE TEMPERATURE OF A LENS ELEMENT OF THE PROJECTION OPTICAL SYSTEM

(75) Inventors: Kenji Nishi, Kanagawa-ken (JP); Kazuo Ushida, Tokyo (JP); Seiro Murakami, Chiba-ken (JP); Tohru Kiuchi, Tokyo (JP); Yasuaki Tanaka, Kanagawa-ken (JP)

(73) Assignee: Nikon Corporation, Tokyo (JP)

(21) Appl. No.: 09/809,224

(22) Filed: Mar. 16, 2001

Related U.S. Patent Documents

Reissue of:
(64) Patent No.: 5,883,704
Issued: Mar. 16, 1999
Appl. No.: 08/689,233
Filed: Aug. 6, 1996

(30) Foreign Application Priority Data

| | | |
|---|---|---|
| Aug. 7, 1995 | (JP) | 7-200800 |
| Aug. 9, 1995 | (JP) | 7-203277 |
| Sep. 11, 1995 | (JP) | 7-232274 |
| Sep. 12, 1995 | (JP) | 7-233851 |
| Nov. 10, 1995 | (JP) | 7-292362 |

(51) Int. Cl.[7] ..... G03B 27/54; G03B 27/42; G03B 27/52

(52) U.S. Cl. ..... 355/67; 355/53; 355/55; 359/820

(58) Field of Search ..... 355/53, 55, 57, 355/67, 72, 77; 359/820

(56) References Cited

U.S. PATENT DOCUMENTS

| | | | | |
|---|---|---|---|---|
| 4,583,840 A | | 4/1986 | Yabu et al. | |
| 4,690,528 A | | 9/1987 | Tanimoto et al. | |
| 4,730,900 A | | 3/1988 | Uehara et al. | |
| 4,786,947 A | | 11/1988 | Kosugi et al. | |
| 4,825,247 A | | 4/1989 | Kemi et al. | |
| 5,270,771 A | | 12/1993 | Sato | |
| 5,309,198 A | | 5/1994 | Nakagawa | |
| 5,489,966 A | | 2/1996 | Kawashima et al. | |
| 5,581,324 A | | 12/1996 | Miyai et al. | |
| 5,805,273 A | * | 9/1998 | Unno | 355/30 |

FOREIGN PATENT DOCUMENTS

| | | |
|---|---|---|
| JP | A-4-86668 | 3/1992 |

* cited by examiner

*Primary Examiner*—Russell Adams
*Assistant Examiner*—Peter B. Kim
(74) *Attorney, Agent, or Firm*—Oliff & Berridge PLC

(57) ABSTRACT

A projection optical system of a projection exposure apparatus according to the present invention has a plurality of optical members made of glass materials at least one of which has a temperature characteristic of index of refraction different from that of the other glass material. Further, a temperature control device for controlling a temperature of at least one of the optical members is provided. An imaging characteristic of the projection optical system is controlled. The imaging characteristic to be controlled is a non-linear magnification or curvature of field. The temperature control device sets the temperature to be controlled to a variable target temperature determined in accordance with the imaging characteristic of the projection optical system. An exposing operation for transferring a mask pattern to a photosensitive substrate is started after the temperature of the optical member to be controlled reaches a predetermined allowable range of the target temperature.

59 Claims, 45 Drawing Sheets

FIG. 8
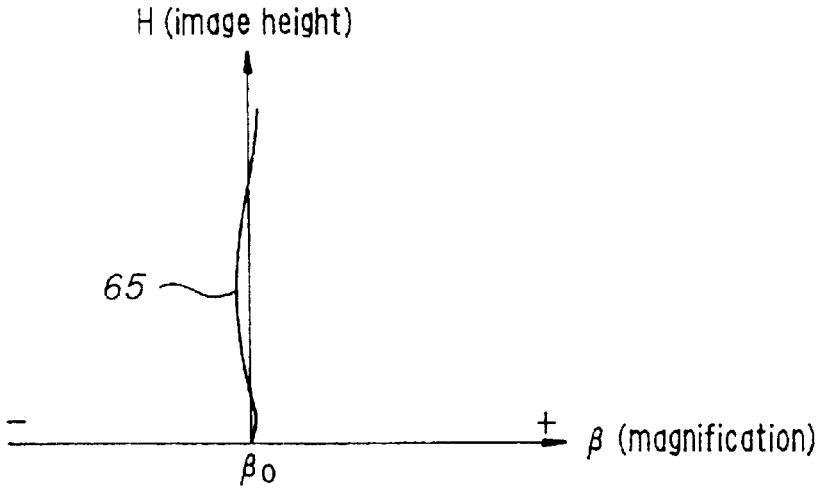
FIG. 9(a)
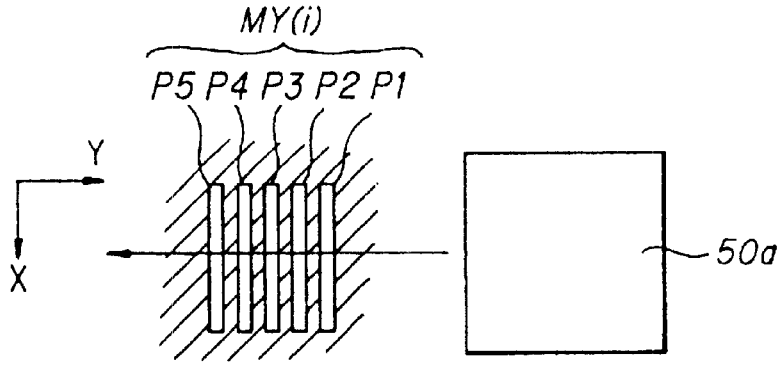
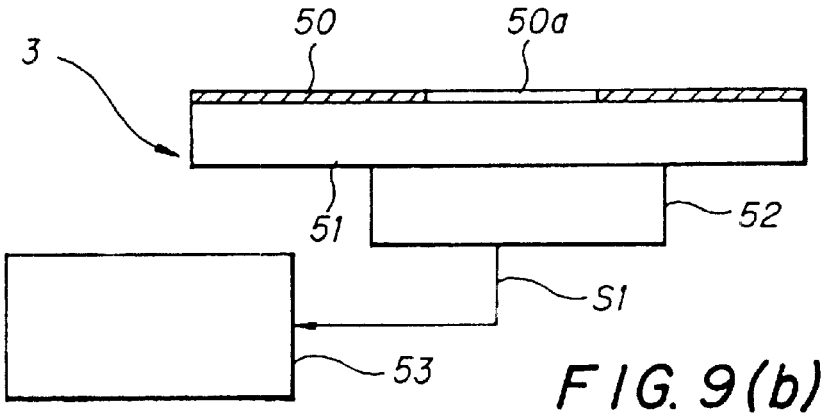
FIG. 9(b)

FIG. 23
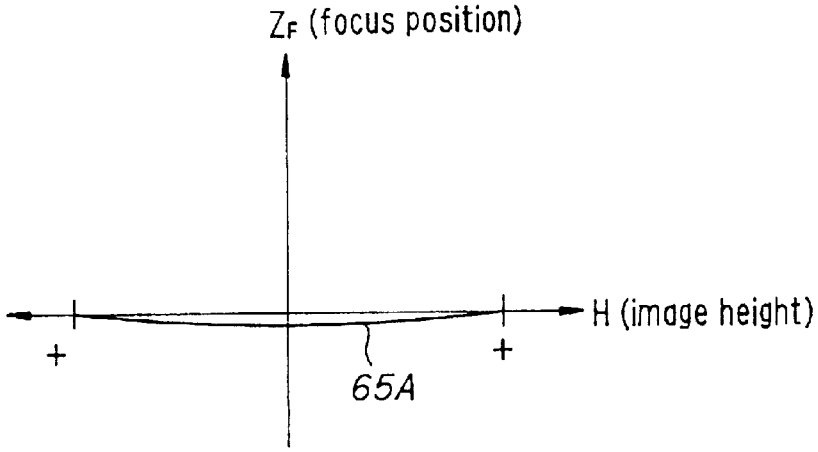
FIG. 24(a)
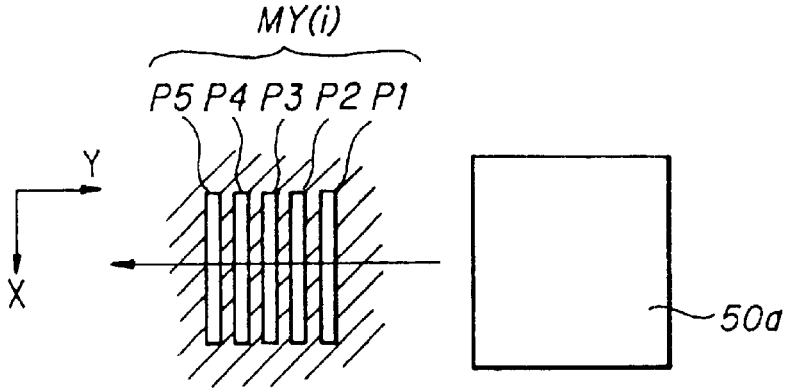
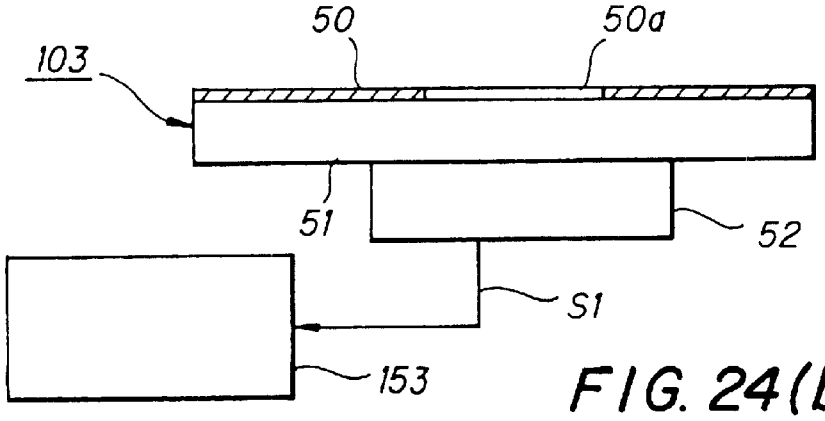
FIG. 24(b)

FIG. 40

| address | data |
|---|---|
| | temperature variable end flag ( "1" or "0" ) |
| | target temperature T |
| | allowable width ΔT |
| ⋮ | ⋮ |

260

PROJECTION EXPOSURE APPARATUS WHEREIN FOCUSING OF THE APPARATUS IS CHANGED BY CONTROLLING THE TEMPERATURE OF A LENS ELEMENT OF THE PROJECTION OPTICAL SYSTEM

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a projection exposure apparatus which is used in a lithography process for manufacturing semiconductor elements, imaging elements (CCD), liquid crystal display elements, thin film magnetic heads or the like, for example and in which a mask pattern is transferred onto a photosensitive substrate through a projection optical system.

2. Related Background Art

Projection exposure apparatuses for manufacturing a semiconductor element such as IC, LSI and the like are generally categorized into a projection exposure apparatus of step-and-repeat type in which a reticle as a mask and shot areas of a wafer (or glass plate and the like) as photosensitive substrate are positioned relative to each other in a predetermined positional relation by using a projection optical system and pattern images on the reticle are collectively transferred to the entirety of each shot area, and a projection exposure apparatus of step-and-scan type in which the pattern images on the reticle are successively transferred to each of the shot areas of the wafer by scan-moving the reticle and the shot areas relative to the projection optical system. These two types are in common in the point that the reticle pattern is projected through the projection optical system. In this regard, it is important how the reticle pattern is correctly projected onto the wafer.

In general, although the projection optical system is designed so that various optical aberrations become substantially "zero" under a predetermined condition, if an atmospheric pressure and/or a temperature around the projection optical system is changed due to the change in the environment during the projection exposure or if heat absorption occurs due to the illumination of exposure illumination light, there will occur the change in index of refraction of fluid existing between lens elements of the projection optical system, expansion of the lens elements, the change in index of refraction of the lens elements, and expansion of lens barrel. As a result, when the reticle pattern is projected onto the wafer, a distortion phenomenon (that the projected image is deviated in a direction perpendicular to an optical axis of the projection optical system) occurs. Such distortion is categorized into a liter error (component that a focusing position is changed with respect to an image height in a linear function manner) and a non-linear error (components other than the linear error), and the linear error is also called as "linear magnification error" (component that the magnification is changed with respect to the image height in a linear function manner). In the past, in order to correct the linear magnification error, there has been utilized a lens control system in which some of lens elements in the projection optical system is driven or pressure of the fluid between some lens elements is controlled.

However, if the non-linear error exists in the projection optical system, in both projection optical systems of step-and-repeat type of step-and-scan type, the projected image will be distorted, thereby worsening the aligning accuracy.

The present invention aims to eliminate the above-mentioned conventional drawback, and an object of the present invention is to provide a projection exposure apparatus in which the distortion that is worsened by the change in an environment condition such as atmospheric pressure and a temperature around a projection optical system and the absorption of exposure illumination light (particularly, a non-linear magnification error (higher order error)) can be corrected.

If the above-mentioned change in index of refraction of the fluid existing between the lens elements of the projection optical system, expansion of the lens elements, change in index of refraction of the lens elements and expansion of lens barrel occur, when the reticle pattern is projected onto the wafer, a position (focus position) of an image plane (best focus plane) for the projected image is devised or displaced in an optical axis of the projection optical system, thereby causing a defocus phenomenon in which the surface of the wafer is deviated out of the image plane. Such defocus is categorized into linear defocus (component that a defocus amount is changed with respect to the image height in a linear function manner) and non-linear defocus (components other than the linear defocus). In the past, in order to correct the linear defocus, there have been proposed an auto focus mechanism in which the focus position of the wafer is controlled along the direction of the image plane and an auto levelling mechanism in which an inclination angle of the wafer is controlled to be aligned with the image plane.

However, if the non-linear defocus such as curvature of field occurs in the image plane of the projection optical system, in both projection optical systems of step-and-repeat type and of step-and-scan type, focal depth of the eventually obtained image plane will be entirely narrowed, thereby deteriorating the resolving power.

The present invention aims to eliminate the above-mentioned conventional drawback, and another object of the present invention is to provide a projection exposure apparatus in which defocus of an image plane of a projection optical system that is worsened by the change in an environmental condition such as atmospheric pressure around the projection optical system, the absorption of exposure illumination light or flexure of a reticle (particularly, non-linear defocus such as curvature of field) can be corrected.

To solve the above problems, it is considered that a temperature of at least one lens element of the projection optical system is adjusted. When the lens elements is heated or cooled to achieve a target temperature of the lens element, a predetermined time period is elapsed until the target temperature of the lens element is obtained. Accordingly, if the exposure is started before such time period is elapsed, the exposure will be effected before the imaging characteristic of the lens element is corrected. A further object of the present invention is to provide a projection exposure apparatus in which the exposure is effected after predetermined temperature adjustment is completed.

Regarding the temperature adjustment, not only it takes a long time to achieve the target temperature of the lens element, but also a device for effecting the temperature adjustment is complicated. Accordingly, it is desirable to provide a projection exposure apparatus in which the imaging characteristic can be corrected without the temperature adjustment and the corrected condition is not substantially changed even if environmental conditions are changed. A still further object of the present invention is to provide such a projection exposure apparatus.

During the exposure, when the illumination light having high illumination energy is directed, the imaging characteristic is often gradually changed from an initial condition due to the absorption of the illumination light of the projection optical system. To eliminate this drawback, there have been proposed various methods for keeping the entire temperature of the projection optical system constant in order to maintain the initial condition of the imaging characteristic of the projection optical system. For example, a method in which temperature-adjusted air is supplied around the projection optical system to keep the temperature of the projection optical system constant has been proposed.

In the above-mentioned conventional techniques, since the entire projection optical system is uniformly cooled, the temperature of the projection optical system as a whole can be kept substantially constant. However, due to the difference in light paths for the illumination light beam in the projection optical system caused by the difference in illumination condition and/or the difference in kind of patterns to be exposed, it is inevitable that temperature distribution occurs in the projection optical system. And, as the reduction of a line width achieved by remarkable progress of the recent high density integrated circuits is advanced, the fluctuation in the focusing ability of the projection optical system becomes innegligible more and more.

Further, as the reduction of the line width is advanced, illumination light having a short wavelength (for example, ultraviolet light which can provide high resolving power, far-ultraviolet light such as ArF excimer laser light (having a wavelength of 193 cm) and the like) has been used. However, since such short wavelength includes an oxygen absorption band, there arises a problem that a part of illumination energy of the illumination light which should be used to effect the exposure is absorbed to the oxygen in air. Further, illumination light beams having a wavelength shorter than the ultraviolet zone tend to cause a photochemical reaction for changing the oxygen in air to ozone. The illumination energy of the illumination light is also absorbed to the ozone generated by such a photochemical reaction.

When the illumination light having the wavelength shorter than the ultraviolet zone is used, for example, in an apparatus having a pellicle (dust-proof film) for protecting the pattern area of the reticle, the oxygen is changed to the ozone by the illumination light within a closed space defined by a pellicle frame and the reticle, and the generated ozone tends to be accumulated without dispersion. Thus, there arises a problem that the energy loss due to the absorption of the illumination light is gradually increased.

The present invention aims to eliminate the above-mentioned conventional drawback, and an object of the present invention is to provide a projection exposure apparatus in which illumination energy of exposure illumination light is hard to be absorbed.

SUMMARY OF THE INVENTION

The present invention provides a projection exposure apparatus wherein a mask pattern is projected to a photosensitive substrate, comprising a projection optical system having a plurality of optical members (glass materials) at least one of which has a temperature characteristic of index of refraction different from the other glass material, and a temperature control device for controlling a temperature of at least one of the optical members, and further wherein an imaging characteristic of the projection optical system is controlled by using the temperature control device.

The imaging characteristic to be controlled may be a non-linear magnification. The non-linear magnification error may be curvature of field.

The present invention further provides a projection exposure apparatus wherein a mask pattern is projected to a photosensitive substrate, comprising a projection optical system having a plurality of optical members (glass materials) at least one of which has a temperature characteristic of index of refraction different from those of the other glass materials, a temperature control device for setting a temperature of at least one of the optical members to a variable target temperature determined by an imaging characteristic of the projection optical system, and an exposure control device for starting an exposing operation regarding the photosensitive substrate after the temperature of the optical member to be controlled by the temperature control device is contained within a predetermined allowable range for the target temperature.

The present invention also provides a projection exposure apparatus wherein a mask pattern is projected to a photosensitive substrate through a projection optical system with predetermined exposure illumination light and wherein the projection optical system has at least one set of lens elements, each set comprising two glass materials having opposite directions for changing a focus position, and the glass materials of the set of the lens elements are selected so that at least one of a focus position and a magnification error of the entire projection optical system (including the focus position and magnification error caused by expansion/contraction of a holding member for holding the set of lens elements) does not substantially change in response to predetermined temperature change.

An example of the predetermined exposure illumination light is a laser beam emitted from an excimer laser light source and having a wavelength of 100–300 nm, and, in this case, an example of the two different glass materials are quartz and fluorite.

Further, the present invention provides a projection exposure apparatus wherein a mask pattern is transferred onto a photosensitive substrate through a projection optical system with predetermined exposure illumination light and wherein there is provided a temperature control device for supplying temperature-controlled fluid having no absorption band for a wavelength of illumination light to the surroundings of lens elements (to be controlled) in the projection optical system and the temperature of the lens elements to be controlled is controlled by the temperature control device to control an imaging characteristic of the projection optical system.

The present invention further provides a projection exposure apparatus wherein a mask pattern is transferred onto a photosensitive substrate through a projection optical system with illumination light from an illumination optical system and wherein there is provided a temperature control device for supplying temperature-controlled fluid having no absorption band for a wavelength of the illumination light to an illumination lightpath between the illumination optical system and the substrate and an image characteristic of the projection optical system is controlled by the temperature control device.

The present invention also provides a projection exposure apparatus wherein a pattern on a pattern forming surface of a mask is transferred onto a photosensitive substrate through a projection optical system with predetermined exposure illumination light and wherein a light permeable dust-proof film is disposed with respect to the pattern forming surface of the mask with a predetermined gap therebetween and fluid having no absorption band for a wavelength of the illumination light is trapped between the mask and the dust-proof films.

Lastly, the present invention also provides a projection exposure surface wherein a mask pattern is transferred onto a photosensitive substrate through a projection optical system with illumination light from an illumination optical system and wherein there is provided a correction device for correcting the change in an imaging characteristic due to accumulation of heat of the illumination light and environmental change and the correction device includes two or more different control systems and substrate lift/lower mechanisms so that a non-linear magnification error and curvature of field are corrected by combination of the control system and substrate lift/lower mechanisms.

According to the present invention, for example, when far-ultraviolet light such as KrF excimer laser light (having a wavelength of 248 nm) or ArF excimer laser light (having a wavelength of 193 nm) is used as the exposure light, quartz and fluorite are used as the plural glass materials having different temperature characteristics of index of refraction. In this case, since the quart has small expansion coefficient, when the quartz is heated, it is not expanded, but, the index of refraction of the quartz is increased. On the other hand, as the temperature is increased, the fluorite is expanded, but, the index of refraction of the fluorite is decreased. These features will be explained later with reference to the accompanying drawings.

BRIEF DESCRIPTION OF THE DRAWINGS

FIG. 8 is a graph showing a magnification error (distortion) obtained by combination of a lens element made of quartz, a lens element made of temperature-controlled fluorite and a lens control device;

FIG. 9 is a constructional view showing a mechanism for measuring the distortion, where section (a) is a plan view showing an opening portion of a distortion measuring sensor 3 and projected images of evaluating marks, and section (b) is a constructural view, in partial section, showing a construction of the distortion measuring sensor 3;

FIG. 23 is a graph showing the distribution of focus positions (curvature of field) obtained by combination of a lens element made of quartz, a lens element made of temperature-controlled fluorine an a focus position control mechanism (wafer stage);

FIG. 24 is a constructional view showing a mechanism for measuring the imaging characteristic, where section (a) is a plan view showing an opening portion of an imaging characteristic measuring sensor 3 and projected images of evaluating marks, and section (b) is a constructional view, in partial section, showing a construction of the imaging characteristic measuring sensor 3;

FIG. 40 is a view showing data stored in a common working area of memories in a main control device of FIG. 2;

DETAILED DESCRIPTION

First of all, a projection exposure apparatus according to a first embodiment of the present invention will be explained with reference to FIGS. 1, 2 and 6 to 14. In this embodiment, the present invention is applied to a projection exposure apparatus of step-and-scan type in which excimer laser light is used as exposure illumination light. However, a projection optical system used in this embodiment has such an ability as that it can also be used in a projection exposure apparatus of step-and-repeat type (collective exposure type).

Prior to the explanation of the first embodiment, in order to enhance the understanding of a non-linear error of distortion handled by the present invention, the non-linear error will be generally described with reference to FIGS. 15 and 16.

In conventional projection exposure apparatuses, there arose a problem that a non-linear error of distortion of the projection optical system generated by the change in an environmental condition cannot be corrected. A main portion of the non-linear error is a non-linear magnification error (high order magnification error) the magnification of which is changed in a secondary or more function manner in accordance with a height of the projected image. However, also in a condition as a reference condition in design, the projection optical system includes the small non-linear magnification error which is negligible in the practical use, and, as shown in a section (a) of FIG. 15, the magnification $\beta$ (projection magnification from a reticle to a wafer) of the projection optical system is slightly changed from design value $\beta_0$ in a non-linear manner in accordance with the image height. Regarding the reference condition, if the change in atmospheric pressure and/or heat absorption due to illumination of exposure illumination light occurs, the non-linear magnification error shown in the section (a) of FIG. 15 becomes greater as shown in a section (b) of FIG. 15. Incidentally, as shown in the section (b) of FIG. 15, the non-linear magnification error in which the magnification β is changed in a negative (−) direction once and then is changed in a positive (+) direction in accordance with the image height is also called as "C-shaped distortion".

Figure 15:
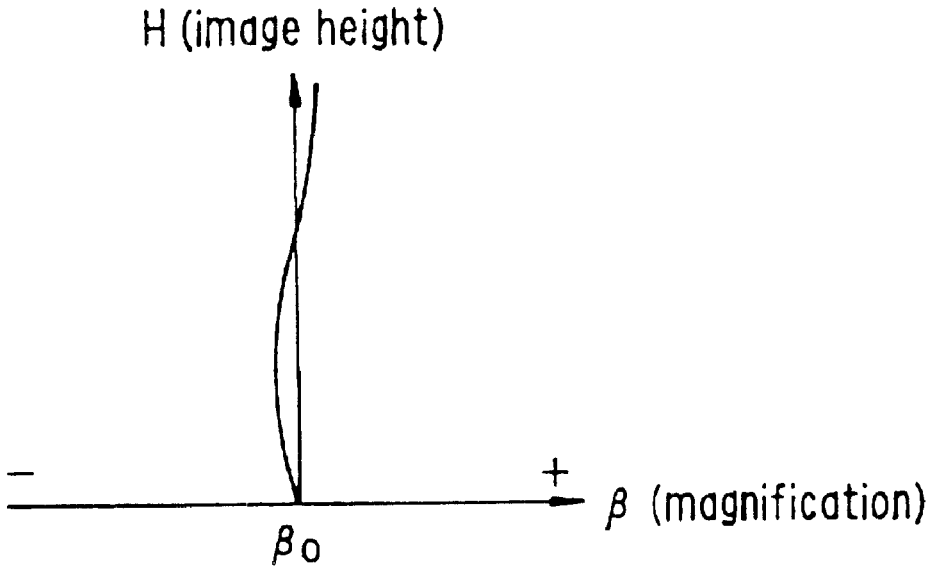
FIG. 15 is a view showing non-linear errors in a conventional projection exposure apparatus.
Figure 15:
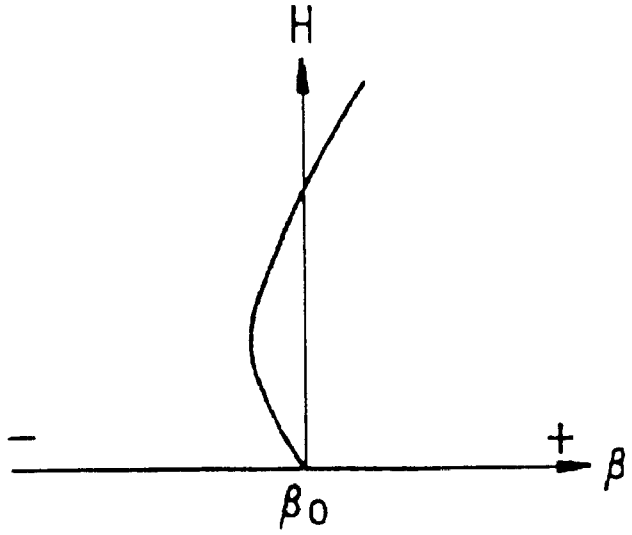
Figure 16A:
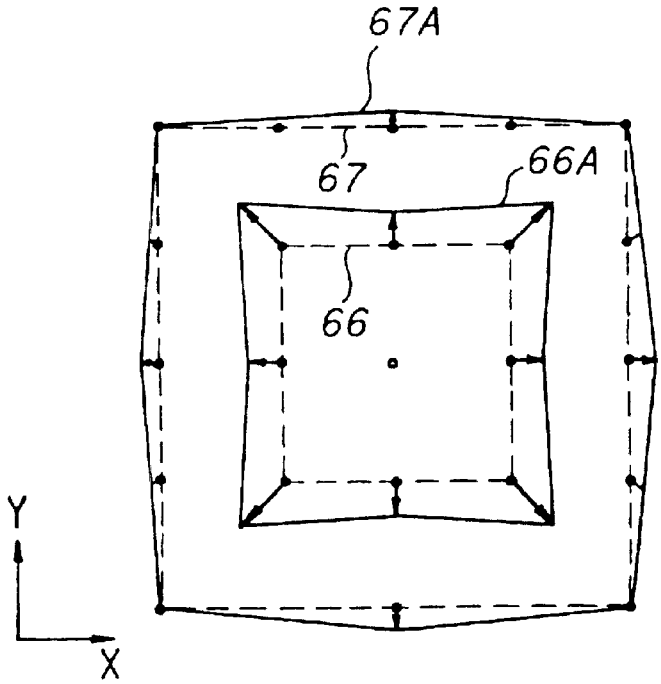
FIG. 16 is a view showing the influence of the non-linear error upon the projection, where section (a) shows the influence of the non-linear error during collective exposure, and section (b) shows the influence of the non-linear error during scan exposure.
Figure 16B:
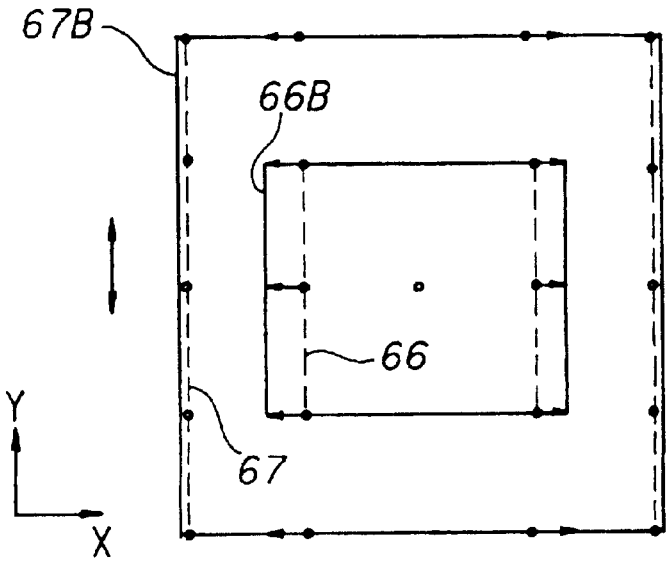

If the non-linear magnification error as shown in the section (b) of FIG. 15 is generated in the projection exposure apparatus of step-and-repeat type, as shown in a section (a) of FIG. 16, original projected image 66 and 67 are changed in the non-linear manner in accordance with the image height to form projected images 66A and 67A, thereby worsening the aligning accuracy between two layers. On the other hand, if the non-linear magnification error as shown in the section (b) of FIG. 15 is generated in the projection exposure apparatus of step-and-scan type, as shown in a section (b) of FIG. 16, the original projected images 66 and 67 are changed in the non-linear manner in accordance with the image height to form projected images 66B and 67B, thereby worsening the aligning accuracy between two layers. In the section (b) of FIG. 16, a scan direction on the wafer during the scan exposure is a direction shown by the arrow Y. Thus, the projected images are not distorted in the scan direction due to the averaging effect, but, the quality of the images is deteriorated due to the averaging effect. Further, it can be seen that the magnification error corresponding to the image height is generated in a non-scan direction (X direction), as in the collective exposure type.

Figure 1:
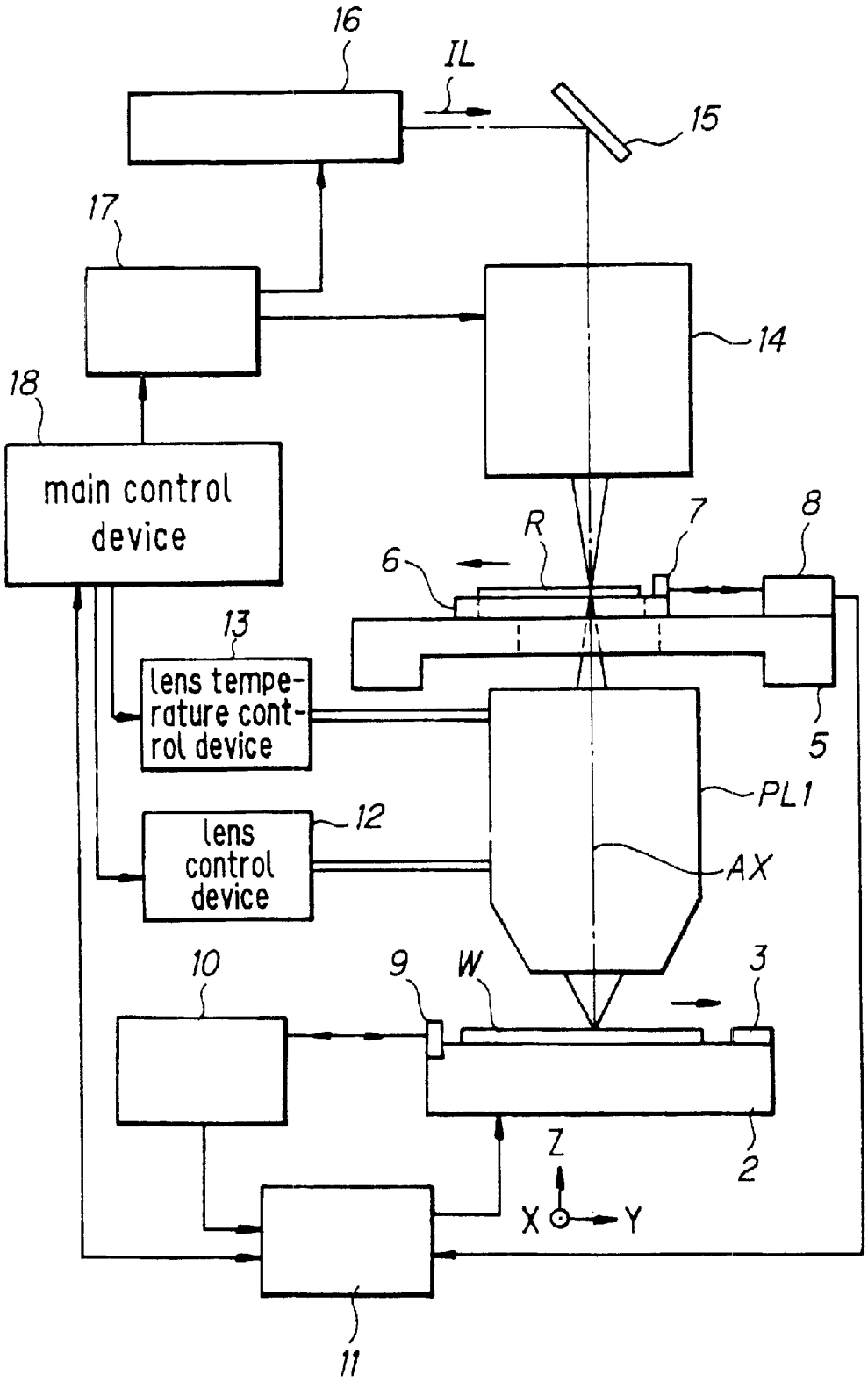
FIG. 1 is a constructural view showing a projection exposure apparatus according to a first embodiment of the present invention.

FIG. 1 shows the projection exposure apparatus according to the first embodiment. In FIG. 1, illumination light IL comprised of a pulse laser beam emitted from an excimer laser light source 16 is deflected by a mirror 15 to reach an illumination optical system 14. The excimer laser light source 16 may be a KrF excimer laser light source (having oscillation wavelength of 248 nm) or an ArF excimer laser light source (having oscillation wavelength of 193 nm). A YAG high harmonic laser generating device, a metal vapor laser light source or a memory lamp may be used as an exposure light source.

The illumination optical system 14 includes a beam expander, a light amount adjusting mechanism, a fly-eye lens, a relay lens, a field stop (reticle blind), a movable blade for avoiding undesired exposure before and after the scanning, and a condenser lens so that the illumination light IL modified by the illumination optical system 14 to have uniform illuminance distribution is directed onto a predetermined-shaped illumination area of a pattern forming surface (lower surface) of a reticle R. In this case, a main control device 18 for totally controlling the entire operation of the apparatus controls the pulse generating timing of the excimer laser light source 16 and the beam attenuation ratio of the light amount adjusting mechanism of the illumination optical system 14 through an illumination control system 17. The illumination light passed through a pattern on the illumination area of the reticle R is projected onto a wafer W (on which photoresist is coated) through a projection optical system PL1, with the result that a projected image obtained by contracting the reticle pattern with the magnification β (for example, β=¼, ⅕ or the like) is transferred to the wafer W. Now, it is assumed that a direction parallel to an optical axis AX of the projection optical system PL1 is referred to as "Z axis", a direction perpendicular to the Z axis and parallel to the plane of FIG. 1 is referred to as "Y axis" and a direction perpendicular to the plane of FIG. 1 is referred to as "X axis".

The reticle R is held on a reticle stage 6, and the reticle stage 6 is rested on a reticle support 5 via air bearings for shifting movement in the Y axis (Y direction). A Y-axis value of the reticle stage 6 measured by a shiftable mirror 7 secured to an upper surface of the reticle stage 6 and a laser interferrometer 8 secured to the reticle support 5 is supplied to a stage control system 11. The stage control system 11 serves to control a position and a shifting speed of the reticle stage 6 in response to command from the main control device 18.

The wafer W is held on a wafer stage 2, and the wafer stage 2 serves to position the wafer in the X, Y and Z direction and in a rotational direction and permits the scanning of the wafer W in the Y direction. A shiftable mirror 9 is secured to an upper surface of the wafer stage 2. By using the shiftable mirror 9 and an external laser interferometer 10, X and Y values in the X-Y coordinate system of the wafer stage 2 are always measured, and the measured result is supplied to the stage control system 11. In response to the command from the main control device 18, the stage control system 11 controls a stepping operation of the wafer stage 2 and a scanning operation in synchronous with the reticle stage 6. That is to say, during the scan exposure, by using the magnification β (from the reticle side to the wafer side) of the projection optical system PL1, under the control of the stage control system 11, the reticle stage 6 is scanned in the −Y direction (or +Y direction) at a speed of $V_R$ relative to the projection optical system PL1. In synchronous with this scanning movement, the wafer stage 2 is scanned at a speed of $V_W$ (=B×$V_R$) in the +Y direction (or −Y direction). In this way, the pattern images on the reticle R are successively transferred to shot areas on the wafer W.

A distortion measuring sensor 3 is secured on the wafer stage 2 in the vicinity of the wafer W. As shown in a section (b) of FIG. 9, the distortion measuring sensor 3 has a glass substrate 51 on which a high light shield film 50 including a rectangular opening portion 50a in the same height as a surface of the wafer W is coated, a photoelectric conversion element 52 for photoelectrically converting the exposure illumination light passed through the opening portion 50a into a detection signal, and a signal treatment portion 53 for treating the detection signal S1 from the photoelectric conversion element 52. The treated result from the signal treatment portion 53 is supplied to the main control device 18 shown in FIG. 1. In the illustrated embodiment, as will be described later, by driving the wafer stage 2, the projected image of the pattern on the reticle R is scanned by the opening portion 50a of the distortion measuring sensor 3. In this case, on the basis of the detection signal S1 outputted from the photoelectric conversion element 52, the signal treatment portion 53 seeks or determines the magnification errors (distortion) of the projection optical system PL1 at various image heights.

In the illustrated embodiment, although the projection optical system PL1 includes a plurality of lens elements, the major number of lens elements are made of quartz, and the remaining lens elements are made of fluorite. Further, there is provided a lens control device 12 for controlling pressure of gas in a predetermined gas chamber defined between two adjacent lens elements made of quartz. If the imaging characteristics of the projection optical system PL1 such as the magnification, focusing position (best focus position) and curvature of field are changed in accordance with the change in the environmental condition such as the change in atmospheric pressure or the change in temperature, or the history of the illumination amount of the exposure illumination light regarding the projection optical system PL1, the imaging characteristics are corrected by the lens control device 12 in response to the command from the main control device 18. The lens control device 12 may be a lens position control device for controlling a position (along the optical axis AX) and an inclination angle of a predetermined lens element made of quartz or fluorite, as well as a pressure control device. Alternatively, in addition to the lens control device 12 or in place of the lens control device 12, a reticle position control device for controlling a position (along the optical axis AX) and an inclination angle of the reticle R may be used.

Further, a lens temperature control device 13 for controlling a temperature or temperatures of one or more lens elements made of fluorite is connected to the projection optical system PL1. In the illustrated embodiment, if the non-linear magnification error (higher order magnification error) of the projection optical system PL1 is worsened in accordance with the change in the environmental condition or the history of the illumination amount, the non-linear magnification error is corrected by the lens temperature control device 13 on the basis of the command from the main control device 18. If the linear magnification error of the projection optical system PL1 is worsened by correcting the non-linear magnification error, the linear magnification error is corrected by the lens control device 12.

Next, the projection optical system PL1 and the lens temperature control device 13 according to the illustrated embodiment will be fully explained with reference to FIG. 2 and some other drawings.

Figure 2:
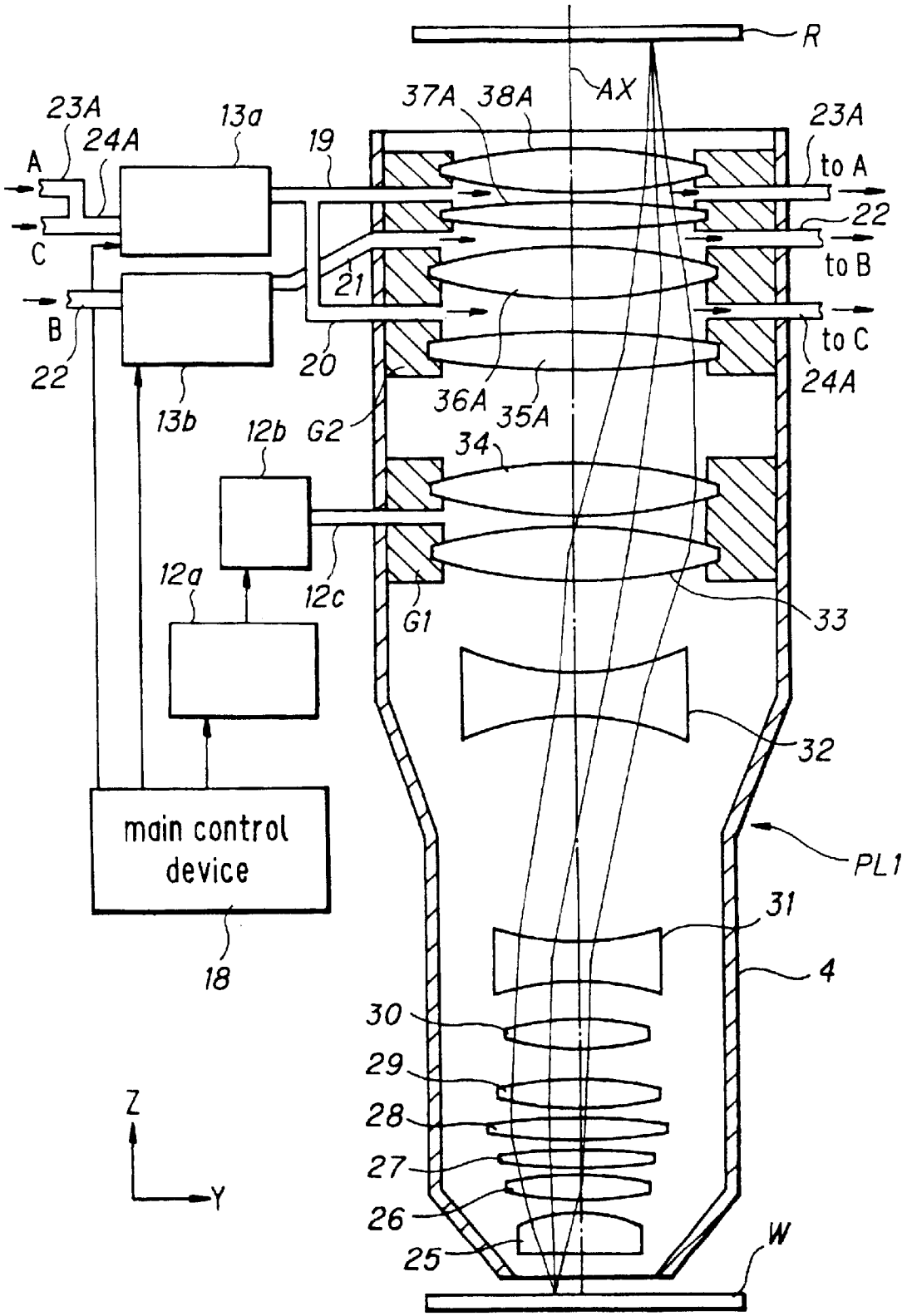
FIG. 2 is an explanatory view showing a projection optical system and an imaging characteristic correcting mechanism used in the first embodiment.

FIG. 2 shows an inner construction of the projection optical system PL1 and the imaging characteristic control system. In FIG. 2, as an example, the projection optical system PL1 has a lens barrel 4 within which six lens elements 25–30, four lens elements 31–34 and four lens elements 35A–38A are fixed mounted (in this order from the wafer side). The lens elements 36A and 37A are made of fluorite, and the other lens elements are made of quartz. The lens elements 33 and 34 are secured to the lens barrel 4 via a lens frame G1, the lens elements 35A–38A are secured to the lens barrel 4 via a lens frame G2, and the other lens elements are secured to the lens barrel 4 via lens frames (not shown).

In this case, a gas chamber enclosed by the lens elements 33, 34 and the lens frame G1 is sealed, but, this gas chamber is connected to a bellows mechanism 12b via a piping 12c, and an expansion/contraction amount of the bellows mechanism 12b is controlled by a control portion 12a. The lens control device 12 of FIG. 1 is constituted by the control portion 12a, bellows mechanism 12b and piping 12c, and, by adjusting the expansion/contraction amount of the bellows mechanism 12b, a pressure of the gas (for example, air) in the gas chamber is controlled.

Gas having a temperature determined by the main control device 18 is supplied, from a temperature control device 13b, through a piping 21, to a gas chamber enclosed by the lens elements 36A, 37A and the lens frame G2, and the gas circulating in the gas chamber is returned to the temperature control device 13b through a piping 22. When the gas supplied to the gas chamber has the same constituents as those of the gas (air) surrounding the projection optical system PL1, there is no need that the gas passed through the gas chamber is returned to the temperature control device 13b through the piping 22. However, for example, when gas (for example, nitrogen gas) a temperature of which can easily be controlled is used, it is necessary to use the piping 22 for effecting closed-loop temperature control.

In the illustrated embodiment, since the temperatures of the lens elements 36A and 37A are controlled by the temperature control device 13b, it is necessary to prevent the temperatures of the lens elements 36A and 37A from being transmitted to the adjacent lens elements 35A and 38A via the lens frame G2, lens barrel 4 and gas. To this end, gas having a constant temperature is supplied from the temperature control device 13a to a gas chamber enclosed by the lens elements 37A, 38A and the lens frame G2 and a gas chamber enclosed by the lens elements 35A, 36A and the lens frame G2, through pipings 19 and 20, respectively. Gas (for example, air) having low heat conductivity is used as the constant temperature gas, and the gases circulated in such gas chambers are returned to the temperature control device 13a through pipings 23A and 24A, respectively. The lens temperature control device 13 of FIG. 1 is constituted by the temperature control devices 13a, 13b and the pipings 19–22, 23A and 24A.

Further, in the projection exposure apparatus according to the illustrated embodiment, in order to expose the various reticle patterns with high resolving power, the illumination condition of the illumination optical system 14 can be changed or switched between a normal condition, a modulated-shape light source condition, a ring illumination condition and a condition that a $\sigma$ value (coherence factor) is small.

Figure 12A:
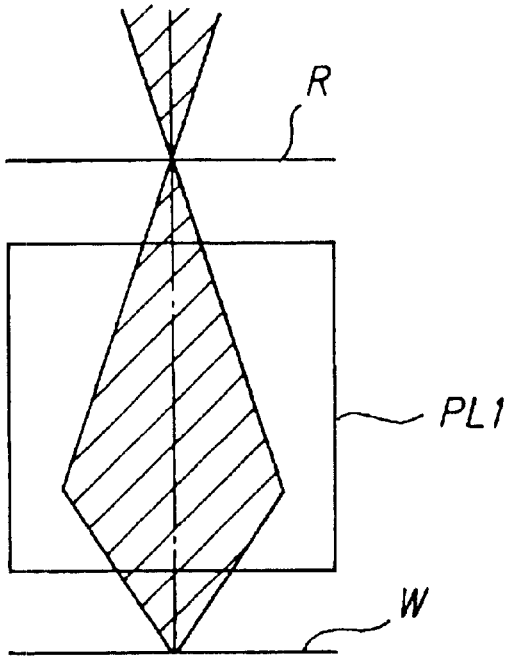
FIG. 12 is a conceptional view showing distributions of zero-order light from a reticle passing through a projection optical system when illumination conditions are changed variously.
Figure 12B:
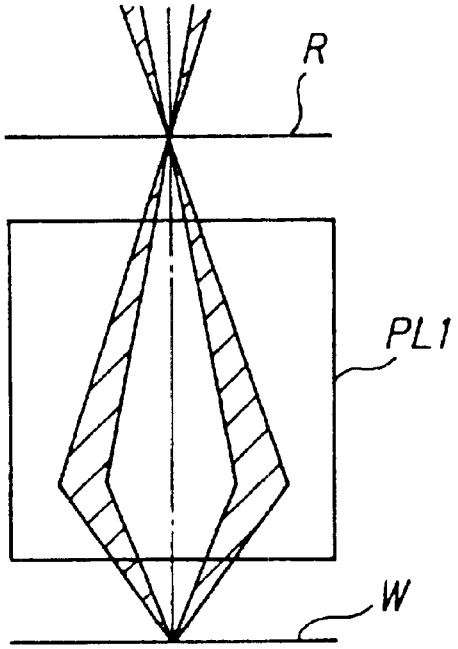
Figure 12C:
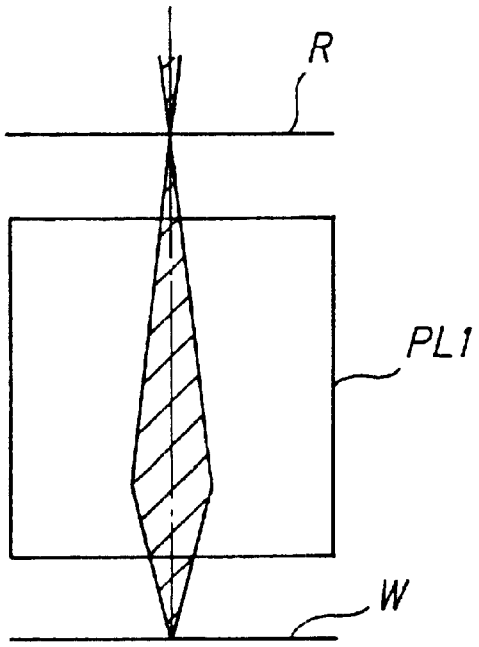

FIG. 12 shows conditions of the illumination light passing through the projection optical system PL1 when the illumination optical system 14 is switched or changed. In the normal condition, as shown in a section (a) of FIG. 12, zero-order light passed through the reticle R passes through a predetermined circular area at a pupil plane (Fourier transform plane for the reticle R) of the projection optical system PL1. On the other hand, in the modulated-shape light source condition of the illumination optical system 14, as shown by the sectional view in a section (b) of FIG. 12, the zero-order light passed through the reticle R passes through a plurality of spaced apart areas on the pupil plane of the projection optical system PL1. In the ring illumination condition of the illumination optical system 14, the zero-order light passed through the reticle R passes through a substantially annular area on the pupil plane of the projection optical system PL1. In the condition (of the illumination optical system 14) that the $\sigma$ value is small, as shown in a section (c) of FIG. 12, the zero-order light passed through the reticle R passes through a substantially circular small area on the pupil plane of the projection optical system PL1. Thus, in dependence upon these illumination conditions, the imaging characteristic of the projected image is changed.

Next, in the illustrated embodiment, an example of a method for removing the non-linear magnification error of the projection optical system PL1 will be explained.

The glass materials from which the lens elements of the projection optical system PL1 are formed are quartz and fluorite. The quartz has the property that, when it heated, it is not substantially expanded because of its small expansion coefficient, but the index of refraction thereof is increased. Accordingly, as shown in a section (b) of FIG. 6, in a positive lens element 49B made of quartz, when the temperature is increased, an image plane FB is displaced to approach the lens element. On the other hand, the fluorite has the property that, when it is heated, it is expanded and the index of refraction thereof is decreased. Thus, as shown in a section (a) of FIG. 6, in a positive lens element 49A made of fluorite, when the temperature is increased, an image plane FA is displaced to move away from the lens element. Incidentally, the temperature/index of refraction features of these glass materials are determined not only by the temperature characteristic of the index of refraction itself but also by the direction toward which the image plane is displaced in consideration of the thermal expansion of the lens element made of the glass material, thermal expansion of the lens barrel and thermal expansion of the lens frames.

Figure 7A:
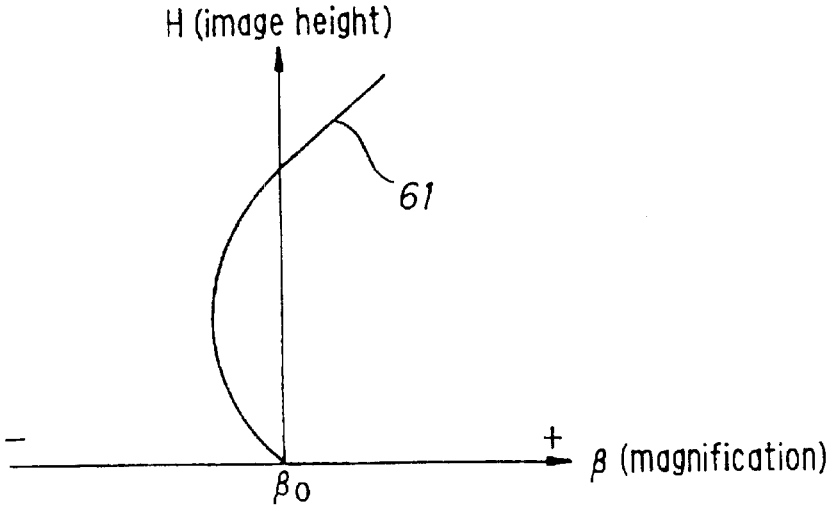
FIG. 7 is a graph showing the feature of the lens element, where section (a) shows a non-linear magnification error of the lens element made of quartz, section (b) shows a magnification error of the lens element made of temperature-controlled fluorite, and section (c) shows correction amounts regarding the non-linear magnification error.
Figure 7B:
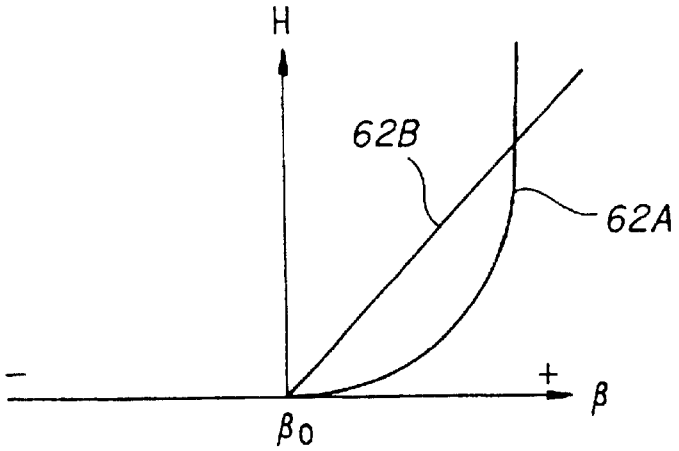
Figure 7C:
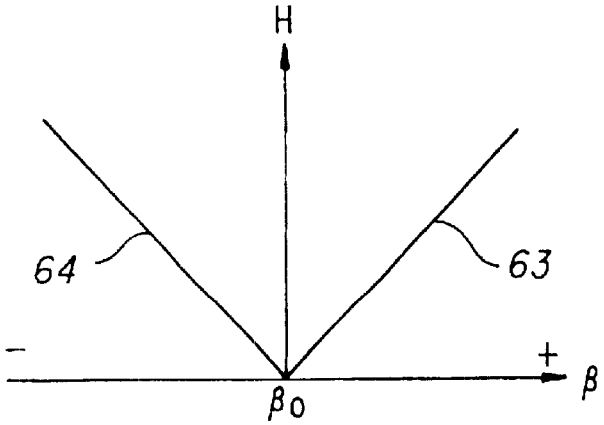

Now, the distortion of the projection optical system PL1 will be described with reference to FIGS. 7 and 8. In FIGS. 7 and 8, the ordinate indicates the image height H, and the abscissa indicates the magnification β of the projection optical system PL1 at a given image height H. And, the magnification on the optical axis (H-0) is represented by the design magnification $\beta_0$. In this case, under a certain environmental condition, after the exposure is continued by a certain time period, the distortion caused by the lens elements made of quartz in the projection optical system PL1 becomes the non-linear error (higher order magnification error) in which, as the image height H is increased, the magnification β is decreased below the design magnification once and then is monotonously increased, as shown by the curve 61 in a section (a) of FIG. 7.

In the illustrated embodiment, by adjusting the temperature of the lens elements 36A, 37A made of fluorite in the projection optical system PL1 by means of the lens temperature control device 13 of FIG. 1, the distortion caused by the lens elements made of fluorite in the projection optical system PL1 is set to have the non-linear magnification error having a feature substantially opposite to that shown by the curve 61 in the section (a) of FIG. 7. However, even when the distortion caused by the lens elements made of fluorite is set in this way, the distortion includes a concomitant linear magnification error as offset. Accordingly, as shown by the curve 62A in a section (b) of FIG. 7, the actual distortion caused by the lens elements made of fluorite in the projection optical system PL1 has a feature obtained by adding the linear magnification error shown by the straight line 62B and the non-linear magnification error having the feature substantially opposite to that shown by the curve 61 in the section (a) of FIG. 7.

Therefore, if the image characteristic is not corrected by the lens control device 12 of FIG. 1, the distortion caused by the entire projection optical system PL1 will have a feature that can be generally represented by the linear magnification error in which the magnification β is linearly increased from the design magnification as the image height H is increased, as shown by the straight line 63 in a section (c) of FIG. 7. Thus, the linear magnification error (shown by the straight line 64) which can substantially cancel the residual magnification error represented the straight line 63 in the section (c) of FIG. 7 is applied to the projection optical system PL1 by means of the lens control device 12 of FIG. 1. As a result, the distortion of the projection optical system PL1 according to the illustrated embodiment has a feature as shown by the curve 65 in FIG. 8 in which the non-linear magnification error and the linear magnification error are both removed substantially.

Next, an example of a method for measuring the distortion of the projection optical system PL1 will be explained with reference to FIGS. 9 and 10.

To this end, a test reticle having an illumination area on which a plural pairs (for example, sixteen pairs) of evaluating marks are equidistantly disposed is used as the reticle R of FIG. 1. In this case, desirably, the plural pairs of evaluating marks include various marks that, when projected, the image heights H thereof have various values such as 100% of the maximum image height $H_{max}$ (i.e., $H_{max}$ itself), 80% of the maximum image height $H_{max}$ (i.e., 0.8 $H_{max}$) and the like. Each pair of evaluating marks are constituted by an X axis evaluating mark formed by a line-and-space pattern (in which the lines are arranged to be spaced in the X direction at predetermined constant intervals) and a Y axis evaluating mark corresponding to what is obtained by rotating the X axis evaluating mark by 90 degrees. A projected image MY(i) of the i-th (i=1–16) Y axis evaluating mark is shown in a section (a) of FIG. 9.

In the section (a) of FIG. 9, the projected image MY(i) has a pattern in which bright portions P1–P5 are disposed at a predetermined pitch in the Y direction, and the projected image MY(i) is scanned in the Y direction by means of the rectangular opening portion 50a of the distortion measuring sensor 3 by driving the wafer stage 2 of FIG. 1. In this case, the detection signal S1 outputted from the photoelectric conversion element 52 is A/D (analogue/digital)-converted in the signal treatment portion 53, and the treated result is stored in correspondence to the Y axis value of the wafer stage 2.

Figure 10A:
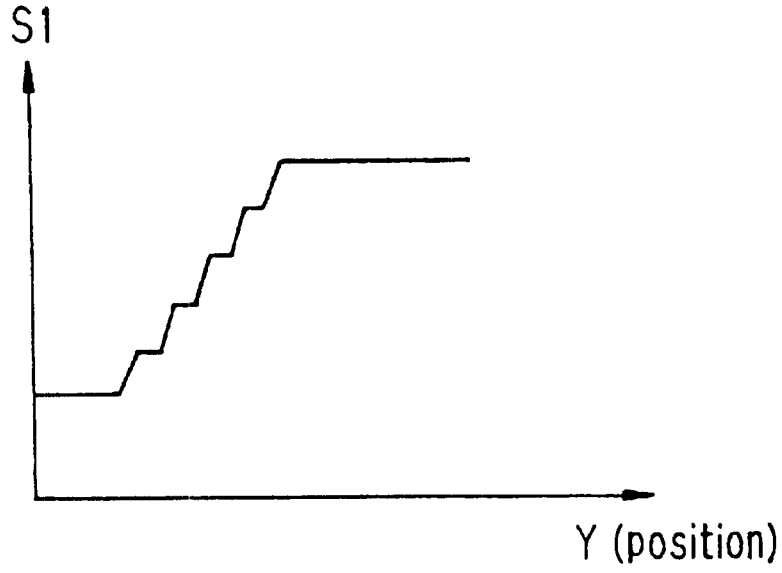
FIG. 10 is a graph showing the principle of the distortion measurement, where section (a) shows a waveform of a detection signal detected by the distortion measuring sensor 3, and section (b) shows a waveform of a derivative signal of the detection signal.
Figure 10B:
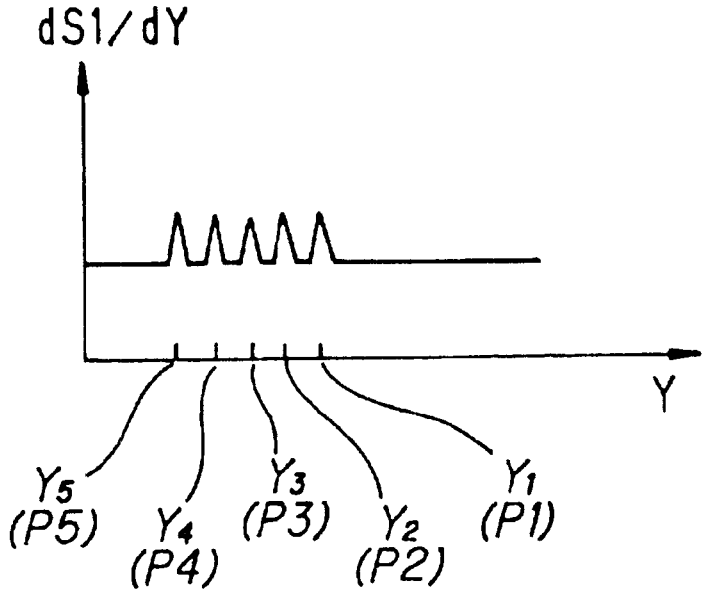

A section (a) of FIG. 10 shows the detection signal S1 obtained in this example. In this example, since the opening portion 50a has the rectangular shape having a Y direction width capable of covering all of the bright portions P1–P5, as shown in the section (a) of FIG. 10, the detection signal S1 is a signal which is changed steppingly in accordance with the Y axis value. Thus, as an example, in the signal treatment portion 53, the detection signal S1 is differentiated by the Y axis values (difference calculation in the actual treatment) to obtain a derivative signal dS1/dY as shown in a section (b) of FIG. 10. Then, values $Y_1$–$Y_5$ of the Y axis where the derivative signal dS1/dY has peak values are sought or determined. Since these values $Y_1$–$Y_5$ correspond to the bright portions P1–P5 of the projected image MY(i) of the evaluating marks shown in the section (a) of FIG. 9, in the treatment portion 53, the Y axis value of the projected image MY(i) is calculated from the following equation (1):

$$Yi=(Y_1+Y_2+Y_3+Y_4+Y_5)/5 \quad (1)$$

Regarding the projected image of the i-th axis evaluating mark, by scanning the opening portion 50a of the distortion measuring sensor 3 in the X direction, X axis value $X_i$ of the projected image can be determined. In this way, the X axis value $X_i$ and Y axis value $Y_i$ of the projected images of each pair of evaluating marks are determined, and the determined values in the coordinates are supplied to the main control device. 18. The positions ($XD_i$, $YD_i$) (design positions) of the projected images of each pair of evaluating marks when the projection optical system PL1 has no magnification error, are previously stored in the memory in the main control device 18.

In this case, the actually measured position ($X_i$, $Y_i$) of the projected image of the evaluating mark includes the rotational error of the test reticle. To eliminate this rotational error, in the main control device 18, the rotational error Δφ is determined by the method of least squares so that the square sum of the difference between the position in calculation ($XC_i$, $YC_i$) obtained by rotating the design position ($XD_i$, $YD_i$) of the projected image of the evaluating mark by an amount corresponding to the rotational error Δφ and the actually measured position ($X_i$, $Y_i$) becomes minimum. Accordingly, the deviation amount of the projected images of each pair of evaluating marks caused by the magnification error of the projection optical systems PL1 becomes ($X_i$–$XC_i$, $Y_i$–$YC_i$). In this case, i=1–16, for example.

In order to divide the deviation amount of the projected image into the linear magnification error and the non-linear magnification error, for example, the magnification β is determined with respect to the image height H on the basis of the following equation (2) (k=predetermined coefficient):

$$\beta = k \times H + \beta_0 \quad (2)$$

A value of the coefficient k is determined by the method of squares so that the square sum of the difference between a position ($XC_i'$, $YC_i'$) obtained by correcting the position in calculation ($XC_i$, $YC_i$) of the projected image of the evaluating mark by using the magnification β shown in the above equation (2) and the actually measured position ($X_i$, $Y_i$) of the projected image of the evaluating mark becomes minimum. In this way, the linear magnification error is determined. As a result, the deviation amount of the projected image of the evaluating mark caused by the non-linear magnification error of the projection optical system PL1 becomes ($X_i$–$XC_i'$, $Y_i$–$YC_i'$), and, thus, the residual non-linear magnification error (higher order magnification error) can be determined as a function of the image height H, by dividing the deviation amount by the image height in calculation (image height at position ($XC_i'$, $YC_i'$)). Since the magnification errors are measured by a predetermined plural number of measuring points on the image height H, the magnification error at any point between the measuring points may be determined by interpolation on the basis of the magnification errors at the adjacent measuring points.

Other than the above-mentioned error determining method, for example, the linear magnification error may be defined as a magnification error at a position where the image height H becomes 100% of a maximum radium $H_{max}$ of the exposure area obtained by the projection optical system (i.e., $H=H_{max}$), and the linear magnification error may be determined by averaging the positional deviation amounts of the projected images of the evaluating marks near the image height $H_{max}$. In this case, the linear magnification error at an image height H smaller than $H_{max}$ is determined to be proportional to the image height H.

After the linear magnification error determined in this way is removed, the magnification error remaining at a position where the image height H becomes 70% of the maximum radius $H_{max}$ of the exposure area obtained by the projection optical system (i.e., $H=0.7\ H_{max}$) may be defined as the non-linear magnification error, and the non-linear magnification error may be determined by averaging the positional deviation amounts of the projected images of the evaluating marks near the image height $0.7\ H_{max}$.

Next, an example of a method for determining the value of the temperature to be set for the lens elements 36A and 37A made of fluorite (FIG. 2) will be explained. It is assumed that the pressure (atmospheric pressure) of air surrounding the projection optical system PL1 is "x". If the non-linear magnification error is generated in the projection optical system PL1 by changing the atmospheric pressure x from a reference value $x_0$, the non-linear magnification error must be canceled. Now, the value set for the temperature y of the lens elements 36A, 37A for canceling the non-linear magnification error will be described. In this case, the non-linear magnification error of the projection optical system PL1 caused by change in the atmospheric pressure x from the reference value $x_0$ is determined by optical calculation. And, the temperature y of the lens elements 36A, 37A which can generate non-linear magnification error having the feature opposite to that of the optically determined non-linear magnification error is determined by calculation. In this case, for the simplicity's sake, as mentioned above, the magnification error at the $0.7\ H_{max}$ image height position (after the linear magnification error based on the magnification error at the maximum image height $H_{max}$ was eliminated) may be defined as the non-linear magnification error. However, the temperature of the lens elements 36A, 37A for generating the non-linear magnification error having the opposite feature may be determined by the method of least squares on the basis of the magnification errors at plural image heights H.

Figure 11:
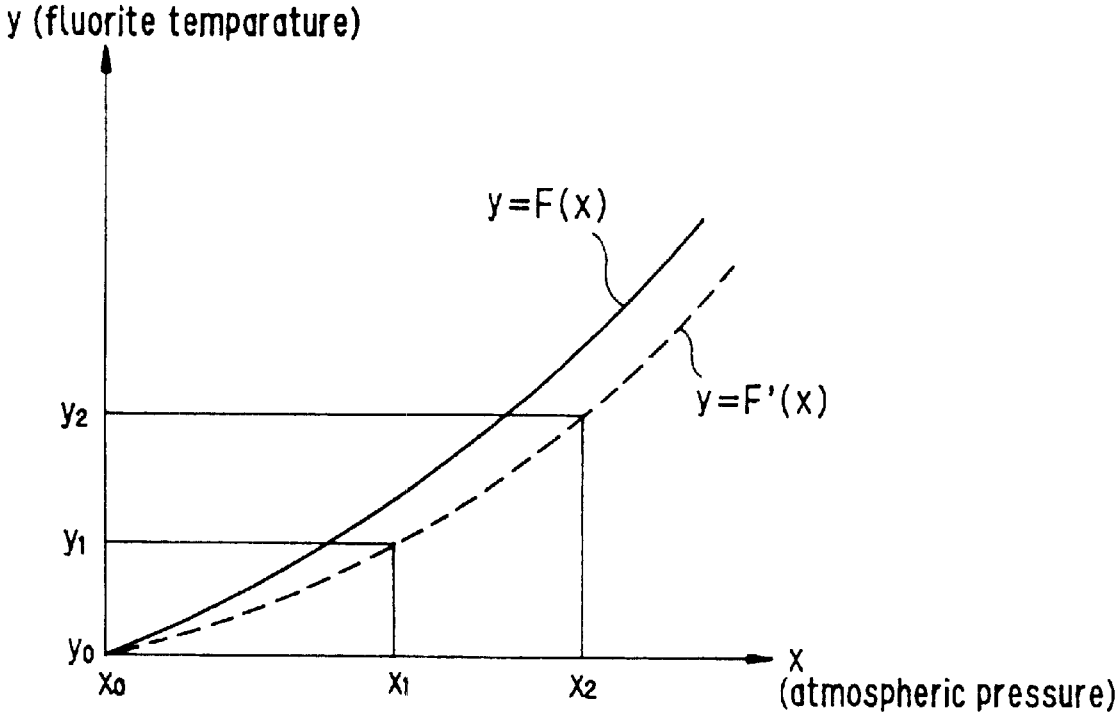
FIG. 11 is a graph showing a relation between an atmospheric pressure and a temperature of a lens element made of fluorine.

The solid curve shown in FIG. 11 represents the temperature y (y=F(x)) previously determined as a function F(x) of the atmospheric pressure x. In FIG. 11, the abscissa indicates the atmospheric pressure x and the ordinate indicates the temperature y of the lens elements 36A, 37A made of fluorite, and "$y_0$" represents a temperature of the lens elements 36A, 37A for minimizing the non-linear magnification error at a reference atmospheric pressure $x_0$. In the practical use, the temperature y may be set on the basis of the function F(x).

However, in actual, due to the manufacturing error of the optical elements of the projection optical system PL1, the non-linear magnification error cannot often be decreased adequately by using the temperature y determined on the basis of the function F(x). Further, as explained in connection with FIG. 12, the illumination optical system 14 according to the illustrated embodiment shown in FIG. 1 can be used under the various conditions such as the normal condition, the modified-shape light source condition and the condition that the coherent factor (σ value) is small. Thus, the above-mentioned function F(x) must be calculated for various illumination conditions. However, the calculated result of the function F(x) particularly regarding the modified-shape light source condition and the small coherent factor condition sometimes has less reliability. To avoid this, it is desirable that the calibration of the function F(x) is performed in the following manner in order to further reduce the non-linear magnification error.

That is to say, in order to seek the optimum function to be well applied, the non-linear magnification error of the projected image from the projection optical system PL1 is determined by utilizing the distortion measuring sensor 3 of FIG. 1 at any atmospheric pressure $x_1$ different from the reference atmospheric pressure $x_0$. Then, by controlling the temperature of the lens elements 36A, 37A made of fluorite by means of the lens temperature control device 13, a temperature $y_1$ at which the non-linear magnification error of the projected image becomes zero (minimum) is determined. In this case, the temperature of the lens elements 36A, 37A made of fluorite is made to be changed in the vicinity of the temperature y determined by the theoretical function F(x). Thereafter, a pressure in the gas chamber at which the residual linear magnification error becomes zero is sought by using the lens control device 12.

Further, regarding another atmospheric pressure $x_2$ different from the atmospheric pressure $x_1$, a temperature $y_2$ of the lens elements made of fluorite at which the non-linear magnification error of the projected image becomes zero and a pressure in the gas chamber at which the residual linear magnification error becomes zero are also determined. On the basis of the actually measured temperatures of the lens elements made of fluorite at the atmospheric pressures $x_0$, $x_1$, $x_2$, as shown by the broken line in FIG. 11, the function F(x) representative of the temperature y of the lens elements made of fluorite regarding the atmospheric pressure x can be determined, for example, as a quadratic function. In this case, the pressure in the gas chamber at which the residual linear magnification error becomes zero can be determined as a function of the atmospheric pressure. By increasing the number of the measuring points, the temperature y of the lens elements made of fluorite may be determined as a cubic function or function of higher degree of the atmospheric pressure x. By using such function F(x), the non-linear magnification error of the projected image can be further decreased.

Figure 13:
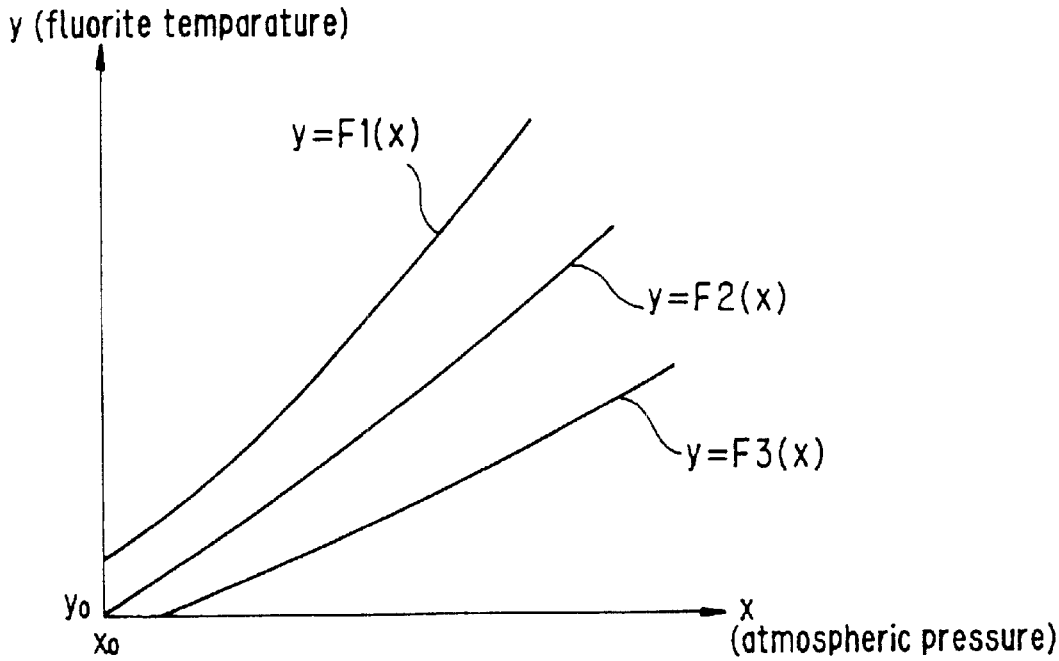
FIG. 13 is a graph showing a relation between the atmospheric pressure and the temperature of the lens element made of fluorine when the illumination condition is changed.

Although the function F(x) shown in FIG. 11 was determined under the normal illumination condition (method shown in the section (a) of FIG. 12), the similar calibration is effected under other two illumination conditions (methods shown in the sections (b) and (c) of FIG. 12). The results that the temperature y at which the non-linear magnification error of the lens elements made of fluorite becomes zero are determined as a function of the atmospheric pressure x under the illumination conditions shown in the section (b) and (c) of FIG. 12 are shown by the functions F1(x) and F3(x) in FIG. 13. The function F2(x) shown in FIG. 13 is the same as the function F(x) shown in FIG. 12, i.e., a function determined under the normal illumination condition. When the functions are determined in this way, three functions F1(x)–F3(x) of FIG. 13 are stored in the memory in the main control device 18 of FIG. 1. In the main control device 18, in accordance with the measured atmospheric pressure x, a target value of the temperature y of the lens elements made of fluorite is determined in dependence upon the function corresponding to the used illumination condition, and the temperature of the lens elements is set to the target value by using the lens temperature control device 13.

In the above example, while the non-linear magnification error caused due to the difference in atmospheric pressure is corrected, each lens element may be expanded or the index of refraction of each lens element may be changed by the illumination energy when the exposure illuminated light is passing through the projection optical system, and, the non-linear magnification error is generated by such expansion and/or the change in index of refraction. To cope with this, it is necessary that the temperature y of the lens elements made of fluorite at which the non-linear magnification error is minimized is determined as a function of the illumination energy e (e represents illumination energy passing through the projection optical system PL1 per unit time). Further, in this case, it is necessary that the function is determined for each illumination condition.

Figure 14:
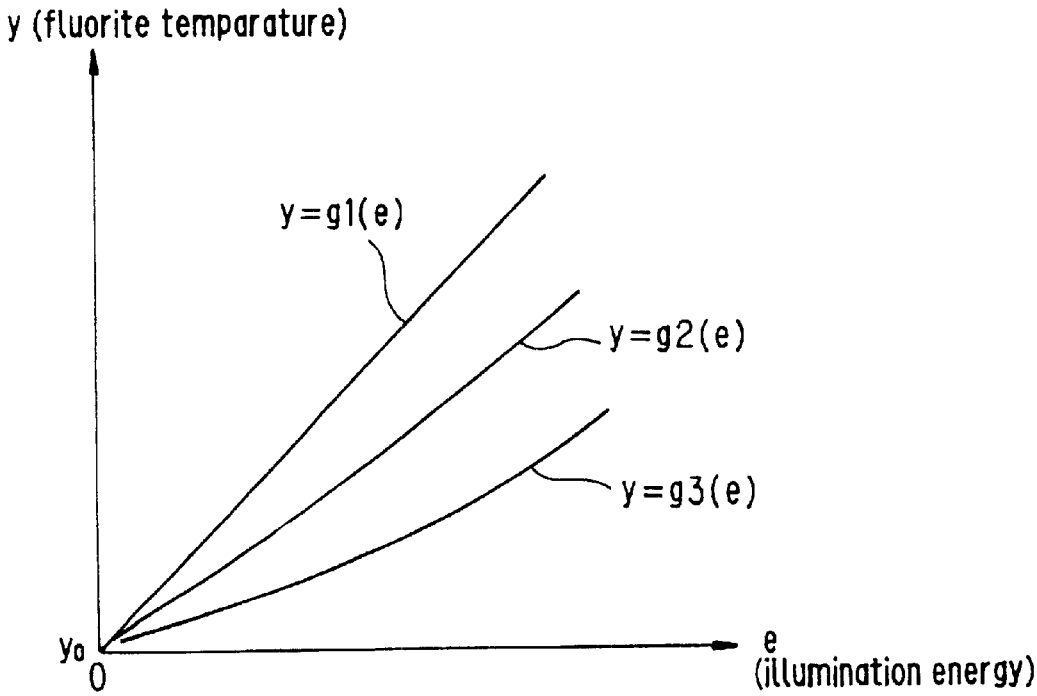
FIG. 14 is a graph showing a relation between illumination energy passing through the projection optical system and the temperature of the lens element made of fluorine.

FIG. 14 shows the temperature y of the lens elements made of fluorite determined by effecting the calibration so that the non-linear magnification error is minimized for the illumination energy e. In FIG. 14, the abscissa indicates the illumination energy e of the exposure illumination light passing through the projection optical system PL1 and the ordinate indicates the temperature y of the lens elements made of fluorite at which the non-linear magnification error is minimized. In this case, the illumination energy e can be determined by multiplying a signal (for example, obtained by photoelectrically converting light flux partly separated from the exposure illumination light in the illumination optical system 14 of FIG. 1) by a predetermined conversion coefficient. The functions g1(e), g2(e) and g3(e) of the illumination energy e shown in FIG. 14 are functions which are determined for the respective illumination conditions and which represent the temperatures y at which the non-linear magnification error is minimized.

In conclusion, ultimately, it is necessary that the temperatures y of the lens elements made of fluorite at which the non-linear magnification error is minimized are determined as a function Q (e, x, I) including the illumination energy e, atmospheric pressure x and illumination condition I as parameters. The function Q (e, x, I) is also stored in the memory in the main control device 18 of FIG. 1, and, in the main control device 18, it is desirable that a target value of the temperature of the lens elements made of fluorite is determined from the function Q (e, x, I) in dependence upon the exposure illumination energy e, atmospheric pressure x and illumination condition I.

In the above-mentioned embodiment, while an example that the temperature of the lens elements 36A, 37A is controlled is explained, even when a temperature of the lens barrel 4 or the lens frame G2 is controlled, since a distance between the lens elements is changed, the same technical advantage can be expected. Accordingly, any mechanism for controlling the temperature of the lens barrel 4 or the temperature of any lens frame may be provided. Further, since the temperatures of the lens barrel 4 and the lens frame G2 are changed (to change the distance between the lens elements) even when the temperature of the lens elements 36A, 37A is controlled in the above-mentioned manner, it is desirable that the apparatus is designed in consideration of such temperature change.

In the illustrated embodiment, while the excimer laser light source was used as the exposure light source, regarding the illumination energy of the exposure illumination light, when i-ray (having a wavelength of 365 nm) of a memory lamp is used, the energy of the i-ray is more absorbed than the energy of the excimer laser light in the projection optical system, and, thus, the non-linear magnification error of the projection optical system is more increased that the excimer laser light. Accordingly, when the method for controlling the temperature of the lens elements made of fluorite in accordance with the illumination energy is applied to a projection exposure apparatus (stepper and the like) using the i-ray of the mercury lamp, the non-linear magnification error can be reduced more effectively.

Figure 3:
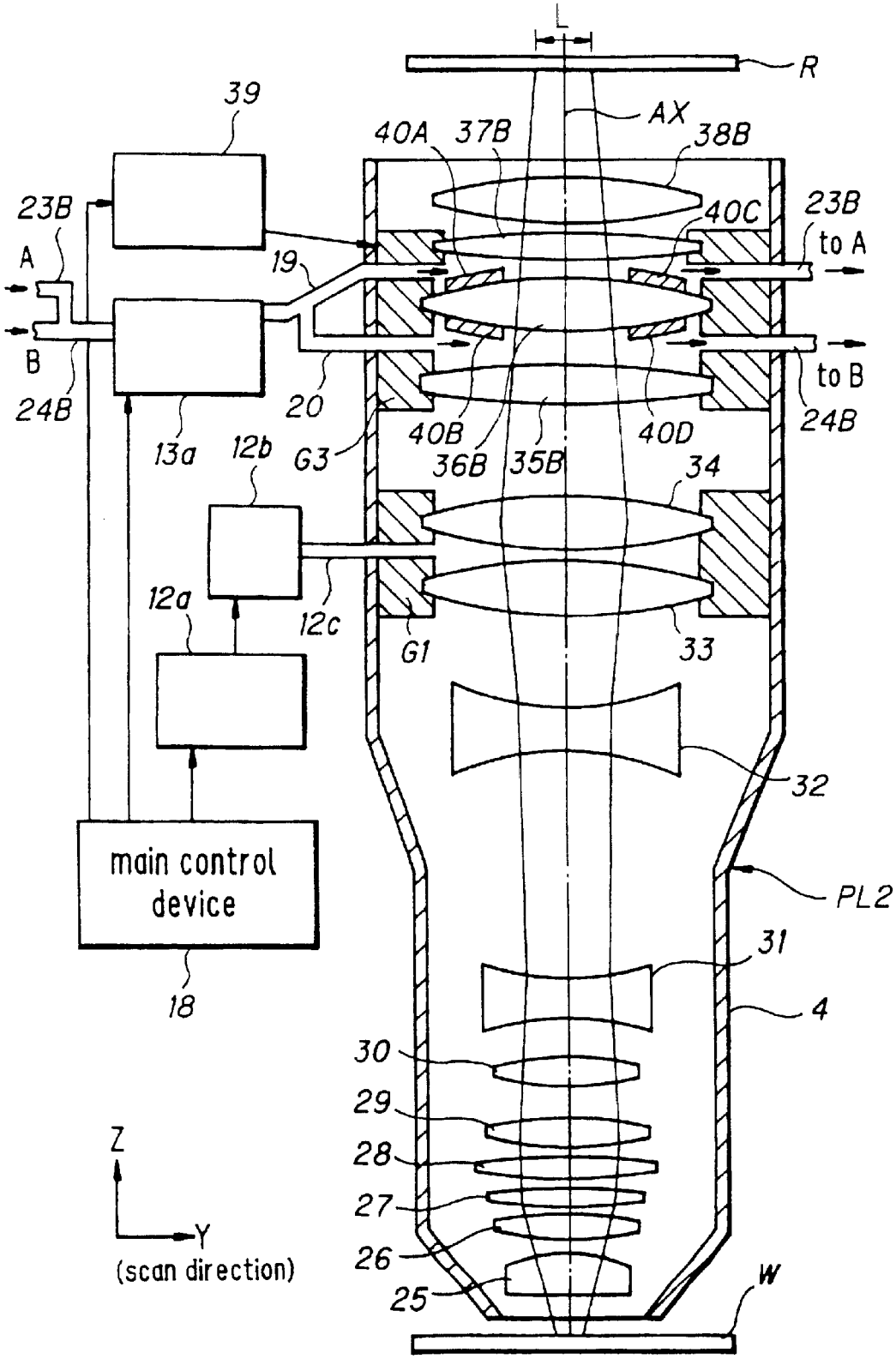
FIG. 3 is an explanatory view showing a projection optical system and an imaging characteristic correcting mechanism used in a second embodiment of the present invention.

Next, a second embodiment of the present invention will be explained with reference to FIG. 3. In FIG. 3, the same parts or elements as those in the first embodiment (FIG. 2) are designated by the same reference numerals and detailed explanation thereof will be omitted. A projection optical system according to the second embodiment is particularly suitable to be applied to a projection exposure apparatus of step-and-scan type.

FIG. 3 shows a projection optical system PL2 according to the second embodiment. In FIG. 3, the projection optical system PL2 has a lens barrel 4 within which six lens elements 25–30, four lens elements 31–34 and four lens elements 35B–38B are fixedly mounted (in this order from the wafer side). The lens elements 35B to 37B are secured to the lens barrel 4 via a lens frame G3, and the lens element 38B is also secured to the lens barrel 4 via a lens frame (not shown).

In this case, the lens element 36B alone is made of fluorite, and the other lens elements are made of quartz. A pair of temperature control elements 40A, 40B are secured to both surfaces of the lens element 36B at one end thereof in a scan direction (i.e., Y direction), and a pair of temperature control elements 40C, 40D are secured to both surfaces of the lens element 36B at the other end thereof in the Y direction. In this case, when it is assumed that a width (in the Y direction) of a slit-shaped illumination area generated by the projection optical system on a pattern forming surface of a reticle is L, the temperature control elements 40A–40D are disposed in zones through which the illumination light passing through the illumination area having the width L does not pass.

The temperature control elements 40A–40D may be heaters, Peltier effect elements and the like. The Peltier effect elements may be used to effect the heating or the heat absorbing. Although not shown, a temperature sensor is secured to the end of the lens element 36B in the Y direction, and a detection signal from the temperature sensor is supplied to an external temperature control device 39. The temperature control device 39 serves to control the heating or the heat absorbing of the temperature control elements 40A–40D so that the detected temperature becomes equal to a temperature set by the main control device 18.

In this embodiment, there is also provided a heat exhausting mechanism for preventing the heat (generated by controlling the temperature of the lens element 36B as mentioned above) from affecting an influence upon adjacent lens elements. That is to say, gas having a predetermined temperature is supplied from a temperature control device 13a, through a piping 19, to a gas chamber enclosed by the lens elements 36B, 37B and the lens frame G3, and the gas circulating in the gas chamber is returned to the temperature control device 13a through a piping 23B. Similarly, gas having a predetermined temperature is supplied from the temperature control device 13a, through a piping 20, to a gas chamber enclosed by the lens elements 35B, 36B and the lens frame G3, and the gas circulating in the gas chamber is returned to the temperature control device 13a through a piping 24B. In response to the command from the main control device 18, the temperature control device 13a keeps the temperature of the lens elements 35B, 37B adjacent to the lens element 36B constant by the forced air conditioning. The other arrangements are the same as those of the first embodiment shown in FIG. 2.

As mentioned above, according to the second embodiment, since the temperature of the lens element 36B made of fluorite is directly controlled by the temperature control elements 40A–40D while effectively utilizing the spaces (zones) which are not illuminated by the illumination light passed through the slit-shaped illumination area, the temperature of the lens element 36B can be set to the desired target temperature quickly and accurately. With this arrangement, the non-linear magnification error of the projected image obtained by the projection optical system PL2 can quickly be decreased with high accuracy.

Figure 4:
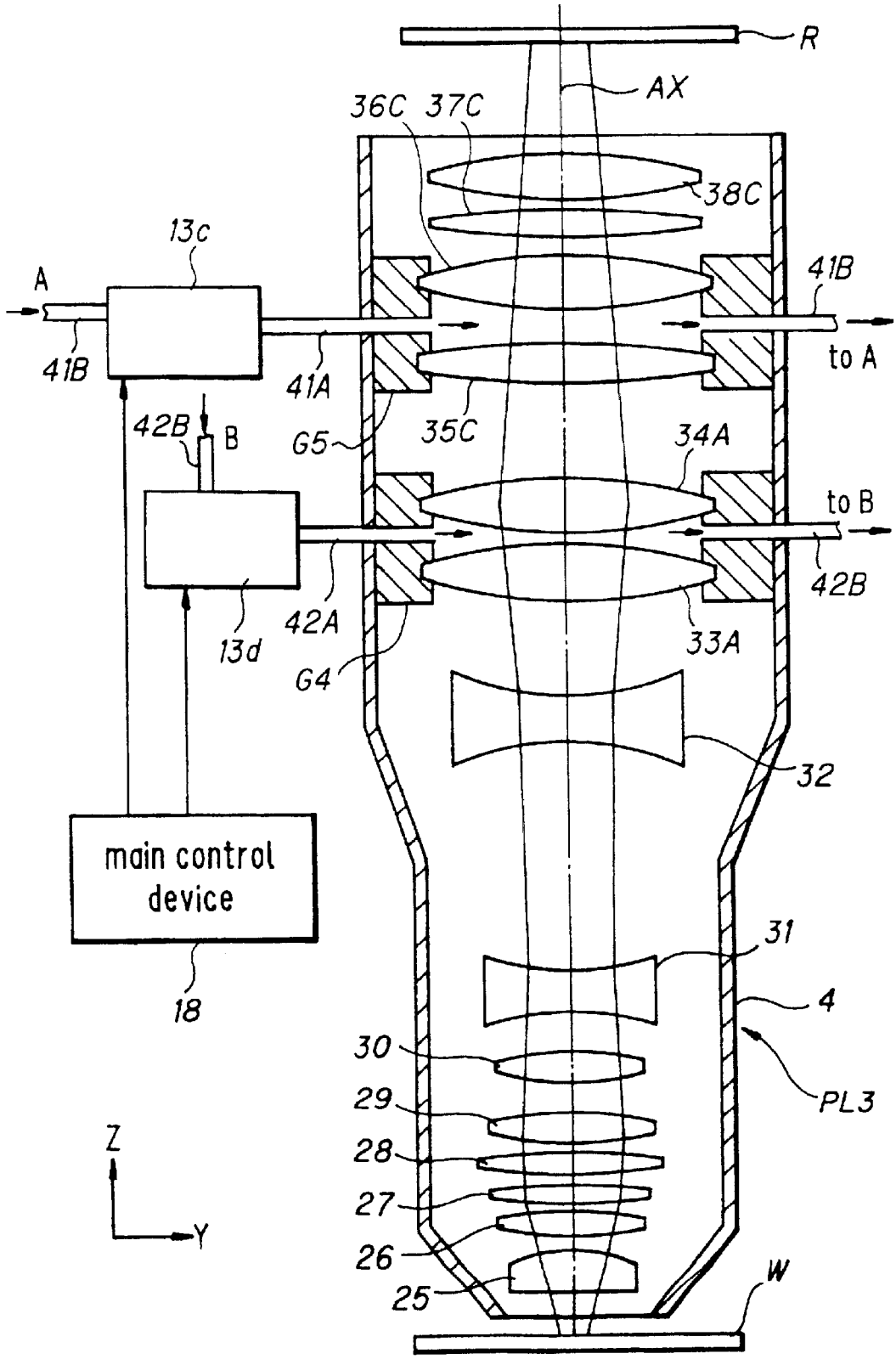
FIG. 4 is an explanatory view showing a projection optical system and an imaging characteristic correcting mechanism used in a third embodiment of the present invention.

Next, a third embodiment of the present invention will be explained with reference to FIG. 4. In FIG. 4, the same parts or elements as those in the first embodiment (FIG. 2) are designated by the same reference numerals and detailed explanation thereof will be omitted. A projection optical system according to the third embodiment is suitable to be applied to both projection exposure apparatuses of step-and-repeat type and step-and-scan type.

FIG. 4 shows a projection optical system PL3 according to the third embodiment. In FIG. 4, the projection optical system PL3 has a lens barrel 4 within which six lens elements 25–30, four lens elements 31, 32, 33A, 34A and four lens elements 35C–38C are fixedly mounted (in this order from the wafer side). The lens elements 33A, 34A are secured to the lens barrel 4 via a lens frame G4, the lens elements 35C, 36C are secured to the lens barrel 4 via a lens frame G5, and the other lens elements are also secured via lens frames (not shown).

The lens elements 33A, 36C are made of fluorite, and the other lens elements are made of quartz. In this case, the feature of the non-linear magnification error is mainly changed by the change in temperature of the upper fluorite lens element 36C, and the feature of the linear magnification error is mainly changed by the change in temperature of the lower fluorite lens element 33A. Gas having a variable temperature is supplied from a temperature control device 13c, through a piping 41A, to a gas chamber enclosed by the lens elements 35C, 36C and the lens frame G5, and the gas circulating in the gas chamber is returned to the temperature control device 13c through a piping 41B. Similarly, gas having a variable temperature is supplied from a temperature control device 13d, through a piping 42A, to a gas chamber enclosed by the lens elements 33A, 34A and the lens frame G4, and the gas circulating in the gas chambers is returned to the temperature control device 13d through a piping 42B. In response to the command from the main control device 18, the temperature control devices 13c, 13d serve to set the temperatures of the lens elements 36C, 33A to their target temperatures, respectively.

In this embodiment, when the non-linear magnification error (higher order magnification error) of the projected image obtained by the projection optical system PL3 is to be corrected, the temperature of the lens element 36C is controlled by the temperature control device 13c, and, the linear magnification error caused at that time is canceled by controlling the temperature of the lens element 33A by means of the temperature control device 13d. When the feature of the higher order magnification error due to the change in atmospheric pressure differs from the feature of the higher order magnification error due to the change in temperature during the illumination of the exposure illumination light onto the projection optical system, so that the third or higher order magnification error is generated greatly, this method can also be utilized to control these high order magnifications independently by using the corresponding two fluorite lens elements. This is to say, for example, the non-linear magnification error due to the change in atmospheric pressure may be corrected by using the upper fluorite lens element 36C, and the non-linear magnification error due to the illumination of the illumination light may be corrected by using the lower fluorite lens element 33A.

Figure 5:
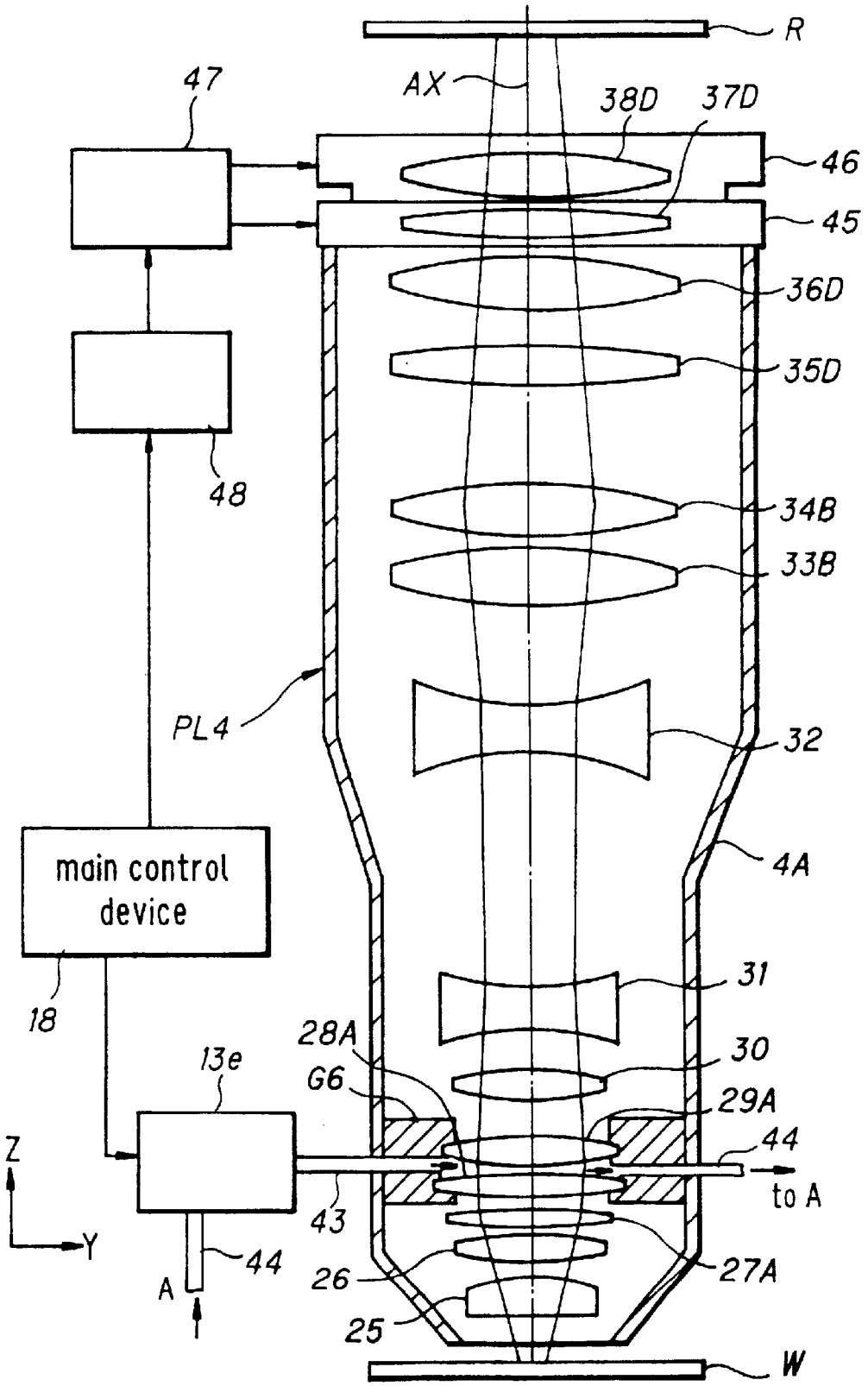
FIG. 5 is an explanatory view showing a projection optical system and an imaging characteristic correcting mechanism used in a fourth embodiment of the present invention.

Next, a fourth embodiment of the present invention will be explained with reference to FIG. 5. In FIG. 5, the same parts or elements as those in the first embodiment (FIG. 2) are denoted by the same reference numerals and detailed explanation thereof will be omitted. A projection optical system according to the fourth embodiments is suitable to be applied to both projection exposure apparatuses of step-and-repeat type and step-and-scan type.

FIG. 5 shows a projection optical system PL4 according to the fourth embodiment. In FIG. 5, the projection optical system PL4 has a lens barrel 4A within which six lens elements 25, 26, 27A, 27A, 29A, 30, four lens elements 31, 32, 33B, 34B and two lens elements 35D, 36D are fixedly mounted (in this order from the wafer side). A support 45 for holding a lens element 37D and a support 46 for holding a lens element 38D are secured to an upper end of the lens barrel 4A. The lens elements 28A, 29A are secured to the lens barrel 4A via a lens frame G6 and the other lens elements are also secured to the lens barrel 4A via lens frames (not shown).

In this fourth embodiment, the lens elements 28A, 29A are made of fluorite and the other lens elements are made of quartz. Gas having a variable temperature is supplied from a temperature control device 13e, through a piping 43, to a gas chamber enclosed by the lens elements 28A, 29A and the lens frame G6, and the gas circulating in the gas chamber is returned to the temperature control device 13e through a piping 44. In response to the command from the main control device 18, the temperature control device 13e serves to set the temperature of the lens elements 28A, 29A to the target temperature. The supports 45 and 46 can be shifted in a direction parallel to an optical axis AX of the projection optical system PL4 and can be inclined by desired angles, independently, by means of a drive device 47. The operation of the drive device 47 is controlled by an imaging characteristic control device 48 on the basis of the command from the main control device 18.

Also in this embodiment, although the non-linear magnification error (higher order magnification error) of the projected image generated by the projection optical system PL4 is corrected by controlling the temperature of the fluorite lens elements 28A, 29A by means of the temperature control device 13e, the linear magnification error caused at that time is corrected by inclining or lifting/lowering of the lens elements 37D, 38D via the supports 45, 46. Since not only the magnification error but also the defocus of the focusing position and the curvature of field can be corrected by combination of the movements of two supports 45, 46, almost all of other aberrations generated during the correction of the non-linear magnification error can be canceled by properly controlling the temperature control device 13e and the drive device 47.

Next, referring to the actual numerical example of the projection optical system, the numerical analysis as to how non-linear magnification error is changed by the temperature control will be explained.

In this case, for example, in consideration of the projection optical system PL1 shown in FIG. 2, the projection optical system PL1 includes nine lens elements by which the imaging characteristic can be corrected when these lens elements are made of fluorite. Now, it is assumed that the lens elements which can be made of fluorite are lens elements L1 to L9. Regarding the case where no lens element made of fluorite is used and the case where a single lens element is made of fluorite and the other lens elements are made of quartz, the magnification errors βA [μm] at the position of 100% of the image height, the magnification errors βB [μm] at the position of 70% of the image height, and the magnification errors (non-linear magnification errors) βC [μm] remaining at the position of 70% of the image height after the magnification errors at the position of 100% of the image height are corrected to become substantially zero were sought. Further, to provide the case where the single lens element is made of fluorite, the lens elements L1 to L9 are made to be of fluorite in turn, and, the magnification errors βA [μm], the magnification errors βB [μm] and the residual magnification errors (non-linear magnification errors) βC [μm] obtained when the temperature of the single fluorite lens element is changed by 1° C. are shown in the following Table 1:

TABLE 1

| Fluorite | βA [μm] | βB [μm] | βC [μm] |
|---|---|---|---|
| none | −0.0144 | −0.0204 | +0.0100 |
| L1 | +0.0436 | +0.0135 | −0.0067 |
| L2 | −0.2797 | −0.1862 | +0.0199 |
| L3 | −0.2254 | −0.1529 | +0.0152 |
| L4 | −0.2576 | −0.1739 | +0.0167 |
| L5 | +0.1602 | +0.0926 | −0.0092 |
| L6 | +0.1045 | +0.0572 | −0.0056 |
| L7 | +0.2371 | +0.1447 | −0.0110 |
| L8 | +0.2911 | +0.1793 | −0.0142 |
| L9 | +0.3854 | +0.2406 | −0.0192 |

In the above Table 1, for example, when the lens element L4 is made of fluorite, the residual magnification errors (non-linear magnification errors) βC becomes greater than that of none fluorite case by 0.0067 μm, i.e., about 7 nm. Further, when the lens element L9 is made of fluorite, the residual magnification errors (non-linear magnification errors) βC is changed from that of non fluorite case by 0.0292 μm, i.e., about 29 nm. Thus, it can be understood that, by changing the temperature of the single fluorite lens element by ±1° C., the non-linear magnification error can be corrected by about ±20 nm at the most.

In general, since the maximum resolving power of the temperature control is about 0.01° C., when the non-linear magnification error is corrected by changing the temperature of the single fluorite lens element by 1° C., the resolving power of the correction of the non-linear magnification error becomes about ±0.2 nm (=±20/100 [nm]). Further, from the Table 1, it can be seen that the linear magnification error of about ±0.2 μm is generated by changing the temperature of the single fluorite lens element by 1° C. Accordingly, the resolving power of the control of the linear magnification error when the temperature of the single fluorite lens element is changed by 1° C. becomes a high level of about ±2 nm (=±0.2/100 [μm]).

When two or more lens elements are made of fluorite, the temperature control range can be narrowed, possible additional linear magnification error can be reduced, and/or a greater non-linear magnification error can be corrected.

According to the first to fourth embodiment of the present invention, the projection optical system includes a plurality of sets of optical members (lens elements) made of glass elements having different temperature characteristics of index of refraction, and, the imaging characteristic of the projection optical system is controlled by controlling the temperature of at least one of the optical members. Accordingly, the distortion of the projection optical system which is worsened by the change in the environmental conditions such as the atmospheric pressure and the temperature around the projection optical system, the change in the illumination condition (for example, normal condition, modified-shape light source illumination condition or the like) and the absorption of the exposure illumination light can be corrected. As a result, the aligning accuracy of the projected images on the photosensitive substrate can be improved.

Further, when the imaging characteristic of the projection optical system to be controlled by the temperature control device is the non-linear magnification error, such non-linear magnification error (which could not corrected by the conventional techniques) can also be corrected.

In this case, when the non-linear magnification error of the projection optical system is corrected within a range of ±50 nm by changing the temperature of the optical member (to be controlled) by ±1° C. by means of the temperature control device, as mentioned in the above numerical analysis, such non-linear magnification error of the projection optical system is corrected within such a range by controlling the temperature(s) of one or two fluorite lens element(s). It is practical.

In the case where the linear magnification control means for correcting the linear magnification error of the projection optical system is provided, after the non-linear magnification error of the projection optical system was corrected to be included within the predetermined allowable range, and when the residual linear magnification error is reduced by the linear magnification control means, the distortion of the projection optical system can be reduced to substantially zero.

In the case where the memory means for storing the change amount of the imaging characteristic of the projection optical system in dependence upon the change in the applied condition of the projection optical system is provided, when the imaging characteristic of the projection optical system is controlled by the temperature control device to cancel the change amount of the imaging characteristic stored in the memory means in response to the change in the applied condition of the projection optical system an advantage is brought about. Namely, if the applied condition of the projection optical system is changed, the imaging characteristics (such as the distortion and the like)

of the projection optical system can be returned to the good condition without time lag.

Figure 5A:
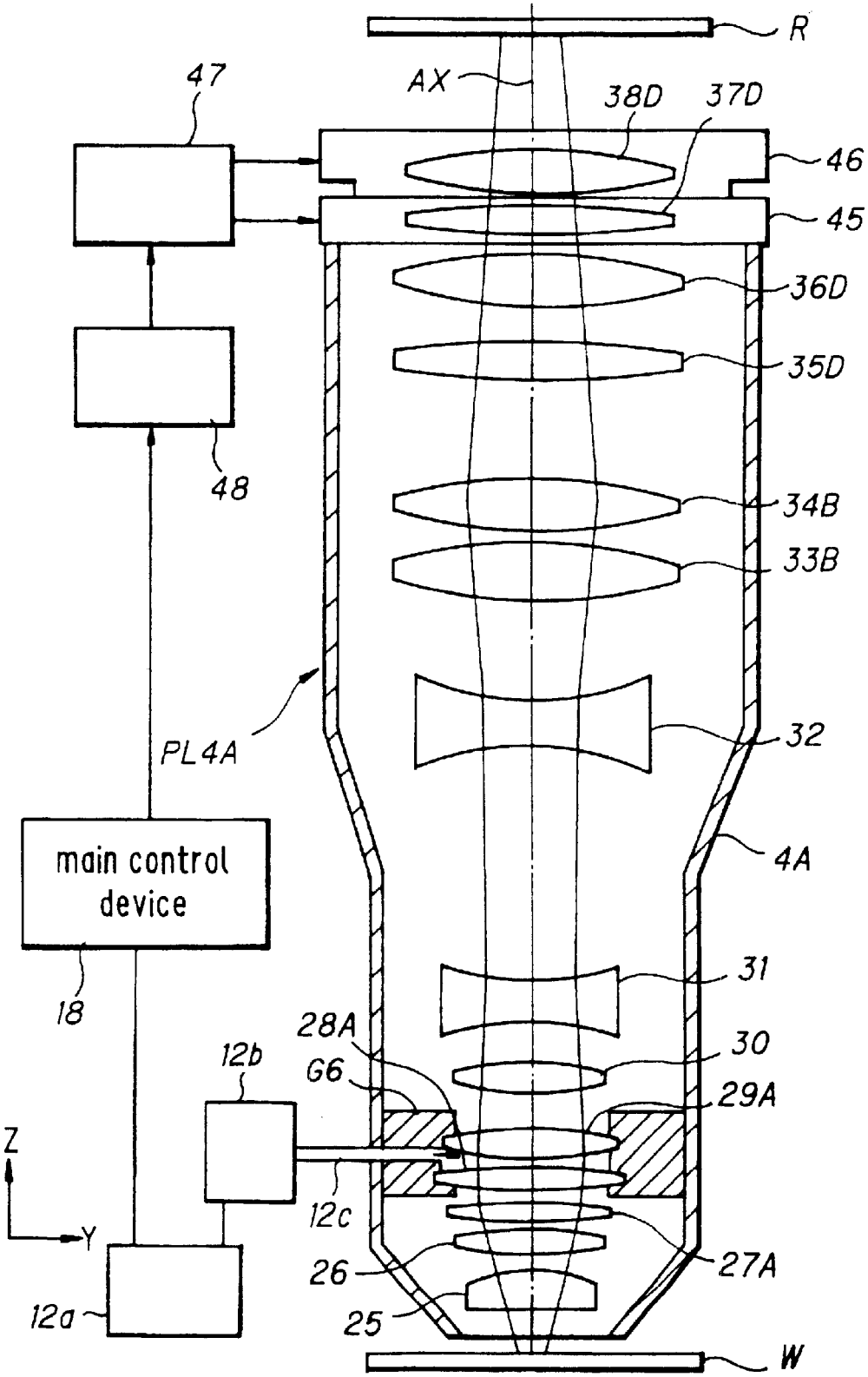
FIG. 5A is a view showing an alteration of the fourth embodiment.
Figure 6A:
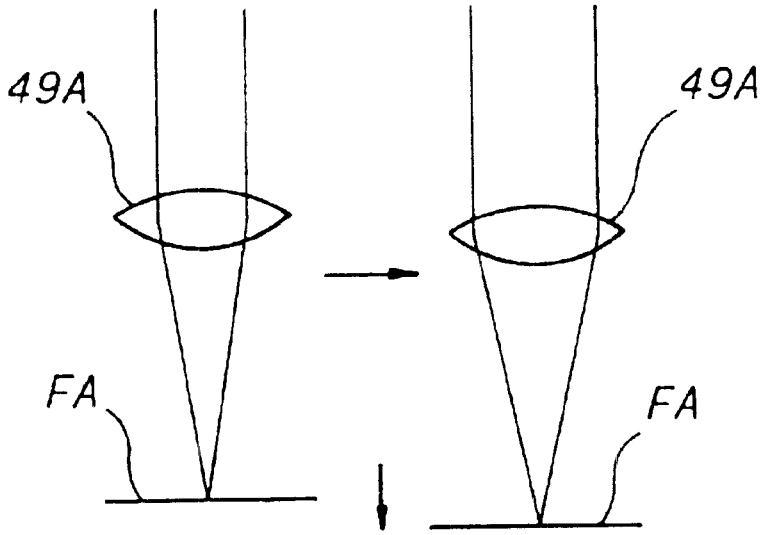
FIG. 6 is a view showing light paths of two lens elements made of glass materials having different features regarding the change in temperature.
Figure 6B:
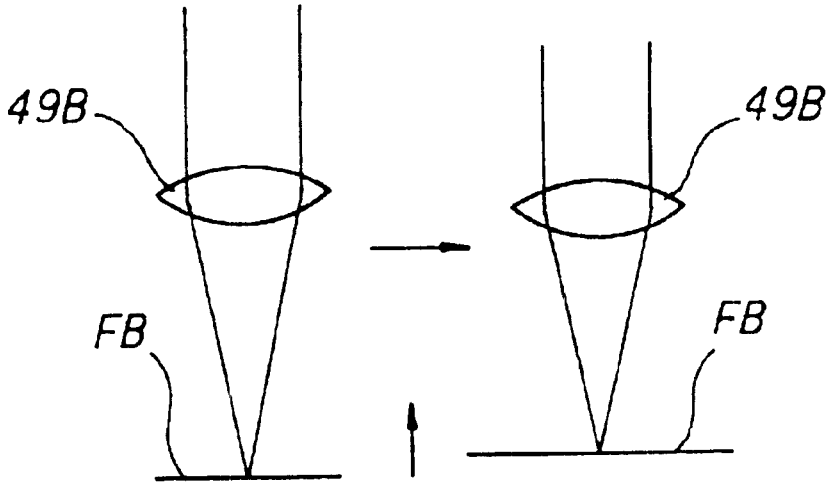

FIG. 5A shows an alteration of the fourth embodiment shown in FIG. 5. In this alteration, although the arrangement of the lens elements is the same as that of the fourth embodiment, the lens elements may be of the same material. A spacer between the lens elements 28A and 29A acts as a gas chamber which is connected to a bellows mechanism 12b through a piping 12c, and an extension/contraction amount of the bellows mechanism 12b is controlled by a control portion 12a. The second portion 12a, bellows mechanism 12b and piping 12c constitute the lens control device 12 of FIG. 1, and a pressure of gas (for example, air) in the gas chamber is controlled by adjusting the expansion/contraction amount of the bellows mechanism 12b.

As mentioned above, in this alteration, although the temperature control of the lens elements is not effected, also in this case, the non-linear magnification error and the curvature of field can be corrected by combination of independent control for adjusting the shifting (along the optical axis) and the inclination of the lens elements 37D, 38D by means of the drive device 47 and the above-mentioned lens control device 12.

In this case, since the focus position is changed, it is necessary that an autofocus mechanism is incorporated. However, the autofocus mechanism itself is well-known, and, if necessary, an autofocus mechanism shown in FIG. 17 may be referred to.

The following embodiments of the present invention show examples that the present invention is applied to the correction of defocus of the image plane of the projection optical system. Prior to the explanation of these embodiments, the defocus of the image plane will be explained.

In the conventional techniques, the non-linear defocus component of the defocus of the image plane of the projection optical system generated by the change in the environmental condition could not be corrected. A main part of the non-linear defocus component is the curvature of field in which the defocus amount is changed in accordance with the image height of the projected image along a curve similar to the quadratic function or functions of higher degree. That is to say, in a reference condition for design, as shown in a section (a) of FIG. 29, a focal position $Z_F$ of the image plane of the projection optical system is situated in the vicinity of a target position in design, regardless of the image height.

Figure 29A:
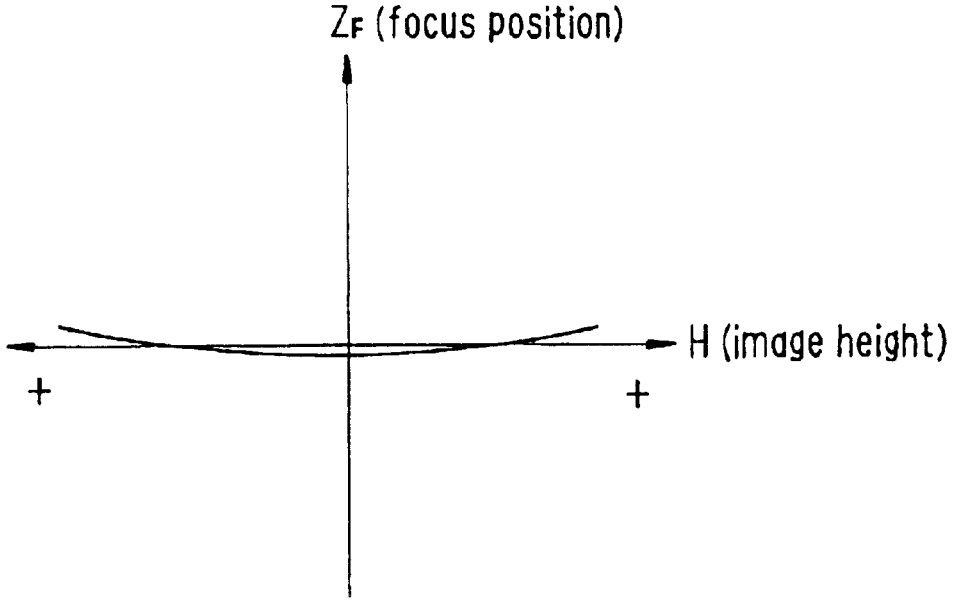
FIG. 29 is a view showing curvature of field in a conventional projection exposure apparatus.
Figure 29B:
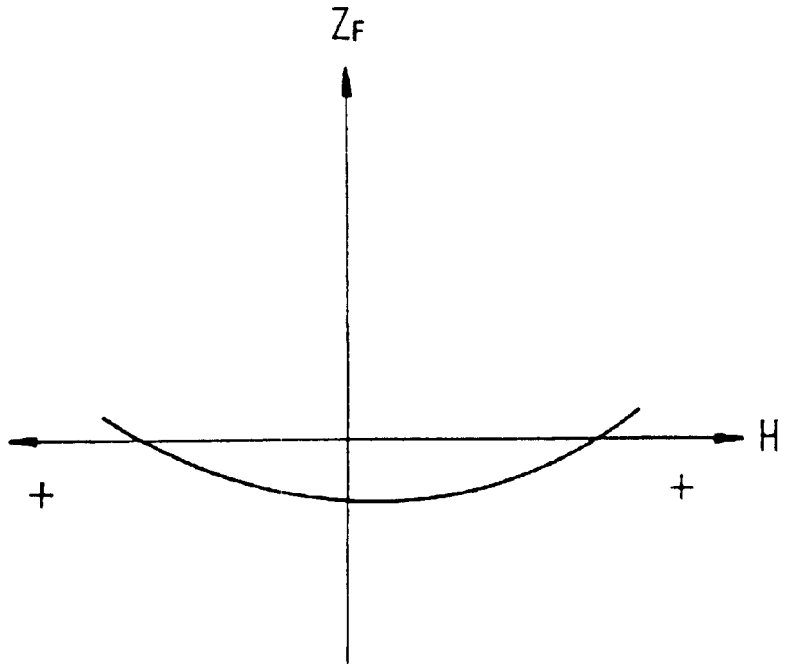

However, if the change in atmospheric pressure and/or the heat absorption due to the illumination of the exposure illumination light is generated under the reference condition, the defocus feature of the image plane will be changed to the curvature of field as shown in a section (b) of FIG. 29. If such curvature of field is generated, a width of the depth of focus (DOF) of the entire image plane will be narrowed, with the result that it will be difficult to obtain the desired resolving power through the entire projected image of the reticle pattern.

Figure 30A:
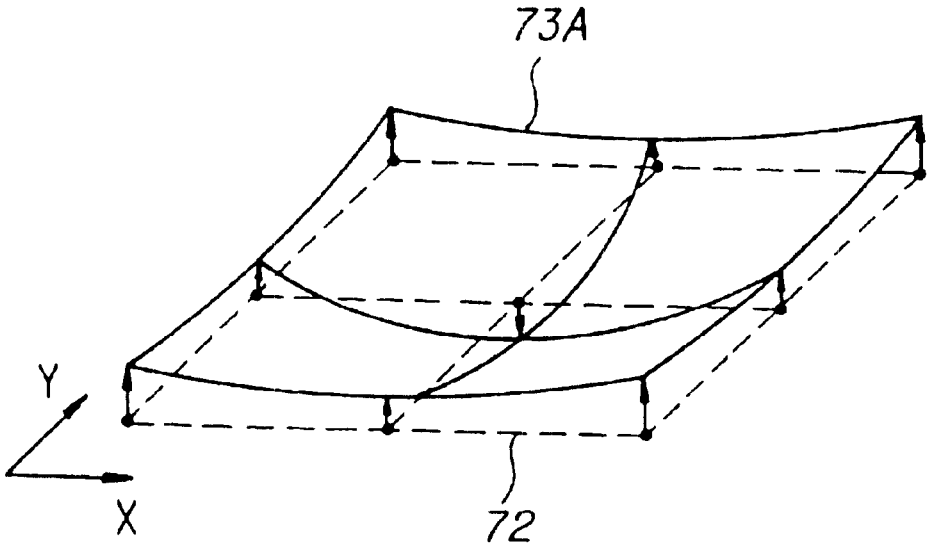
FIG. 30 is a view showing the influence of the curvature of field upon the projection, where section (a) shows the influence of the curvature of field during collective exposure, and section (b) shows the influence of the curvature of field during scan exposure.
Figure 30B:
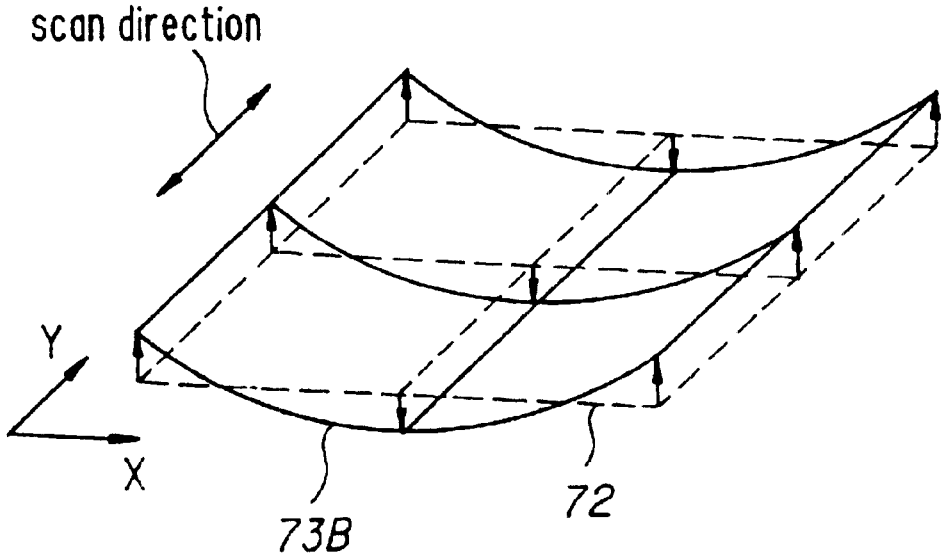

If the curvature of field as shown in the section (b) of FIG. 29 is generated in the projection exposure apparatus of step-and-repeat type (collective exposure type), as shown in a section (a) of FIG. 30, the focus position of the original image plane 72 of the projected image is changed in the non-linear manner in accordance with the image height to an image plane 73A, thereby narrowing the depth of focus totally. On the other hand, if the curvature of field as shown in the section (b) of FIG. 29 is generated in the projection exposure apparatus of step-and-scan type (scan exposure type), as shown in a section (b) of FIG. 30, the defocus is not generated in the original image plane 72 of the projected image along the Y direction (scan direction) due to the averaging effect. In this case, however, the image is deteriorated due to such averaging effect. In the non-scan direction (X direction), as in the collective exposure type, since the defocus is generated in dependence upon the image height, the effective image plane after the scan exposure becomes an image plane 73B as shown. Thus, a so-called "U-shaped" curvature of field is generated.

Figure 31A:
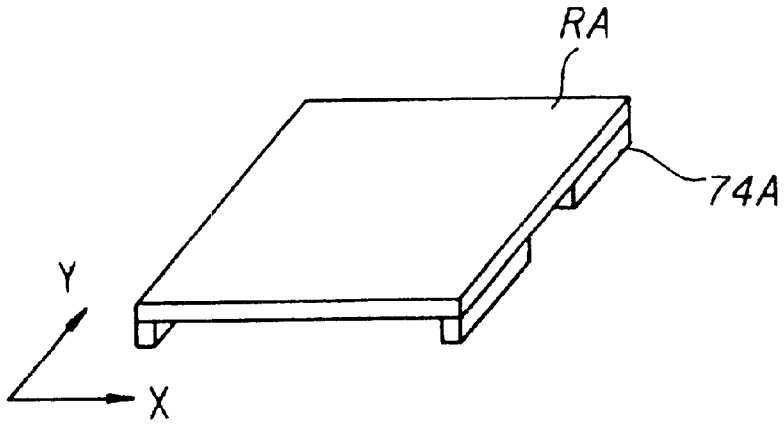
FIG. 31 is a perspective view showing the flexure of a reticle, where section (a) is a perspective view showing the flexure of a reticle having a small size, and section (b) is a perspective view showing the flexure of a reticle having a large size.
Figure 31B:
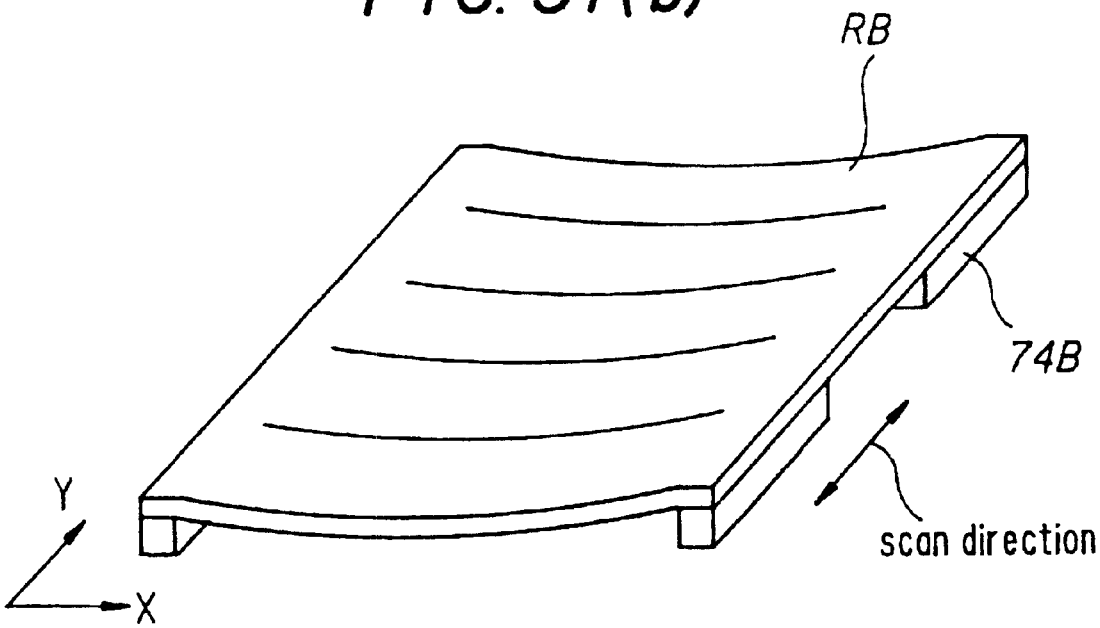

Recently, since a size of the reticle has been increased, when the large size reticle is used, there arises a problem that the curvature of field is increased. For example, in the case where the periphery of the reticle is held by vacuum as shown in a section (a) of FIG. 31, when a small size reticle RA (about 5 in.×5 in.) is supported by four support portions 74A, since the reticle RA is not flexed, there is no problem. However, as shown in a section (b) of FIG. 31, when a large size reticle RB (for example, 6–9 in.×6–9 in.) is supported by four support portions 74B, since the reticle RB is flexed by its own weight to a "U-shaped" form in a direction (X direction) perpendicular to a longitudinal direction (Y direction) of the support portion 74B, there arises a problem that the curvature of field of the image plane is increased accordingly. In particular, when the reticle RB shown in the section (b) of FIG. 31 is used in the projection exposure apparatus of step-and-scan type (scan exposure type) having the scan direction along the Y direction, there is the danger of increasing the "U-shaped" curvature of field shown in the section (b) of FIG. 30.

Now, fifth to eighth embodiments according to the present invention will be explained with reference to FIGS. 17 to 21.

Figure 17:
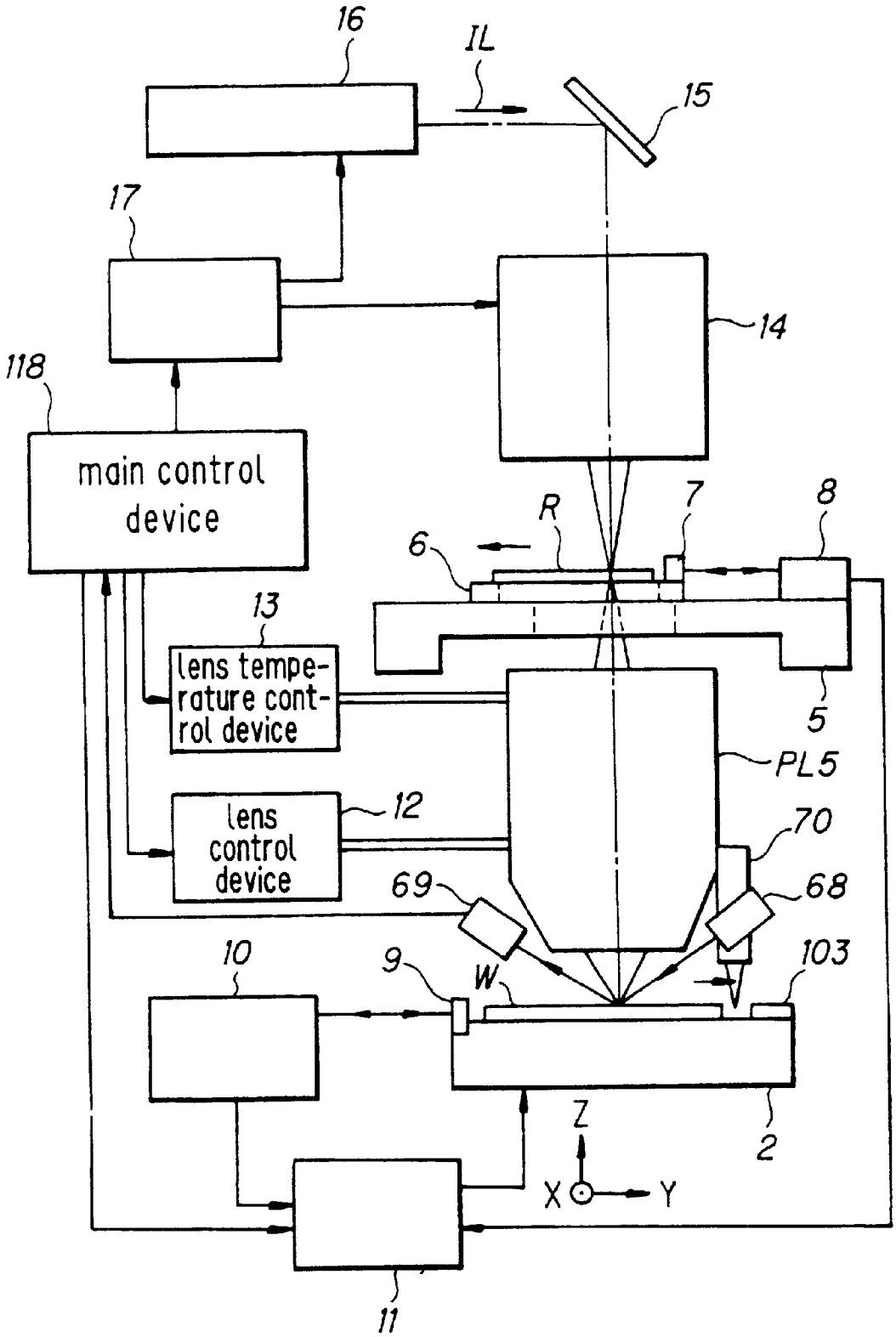
FIG. 17 is a constructional view of a projection exposure apparatus according to a fifth embodiment of the present invention.

FIG. 17 shows a construction common to the fifth to eighth embodiments, which corresponds to the construction shown in FIG. 1. Thus, the elements corresponding to those shown in FIG. 1 are designated by the same reference numerals and detailed explanation thereof will be omitted.

An imaging characteristic measuring sensor 103 is secured on the wafer stage 2 in the vicinity of the wafer W. As shown in a section (b) of FIG. 24, the imaging characteristic measuring sensor 103 has a glass substrate 51 on which a light shield film 50 including a rectangular opening portion 50a in the same height as a surface of the wafer W is coated, a photoelectric conversion element 52 for photoelectrically converting the exposure illumination light passed through the opening portion 50a into a detection signal, and a signal treatment portion 153 for treating the detection signal S1 from the photoelectric conversion element 52. The treated result from the signal treatment portion 153 is supplied to a main control device 118 shown in FIG. 17. In the illustrated embodiment, as will be described later, by driving the wafer stage 2, the projected image of the pattern on the reticle R is scanned by the opening portion 50a of the imaging characteristic measuring sensor 103. In this case, on the basis of the detection signal S1 outputted from the photoelectric conversion element 52, the signal treatment portion 153 seeks or determines distribution of focus positions (curvature of field) of the image plane of the projection optical system PL5 at various image heights.

Further, a lens temperature control device 13 for controlling a temperature or temperatures of one or more lens elements made of fluorite is connected to a projection optical system PL5. In the illustrated embodiment, if the non-linear defocus (curvature of field and the like) of the projection optical system PL5 is worsened in accordance with the change in the environmental condition or the history of the illumination amount, the non-linear defocus is corrected by the lens temperature control device 13 on the basis of the command from the main control device 118. If the linear magnification error of the projection optical system PL5 is worsened by correcting the non-linear defocus, the linear magnification error is corrected by the lens control device 12.

The projection exposure apparatus according to the illustrated embodiment includes a focusing position detecting system comprising a projection optical system 68 for obliquely directing a spot light beam onto the wafer at a plurality of measuring points on the exposure area of the projection optical system PL5 and a light receiving optical system 69 for receiving a light beam reflected from each measuring point to re-focus (re-form) a spot light beam and for outputting a focus signal corresponding to a lateral deviation amount of the re-formed spot light beam (relative to the original spot light beam). A plurality of focus signals from the light receiving optical system 69 are supplied to the main control device 118. In this case, if the position of the surface of the wafer W is changed (focus position) along the optical axis direction (Z direction) of the projection optical system PL5, since a level of the corresponding focus signal is also changed, the main control device 118 can monitor the focus position of the wafer W. And, in the main control device 118, by controlling the operation of the drive mechanism for driving the wafer stage 2 in the Z direction by means of a stage control system 11, the focus position at a center of the average surface of the shot area (to be exposed) on the wafer W is maintained in a predetermined focus position at a center of the averaging surface of the image plane of the projection optical system PL5.

In the illustrated embodiment, when the curvature of field of the projection optical system PL5 is corrected, the focus position at the center of the average surface of the image plane is often offset. Thus, if such offset is generated, the focus position of the wafer W is corrected to cancel the offset by driving the wafer stage 2, thereby preventing the defocus from generating between the image plane and the surface of the wafer W. Further, in the illustrated embodiment, a mechanism (levelling stage) for correcting an inclination angle of the wafer W is provided on the wafer stage 2, so that the main control device 118 determines the inclination angle of the wafer W on the basis of the focus positions at the plurality of measuring points of the focusing position detecting system, and the inclination angle of the wafer W is aligned with the inclination angle of the image plane.

Further, in the illustrated embodiment, an alignment sensor 70 of off-axis imaging type for detecting positions of alignment wafer marks provided on the short areas of the wafer W is disposed at a side of the projection optical system PL5.

Figure 18:
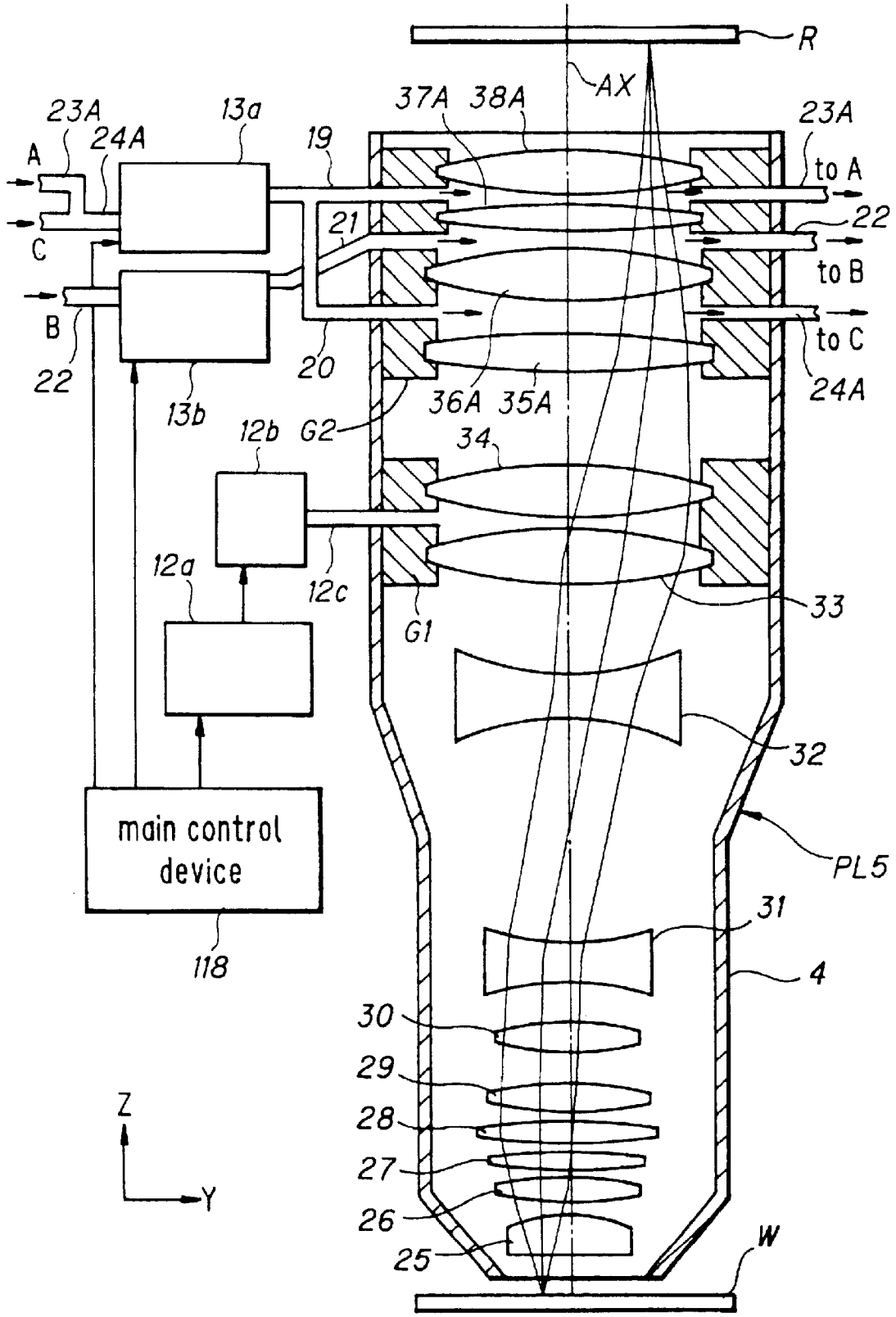
FIG. 18 is an explanatory view showing a projection optical system and an imaging characteristic correcting mechanism used in the fifth embodiment.

Next, an example of a method for removing the curvature of field of the projection optical system PL5 according to the illustrated embodiment will be explained. Incidentally, regarding the following description, FIG. 18 shows the fifth embodiment of the present invention corresponding to FIG. 2, and, thus, the elements corresponding to those shown in FIG. 2 are designated by the same reference numerals and explanation thereof will be omitted.

Figure 22A:
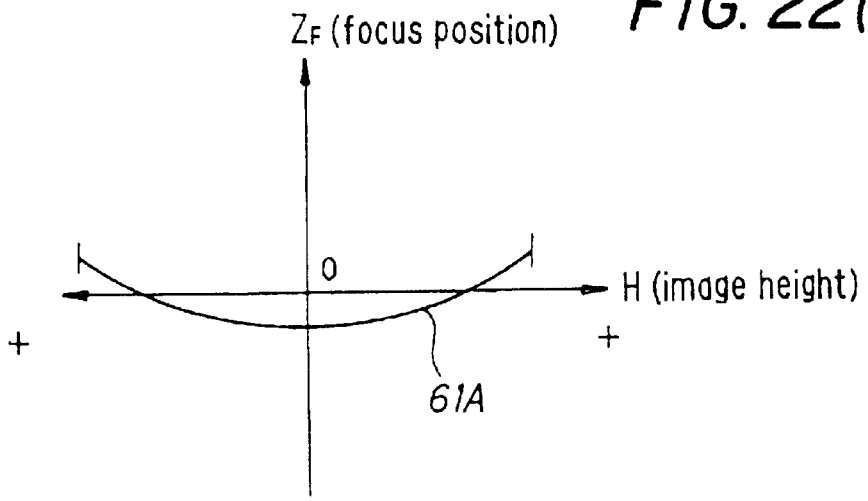
FIG. 22 is a graph showing a feature of the lens element, where section (a) shows curvature of field generated by the lens element made of quartz, section (b) shows a distribution of focus positions caused by the lens element made of temperature-controlled fluoride, and section (c) shows a correction method for residual focus positions.
Figure 22B:
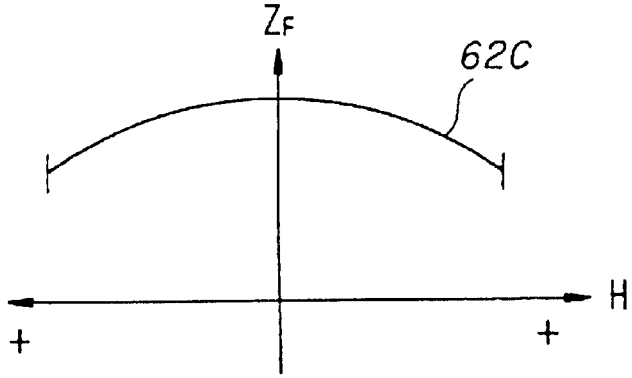
Figure 22C:
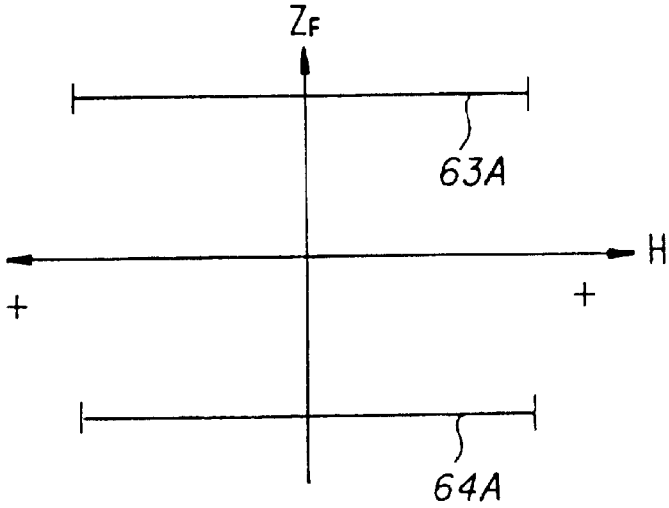

First of all, the curvature field of the projection optical system PL5 will be described with reference to FIGS. 22 and 23. In FIGS. 22 and 23, the abscissa indicates the image height H and the ordinate indicates the focus position $Z_F$ of the image plane of the projection optical system PL5 at various image heights H. The focus position on the optical axis (H=0) is shown as a design focus position. In this case, under a certain condition, after the exposure is continued for a certain time period, the image plane obtained by the quartz lens elements of the projection optical system PL5 has downwardly-convex curvature of field as shown by the curve 61A in a section (a) of FIG. 22.

To the contrary, in the illustrated embodiment, by adjusting the temperature of the fluorite lens elements 36A, 37A of the projection optical system PL5 by means of the lens temperature control device 13 of FIG. 17, the curvature of field generated by the fluorite lens elements of the projection optical system PL5 is set to have a curvature substantially opposite to the curvature of the curve 61A shown in the section (a) of FIG. 22. However, even when the curvature of field generated by the fluorite lens elements is set in this way, the offset which is uniform through the entire range of the image height H is added to the focus position of the image plane. Accordingly, the distribution of the focus positions of the image plane obtained by the fluorite lens elements of the projection optical system PL5 has a feature in which the curvature of field substantially opposite to the curvature of the curve 61 shown in the section (a) of FIG. 22 includes the predetermined offset, as shown by the curve 61C in a section (b) of FIG. 22.

Thus, as shown by the straight line 63A in a section (c) of FIG. 22, the focus position $Z_F$ of the image plane of the entire projection optical system PL5 becomes substantially constant through the entire range of the image height H, thereby generating the defocus between the image plane and the surface of the wafer W. To cancel the defocus, the focus on the surface of the wafer W is corrected by an amount corresponding to the defocus by driving the wafer stage 2 in the Z direction with respect to the projection optical system PL5 by means of the drive mechanism. This means that the offset of the defocus position as shown by the straight line 64A in the section (c) of FIG. 22 is added to the image plane of the projection optical system PL5. As a result, the distribution of the focus position $Z_F$ of the image plane of the projection optical system PL5 according to the illustrated embodiment with respect to the surface of the wafer W becomes to that shown by the curve 64A in FIG. 23, thereby eliminating the curvature of field and the predetermined defocus. Accordingly, the width of the depth of focus of the entire image plane is widened in comparison with the conventional techniques, with the result that the projected image can be projected with a higher resolving power as a whole.

By adjusting the temperature of the fluorite lens elements 36A, 37A, the linear magnification error of the image plane (error in which the magnification is changed in proportion to the image height) is often worsened. If such linear magnification error is generated, a linear magnification error which can substantially cancel the generated linear magnification error is added to the image plane by the lens control device 12 of FIG. 17. As a result, the imaging characteristic of the projection optical system PL5 according to the illustrated embodiment has a good feature having no curvature of field and no distortion.

Now, an example of a method for measuring the distribution of the focus positions of the image plane of the projection optical system PL5 will be explained with reference to FIGS. 24 and 25.

To this end, a test reticle having a plural pairs (for example, sixteen pairs) evaluating marks disposed equidistantly in the illumination area is used as the reticle R of FIG. 17. Each pair of evaluating marks are constituted by an X axis evaluating mark formed by a line-and-space pattern (in which the lines are spaced in the X direction at predetermined intervals) and a Y axis evaluating mark corresponding what is obtained by rotating the X axis evaluating mark by 90 degrees. A projected image MY(i) of the i-th (i=1–16) Y axis evaluating mark is shown in a section (a) of FIG. 24. In the following description, although the detection of the focus position of the image plane (best focus plane) by using the projected image of the Y axis evaluating mark is explained, the X axis evaluating mark may also be used, or a difference between the focus positions obtained by X axis and Y axis evaluating marks may be determined for use.

In the section (a) of FIG. 24, the projected image MY(i) has a pattern in which bright portions P1–P5 are disposed at a predetermined pitch in the Y direction, and the projected image MY(I) is scanned in the Y direction by means of the rectangular opening portion 50a of the imaging characteristic measuring sensor 103 by driving the wafer stage 2 of FIG. 17. In this case, the detection signal S1 outputted from the photoelectric conversion element 52 shown in a section (b) of FIG. 24 is A/D (analogue/digital)-converted in a signal treatment portion 153, and the treated result is stored in correspondence to the Y axis value of the wafer stage 2.

Figure 25A:
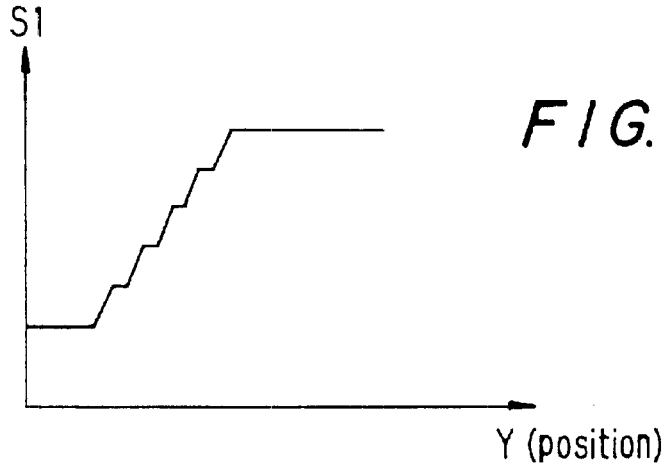
FIG. 25 is a graph showing the principle of the imaging characteristic measurement, where section (a) shows a waveform of a detection signal detected by the imaging characteristic measuring sensor 3, section (b) shows a waveform of a derivative signal of the detection signal, and section (c) is an explanatory view for explaining a focus position determining method.
Figure 25B:
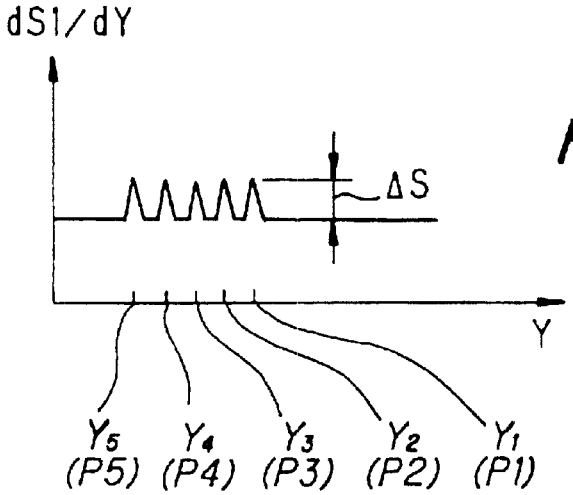
Figure 25C:
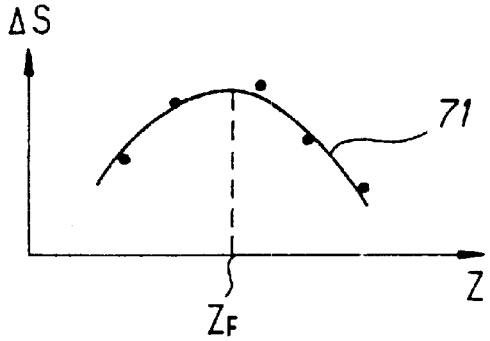

A section (a) of FIG. 25 shows the detection signal S1 obtained in this example. In this example, since the opening portion 50a has the rectangular shape, as shown in the section (a) of FIG. 24, the detection signal S1 is a signal which is changed steppingly in accordance with the Y axis value. Thus, as an example, in the signal treatment portion 153, the detection signal S1 is differentiated by the Y axis value (difference calculation in the actual treatment) to obtain a derivative signal dS1/dY as shown in a section (b) of FIG. 25. Then, positions $Y_1$–$Y_5$ on the Y axis where the derivative signal dS1/dY has peak values correspond to the bright portions P1–P5 of the projected image MY(i) of the evaluating mark shown in the section (a) of FIG. 24. When the imaging plane of the imaging characteristic measuring sensor 103 is positioned in the focus position (best focus position) of the image plate, the contrast of the waveform of the derivative signal dS1/dY corresponding to the bright portions P1–P5 becomes maximum, and an average value ΔS (corresponding to the inclination of the detection signal S1 shown in a section (a) of FIG. 25) of heights of the waveform corresponding to the bright portions P1–P5 becomes maximum. Thus, in the signal treatment portion 153, the average value ΔS of the heights of the peak portions of the derivative signal dS1/dY is determined. In this way, regarding all of sixteen projected images, the average values ΔS of the heights of the peak positions are determined. That is to say, the average value ΔS of the heights of the peak portions regarding the sixteen projected images are successively determined while changing the Z axis position of the imaging characteristic measuring sensor 103 by a predetermined step width by driving the wafer stage 2 in the Z direction by means of the drive mechanism.

As a result, regarding the projected images having a certain image height among sixteen projected images, a measurement data as shown by the plotted curve in a section (c) of FIG. 25 is obtained. In the section (c) of FIG. 25, the abscissa indicates the Z axis position of the imaging plane of the imaging characteristic measuring sensor 103 and the ordinate indicates the average values ΔS of the heights of the peak portions. In the signal treatment portion 153, the plotted curve shown in the section (c) of FIG. 25 is closely resembled to a quadratic curve 71, for example, by the method of least squares, and the Z axis position $Z_F$ where the quadratic curve 71 has a peak is regarded as the focus position of the imaging plane at that image height. By determining the focus positions $Z_F$ of the image planes at various image heights, the distribution of the focus positions (curvature of field) as shown in FIG. 23 in the present environmental condition can be measured. Since the focus positions at the predetermined plural measuring points on the image height H are measured, the focus position at any point between the measuring points may be determined by interpolation on the basis of the focus positions at the adjacent measuring points.

Next, an example of a method for determining the temperature to be set for the lens elements 36A and 37A made of fluorite (FIG. 18) will be explained. It is assumed that the pressure (atmospheric pressure) of air surrounding the projection optical system PL5 is "x". If the curvature of field exceeding the allowable value is generated in the projection optical system PL5 by change in the atmospheric pressure x from a reference value $x_0$, such curvature of field must be canceled. Now, the value of the temperature y to be set for the lens elements 36A, 37A for canceling the curvature of field will be described. In this case, the curvature of field of the projection optical system PL5 caused by changing the atmospheric pressure x from the reference value $x_0$ is determined by optical calculation. And, the temperature y of the lens elements 36A, 37A which can generate curvature of field having a feature opposite to that of the optically determined curvature of field is determined by calculation.

Figure 26:
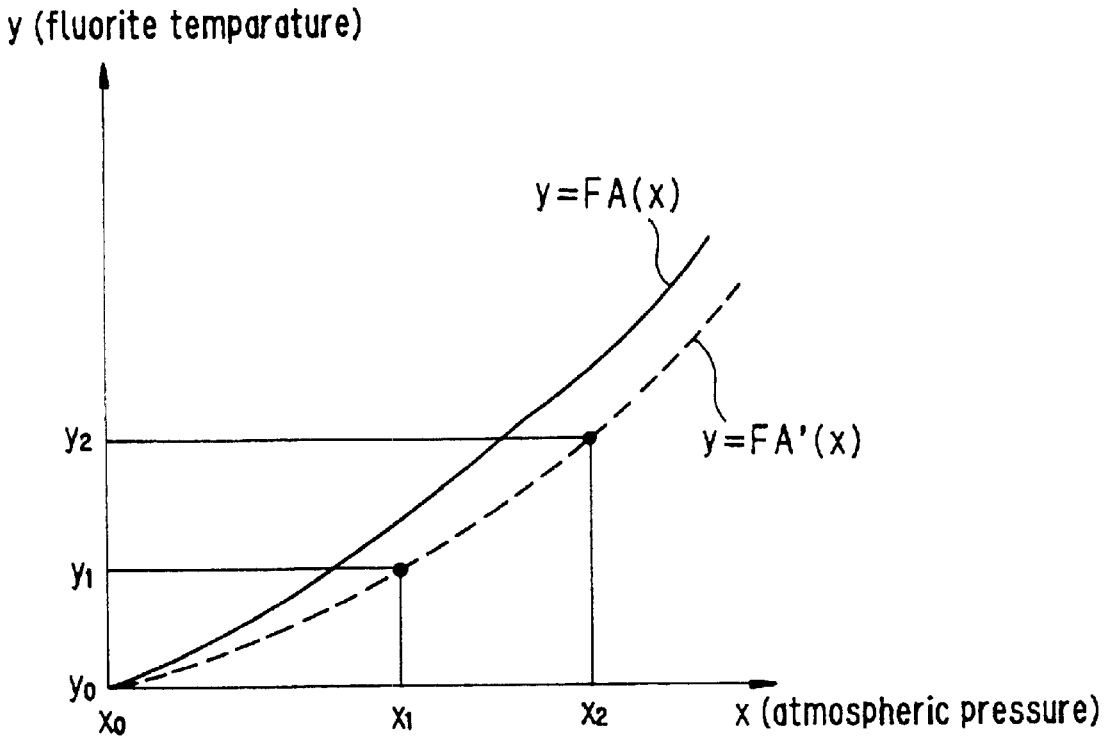
FIG. 26 is a graph showing a relation between an atmospheric pressure and a temperature of a lens element made of fluoride.

The solid curve shown in FIG. 26 represents the temperature y (y=FA(x)) previously determined as a function FA(x) of the atmospheric pressure x. In FIG. 26, the abscissa indicates the atmospheric pressure x and the ordinate indicates the temperature y of the lens elements 36A, 37A made of fluorite, and "$y_0$" represents a temperature of the lens elements 36A, 37A for minimizing the curvature of field at a reference atmospheric pressure $x_0$. In the practical use, the temperature y may be set on the basis of the function FA(x).

However, in actual, due to the manufacturing error of the optical elements of the projection optical system PL5, the curvature of field cannot often be decreased adequately by using the temperature y determined on the basis of the function FA(x). Further, as explained in connection with FIG. 12, the illumination optical system 14 according to the illustrated embodiment shown in FIG. 17 can be used under the various conditions such as the normal condition, the modified-shape light source condition and the condition that the coherent factor (σ value) is small. Thus, the above-mentioned function FA(x) must be calculated for each of various illumination conditions. However, the calculated result of the function FA(x) particularly regarding the modified-shaped light source condition and the small coherent factor condition sometimes has less reliability. To avoid this, it is desirable that the calibration of the function FA(x) is performed in the following manner in order to further reduce the curvature of field.

That is to say, in order to seek the optimum function to be well applied, the curvature of field of the projected image from the projection optical system PL5 is obtained by utilizing the imaging characteristic measuring sensor 103 of FIG. 17 at any atmospheric pressure $x_1$ different from the reference atmospheric pressure $x_0$. Then, by controlling the temperature of the lens elements 36A, 37A made of fluorite by means of the lens temperature control device 13, a temperature $y_1$ at which the curvature of field of the projected image becomes zero (minimum) is determined. In this case, the temperature of the lens elements 36A, 37A made of fluorite is made to be changed in the vicinity of the temperature y determined by the theoretical function FA(x). Thereafter, a pressure in the gas chamber at which the residual linear magnification error becomes zero is also determined by using the lens control device 12. At the same time, the offset of the residual focus positions is also sought.

Further, regarding another atmospheric pressure $x_2$ different from the atmospheric pressure $x_1$, a temperature $y_2$ of the lens elements made of fluorite at which the curvature of field of the projected image becomes zero and a pressure in the gas chamber at which the residual linear magnification error becomes zero are also determined. And, the offset of the residual focus positions is also determined. On the basis of the actually measured temperatures of the lens elements made of fluorite at the atmospheric pressures $x_0$, $x_1$, $x_2$, as shown by the broken line in FIG. 26, the function FA'(x) representative of the temperature y of the lens elements made of fluorite regarding the atmospheric pressure x can be determined, for example, as a quadratic function. In this case, the pressure in the gas chamber at which the residual linear magnification error becomes zero can be determined as a function of the atmospheric pressure x. At the same time, the residual offset of the focus position can be determined as a function of the atmospheric pressure x. By increasing the number of the measuring points, the temperature y of the lens elements made of fluorite and the like may be determined as a cubic function of the atmospheric pressure x. By using such function FA(x), the curvature of field of the projected image can be further decreased.

Figure 27:
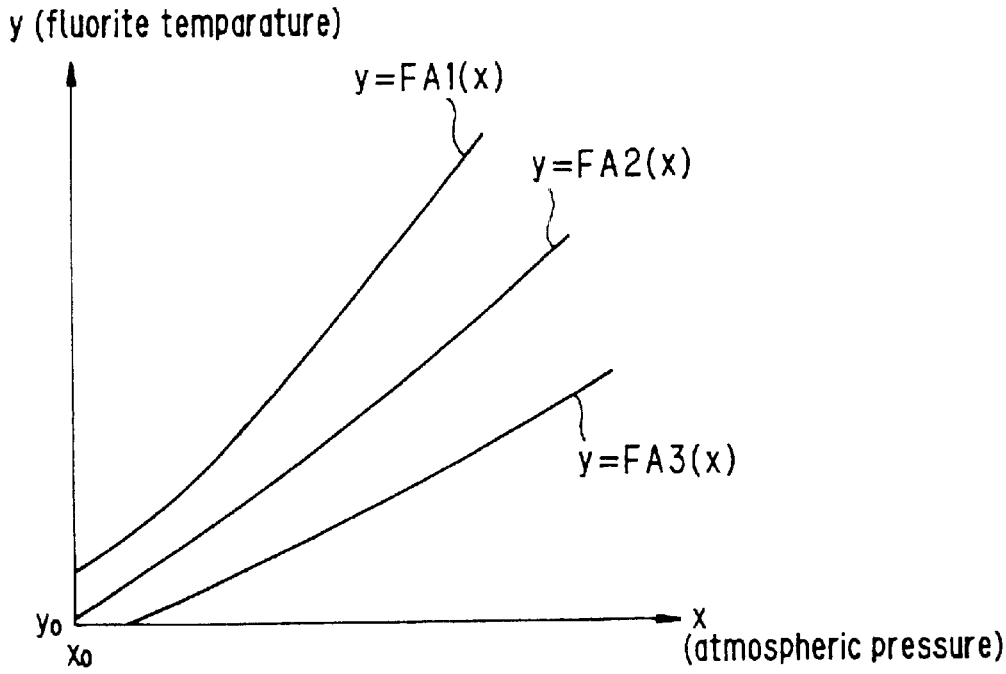
FIG. 27 is a graph showing a relation between the atmospheric pressure and the temperature of the lens element made of fluorite when the illumination condition is changed.

Although the function FA'(x) shown in FIG. 26 was determined under the normal illumination condition (method shown in the section (a) of FIG. 12), the similar calibration is effected under other two illumination conditions (methods shown in the section (b) and (c) of FIG. 12). The results that the temperatures y at which the curvature of field of the lens elements made of fluorite becomes zero are determined as a function of the atmospheric pressure x under the illumination conditions of the sections (b) and (c) of FIG. 12 are shown by the functions FA1(x) and FA3(x) in FIG. 27. The function FA2(x) shown in FIG. 27 is the same as the function FA'(x) shown in FIG. 26, i.e., a function determined under the normal illumination condition. When the functions are determined in this way, three functions FA1(x)–FA3(x) of FIG. 27 are stored in the memory in the main control device 118 of FIG. 17. In the main control device 118, in accordance with the measured atmospheric pressure x, a target value of the temperature y of the lens elements made of fluorite is determined in dependence upon the function corresponding to the used illumination condition, and the temperature of the lens elements is set to the target value by using the lens temperature control device 13.

In the above example, while the curvature of field caused due to the difference in atmospheric pressure is corrected, each lens element may be expanded or the index of refraction of each lens element may be changed by the illumination energy when the exposure illumination light is passing through the projection optical system, and, the curvature of field is generated by such expansion and/or the change in index of refraction. To cope with this, it is necessary that the temperature y of the lens elements made of fluorite at which the curvature of field is minimized is determined as a function of the illumination energy e (e represents illumination energy passing through the projection optical system PL5 per unit time). Further, in this case, it is necessary that the function is determined for each illumination condition.

Figure 28:
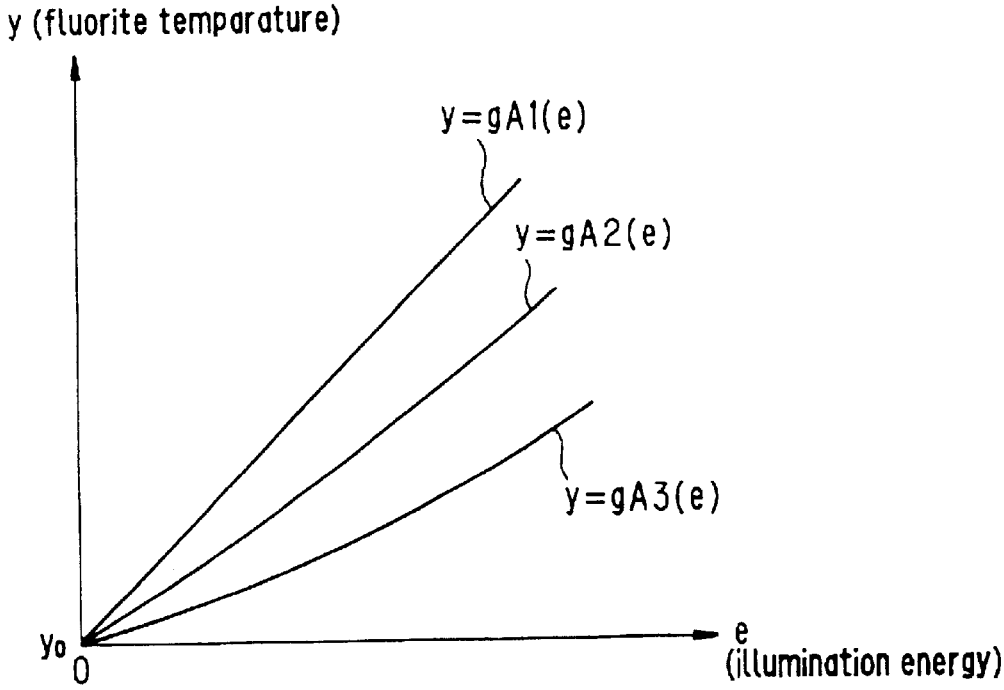
FIG. 28 is a graph showing a relation between illumination energy passing through the projection optical system and the temperature of the lens element made of fluorite.

FIG. 28 shows the temperature y of the lens elements made of fluorite determined by effecting the calibration so that the curvature of field is minimized for the illumination energy e. In FIG. 28, the abscissa indicates the illumination energy e of the exposure illumination light passing through the projection optical system PL5 and the ordinate indicates the temperature y of the lens elements made of fluorite at which the curvature of field is minimized. In this case, the illumination energy e can be determined by multiplying a signal (for example, obtained by photoelectrically converting light flux partly separated from the exposure illumination light in the illumination optical system 14 of FIG. 17) by a predetermined conversion coefficient. The functions gA1(e), gA2(e) and gA3(e) of the illumination energy e shown in FIG. 28 are functions which are determined for the respective illumination conditions shown in the sections (b), (a), (c) of FIG. 12 and which represent the temperatures y at which the curvature of field is minimized.

In conclusion, ultimately, it is necessary that the temperatures y of the lens elements made of fluorite at which the curvature of field is minimized are determined as a function Q (e, x, I) including the illumination energy e, atmospheric pressure x and illumination condition I as parameters. The function Q (e, x, I) is also stored in the memory in the main control device 118 of FIG. 17, and, in the main control device 118, it is desirable that a target value of the temperature of the lens elements made of fluorite is determined from the function Q (e, x, I) in dependence upon the exposure illumination energy e, atmospheric pressure x and illumination condition I.

As explained in connection with FIG. 31, when the large size reticle is used, the flexure of the reticle is increased, thereby worsening the curvature of field of the image plane. To cope with this, it is desirable that the curvature of fields of the image planes of various reticles having different sizes and different kinds are previously determined by using the imaging characteristic measuring sensor 103, and the temperature of the fluorite lens elements is controlled to minimize the curvature of field regarding the used reticle. In this way, even when a reticle having a great area is used, the flexure of the reticle and the curvature of field can be canceled with each other.

In the illustrated embodiment, while the excimer laser light source is used as the exposure light source, regarding the illumination energy of the exposure illumination light, when i-ray (having a wavelength of 365 nm) of a mercury lamp is used, the energy of the i-ray is more absorbed than the energy of the excimer laser light in the projection optical system, and, thus, the curvature of field of the projection optical system is more increased than the excimer laser light. Accordingly, when the method for controlling the temperature of the lens elements made of fluorite in accordance with the illumination energy is applied to a projection exposure apparatus (stepper and the like) using the i-ray of the mercury lamp, the curvature of field can be reduced more effectively.

Figure 19:
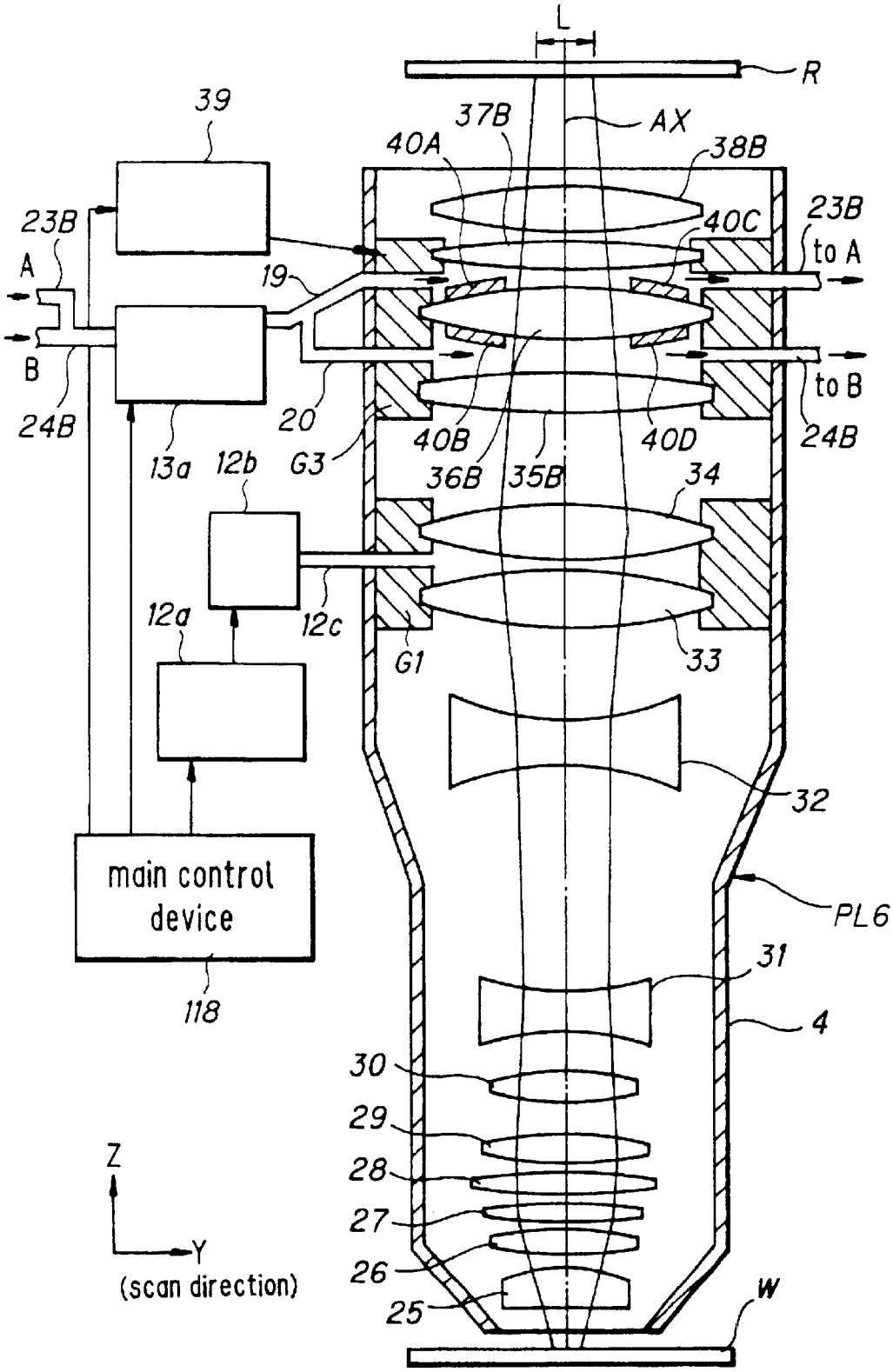
FIG. 19 is an explanatory view showing a projection optical system and an imaging characteristic correcting mechanism used in a sixth embodiment of the present invention.

Next, a sixth embodiment of the present invention will be explained with reference to FIG. 19. Since FIG. 19 corresponds to FIG. 3, the elements corresponding to those shown in FIG. 3 are designated by the same reference numerals and explanation thereof will be omitted. A projection optical system according to this embodiment is particularly suitable for a projection exposure apparatus of step-and-scan type.

According to this embodiment, since the temperature of the lens element 36B made of fluorite is directly controlled by the temperature control elements 40A–40D while effectively utilizing the spaces (zones) which are not illuminated by the illumination light passed through the slit-shaped illumination area, the temperature of the lens elements 36B can be set to the desired target temperature quickly and accurately. With this arrangement, the curvature of field of the projected image obtained by a projection optical system PL6 can quickly be corrected with high accuracy.

Figure 20:
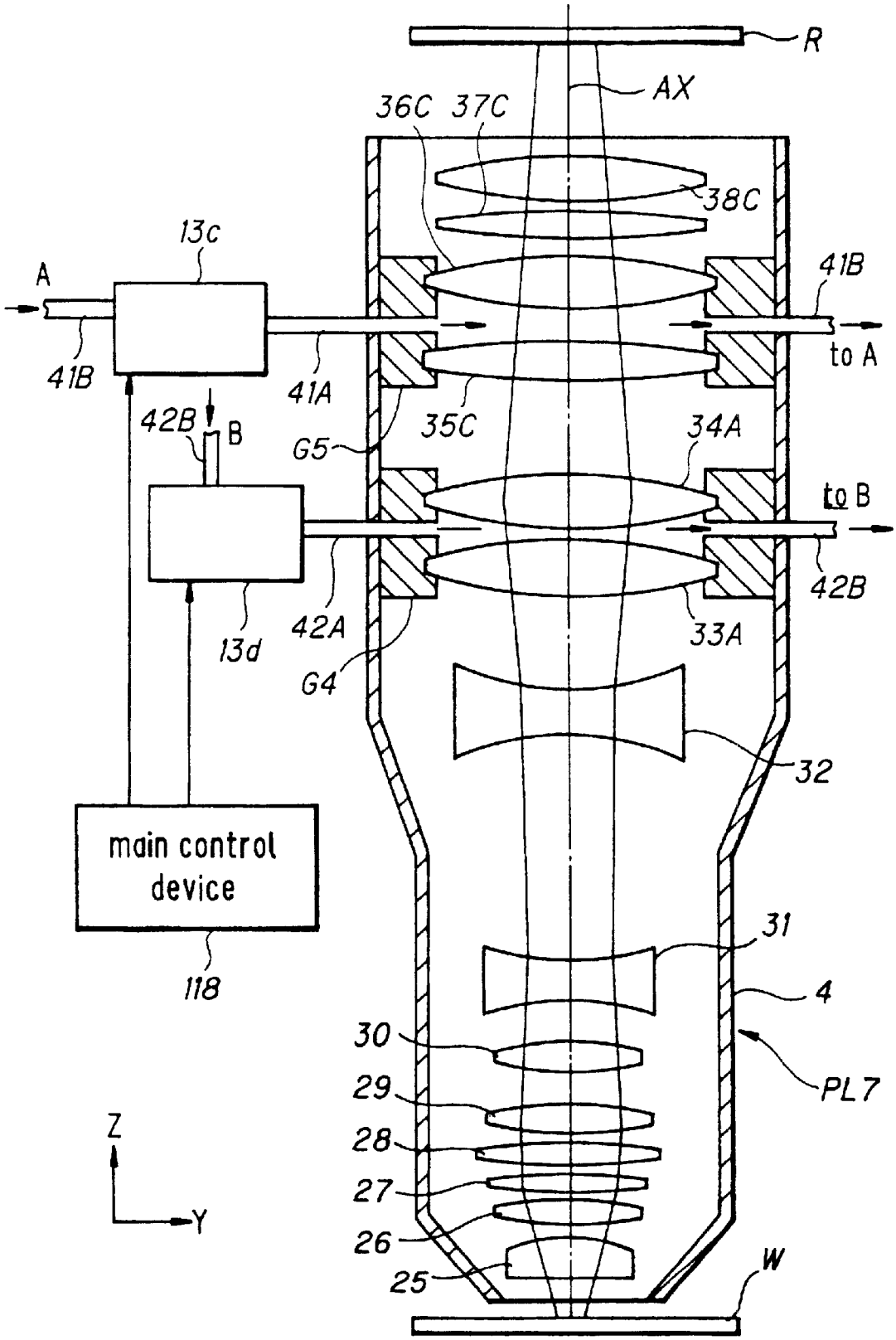
FIG. 20 is an explanatory view showing a projection optical system and an imaging characteristic correcting mechanism used in a seventh embodiment of the present invention.

Next, a seventh embodiment of the present invention will be explained with reference to FIG. 20. Since FIG. 20 corresponds to FIG. 4, the elements corresponding to those shown in FIG. 4 are designated by the same reference numerals and explanation thereof will be omitted. A projection optical system according to this embodiment is suitable to be applied to both projection exposure apparatuses of step-and-repeat type and step-and-scan type.

In this embodiment, as mentioned above, the lens elements 33A, 36C are made of fluorite, and the other lens elements are made of quartz. In this case, the feature of the curvature of field is mainly changed by the change in temperature of the upper fluorite lens element 36C, and the feature of the linear magnification error is mainly changed by the change in temperature of the lower fluorite lens element 33A. The gas having a variable temperature is supplied from the temperature control device 13c, through the piping 41A, to the gas chamber enclosed by the lens elements 35C, 36C and the lens frame G5, and the gas circulating in the gas chamber is returned to the temperature control device 13c through the piping 41B, the gas having a variable temperature is supplied from the temperature control device 13d, through the piping 42A, to the gas chamber enclosed by the lens elements 33A, 34A and the lens frame G4, and the gas circulating in the gas chamber is returned to the temperature control device 13d through the piping 42B. And, on the basis of the command from the main control device 118, the temperature control devices 13c, 13d set the temperature of the lens elements 36C, 33A to their target temperature values.

In this embodiment, when the curvature of field of the projected image obtained by a projection optical system PL7 is corrected, the temperature of the lens element 36C is controlled by the temperature control device 13c, and the generated linear magnification error is canceled by controlling the temperature of the lens element 33A by means of the lens temperature control device 13d. When the feature of the curvature of field due to the change in atmospheric pressure differs from the feature of the curvature of field due to the change in temperature during the illumination of the exposure illumination light onto the projection optical system, so that the third or higher order error of the focus position is generated greatly, this method can also be utilized to control the curvature of fields independently by using the corresponding two fluorite lens elements. That is to say, for example, the curvature of field due to the change in atmospheric pressure may be corrected by using the upper fluorite lens element 36C, and the curvature of field due to the illumination of the illumination light may be corrected by using the lower fluorite lens element 33A.

Figure 21:
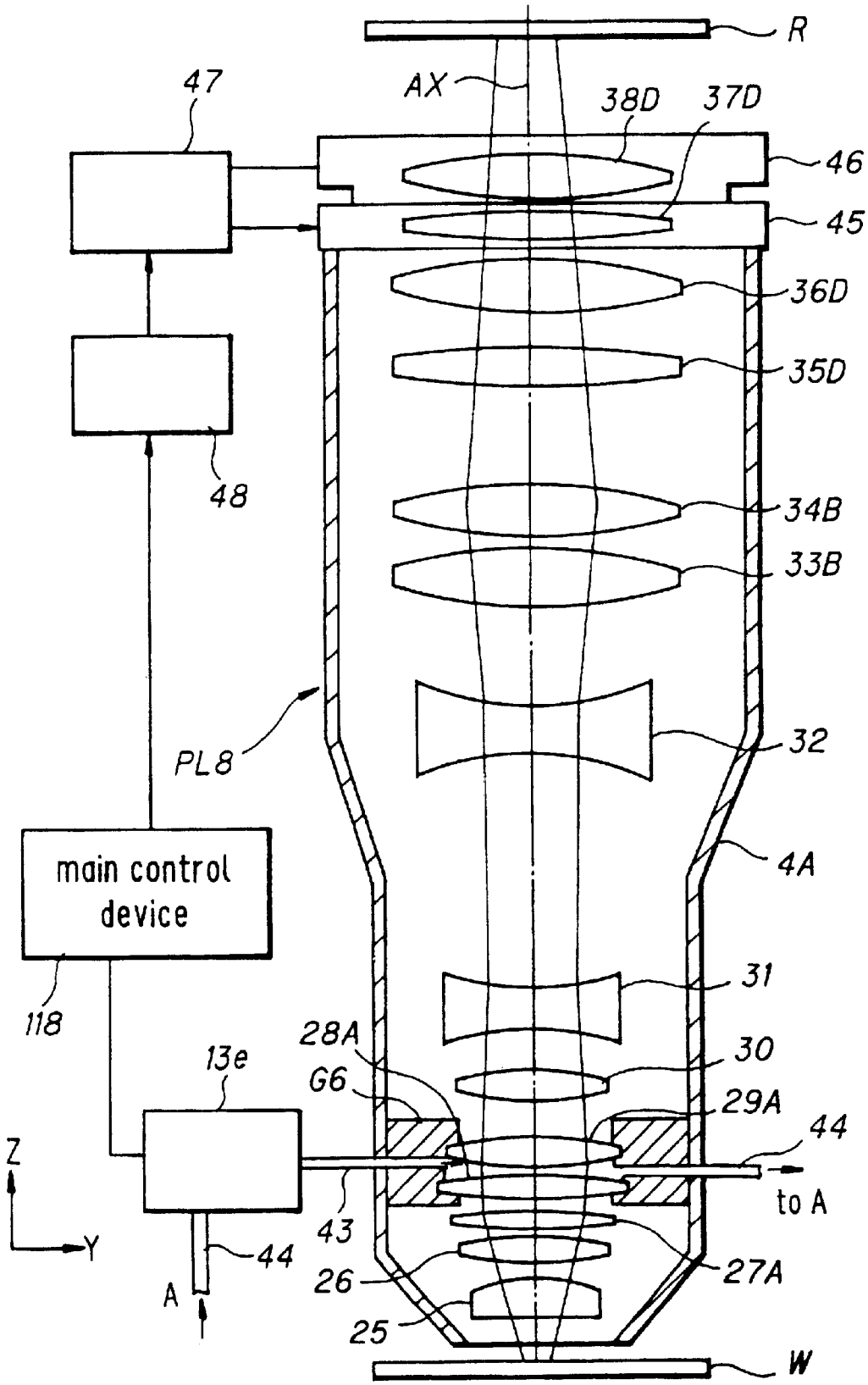
FIG. 21 is an explanatory view showing a projection optical system and an imaging characteristic correcting mechanism used in an eighth embodiment of the present invention.

Next, an eighth embodiment of the present invention will be explained with reference to FIG. 21. Since FIG. 21 corresponds to FIG. 5, the elements corresponding to those shown in FIG. 5 are designated by the same reference numerals and explanation thereof will be omitted. A projection optical system according to the eighth embodiment is suitable to be applied to both projection exposure apparatuses of step-and-repeat type and step-and-scan type.

Also in this embodiment, by controlling the temperature of the fluorite lens elements 28A, 29A by means of the temperature control device 13e, the curvature of field of the projected image obtained by a projection optical system PL8 is corrected. And, the linear magnification error generated by the correction of the curvature of field is corrected by inclining and/or lifting/lowering the lens elements 37D, 38D via the supports 45, 46. By combination of movements of two supports 45, 46, since not only the magnification error but also the defocus of the focusing position can be corrected, almost all other aberrations generated during the correction of the curvature of field can be canceled by properly controlling the temperature control device 13e and the drive device 47.

Next, referring to the actual numerical example of the projection optical systems according to fifth to eighth embodiments, the numerical analysis as to how the curvature of field is changed by the temperature control will be explained.

In this case, for example, in consideration of the projection optical system PL5 shown in FIG. 18, the projection optical system PL5 includes two lens elements by which the imaging characteristic can be corrected when these lens elements are made of fluorite. Now, it is assumed that the lens elements which can be made of fluorite are lens elements L1 and L2. Regarding the case where no lens element made of fluorite is used and the case where a single lens element L1 or L2 is made of fluorite and the other lens elements are made of quartz, the magnification errors βD [μm] at the position of 100% of the imaging height, and the deviation amounts (i.e., curvature of field) βE [μm] of the focus positions in the Z direction at the same image height were sought. The magnification errors βD [μm] and the deviation amounts βE [μm] of the focus positions when the temperature of the single fluorite lens elements is changed by 1° C., with the focus position at the image height of 0 (zero) being considered as a reference, are shown in the following Table 2:

TABLE 2

| Fluroite | βD [μm] | βE [μm] |
|---|---|---|
| none | 0 | 0 |
| 1.1 | 0.3041 | 0.1180 |
| 1.2 | 0.3971 | 0.2058 |

From the above Table 2, it can be understood that, by changing the temperature of the single fluorite lens element by ±1° C., the curvature of field of about ±0.2 μm can be corrected. In general, since the maximum resolving power of the temperature controls is about 0.01° C., when the curvature of field is corrected by changing the temperature of the single fluorite lens element by 1° C., the resolving power of the correction of the curvature of field becomes about ±2 nm (=±0.2/100/[μm]). Further, when two or more lens elements are made of fluorite, the temperature control range can be narrowed, possible additional linear magnification error can be reduced, and/or greater curvature of field can be corrected.

According to the fifth to eighth embodiments of the present invention, since the temperature control members for controlling the temperature of at least one optical member is provided, the defocus of the image plane of the projection optical system (particularly, non-linear defocus such as the curvature of field) which is worsened by the change in the environmental condition such as the atmospheric pressure around the projection optical system, the absorption of the exposure illumination light and the flexure of the reticle can be corrected. As a result, the depth of focus of the entire projected image can be widened, thereby improving the resolving power of the entire projected image.

Further, when the imaging characteristic of the projection optical system to be controlled by the temperature control device is the curvature of field, and the magnification error generated upon the correction of the curvature of field of the projection optical system by means of the temperature control device is reduced by a magnification error control means for controlling the magnification error of the optical projection system, the magnification error such as linear magnification error generated upon the correction of the curvature of field can be effectively reduced, thereby maintaining the good imaging characteristic as a whole.

When the curvature of field of the projection optical system is corrected within a range of ±0.3 μm or less by changing the temperature of the optical member (to be controlled) by ±1° C. by means of the temperature control device, as mentioned in the above numerical analysis, such curvature of field can be corrected within such a range by controlling the temperature of the single fluorite lens element, for example. It is practical.

In the case where the memory means for storing the change amounts of the position of the image plane of the projection optical system in dependence upon the changes in the applied condition of the projection optical system is provided, when the position of the image plane of the projection optical system is controlled by the temperature control device to cancel the change amount of the position of the image plane stored in the memory means in response to the change in the applied condition of the projection optical system, even if the applied condition is changed, the curvature of field can quickly be corrected with high accuracy.

In the case where the focus position control means for shifting the image plane of the projection optical system and the photosensitive substrate relative to each other along the optical axis of the projection optical system, when the offset of the focus position remaining after the position of the image plane of the projection optical system is controlled by the temperature control device is reduced by the focus position control means, the defocus generated by the correction of the curvature of field is corrected, with the result that the exposure can be effected in a condition that the surface of the photosensitive substrate is always aligned with the image plane.

The following embodiments of the present invention serve to control both the non-linear magnification error and the non-linear defocus and to carry out a desirable method for controlling the temperature of the optical member to effect such correction. Regarding the following ninth to twelfth embodiments, the non-linear magnification error and the non-linear defocus are called generically as "non-linear error".

The ninth to twelfth embodiments cope with a problem that it takes a long time to bring the optical member (to be temperature-controlled) to the desired target temperature. Prior to the explanation of the ninth to twelfth embodiments, such problem will be generally explained.

Figure 38A:
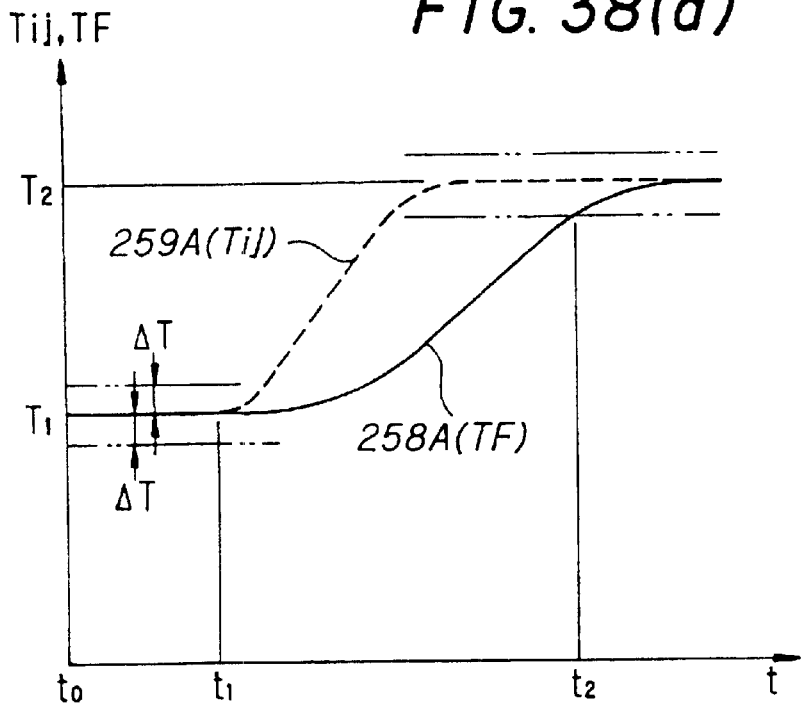
FIG. 38 is a graph showing a relation between a time and a temperature of fluorite, where a section (a) is a graph showing a relation between a control temperature $T_{ij}$ of a temperature control medium and a temperature TF of fluorite, and section (b) is an explanatory view for explaining the relation between the time and the temperature of fluorite when the control temperature $T_{ij}$ of the temperature control medium is overshot.
Figure 38B:
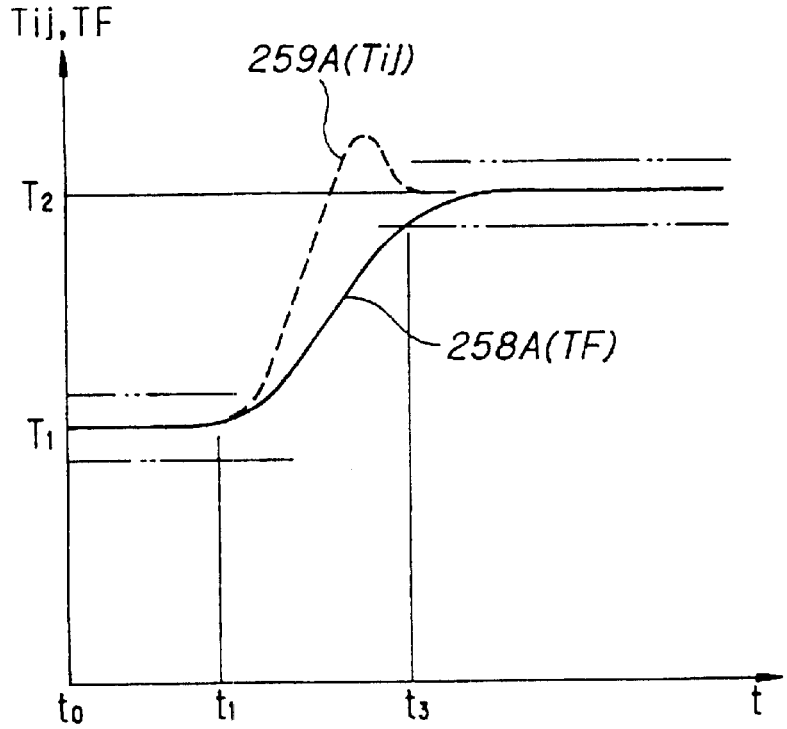

As in the above-mentioned embodiments, when the temperature of the predetermined optical members (for example, lens elements 36A, 37A) is controlled, there is time delay due to predetermined time constant until the target temperature. For example, a section (a) of FIG. 38 shows a case where the target temperature value of the optical member having a temperature of $T_1$ is changed to a value $T_2$. In the section (a) of FIG. 38, for example, even when a set temperature (control temperature) $T_{ij}$ of gas surrounding the optical member gradually approaches the target temperature $T_2$ along a curve 259 from a time point $t_1$, a temperature TF of the optical member is changed with delay along a curve 258. Thus, when a certain time is elapsed (to reach a time point $t_2$) after the temperature $T_{ij}$ of the gas reaches the target temperature $T_2$, the temperature TF of the optical member reaches an allowable range (±ΔT) of the target temperature $T_2$. Since high accurate correction of the imaging characteristic cannot be effected before the time point $t_2$, in the present invention, the exposure is started after the time point $t_2$ (at which the temperature TF of the optical member reaches the allowable range (±ΔT) of the target temperature $T_2$.

In this case, in order to judge whether the temperature TF of the optical member reaches the allowable range (±ΔT) of the target temperature $T_2$, for example, a method in which a temperature change speed of the optical member is previously sought and the temperature of the optical member left to be changed until a calculated time period is elapsed, or a method in which a temperature sensor is attached to the optical member and the actual temperature of the optical member is measured can be used. In order to make the temperature TF of the optical member approach to the target temperature $T_2$ for a short time, as shown in a section (b) of FIG. 38, for example, the set temperature $T_{ij}$ of the gas surrounding the optical member may be overshot over the target temperature $T_2$ along a curve 259A (or undershot when the target temperature is low).

Now, the ninth to twelfth embodiments of the present invention will be explained.

Figure 32:
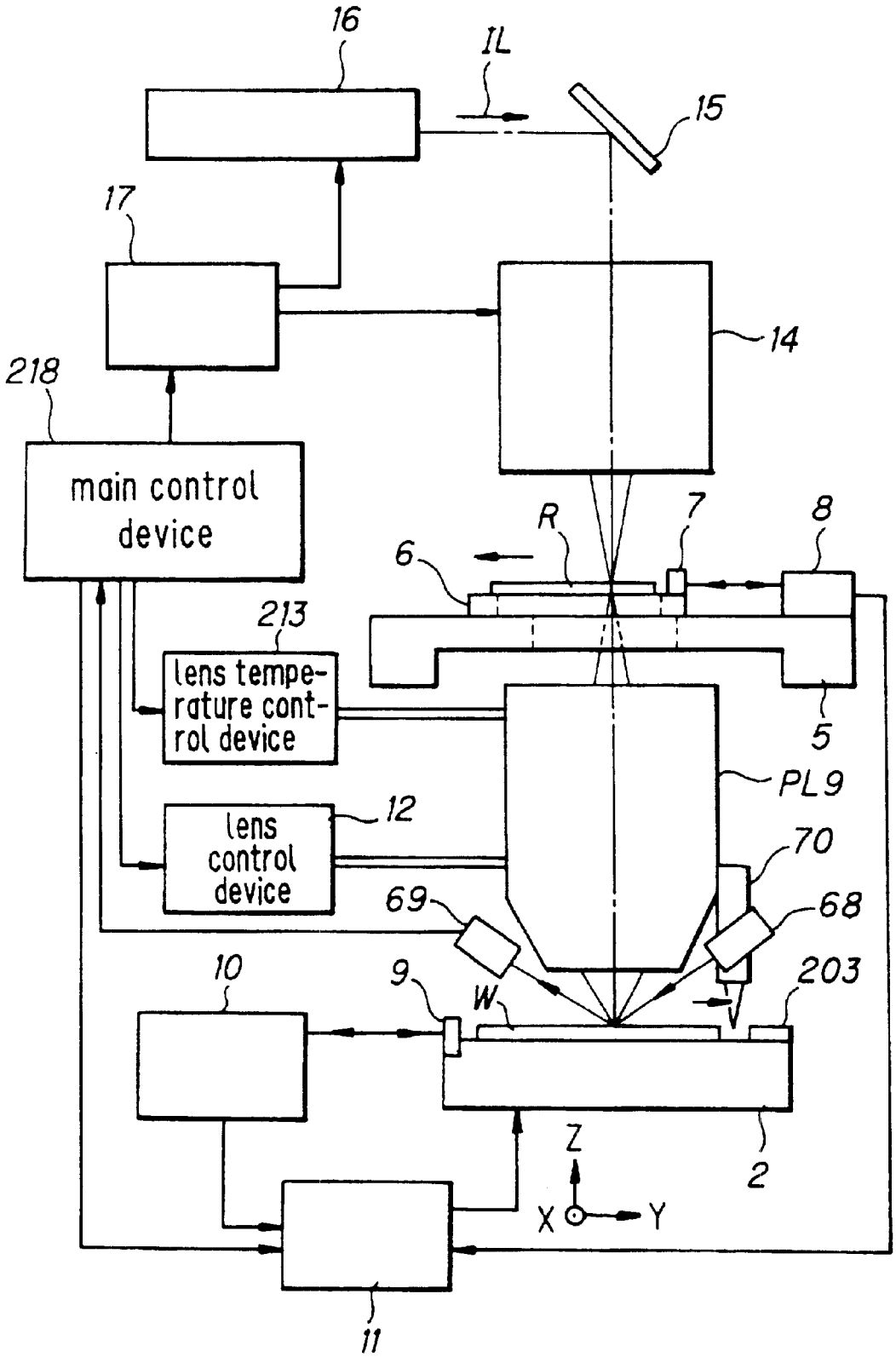
FIG. 32 is a constructural view showing a projection exposure apparatus according to a ninth embodiment of the present invention.

FIG. 32 shows a construction common to the ninth to twelfth embodiments, which corresponds to the construction shown in FIG. 17. Thus, the elements corresponding to those shown in FIG. 17 are designated by the same reference numerals and explanation thereof will be omitted.

An imaging characteristic measuring sensor 203 is secured on the wafer stage 2 in the vicinity of the wafer W. As shown in a section (b) of FIG. 37, the imaging characteristic measuring sensor 203 has a glass substrate 51 on which a light shield film 50 including a rectangular opening portion 50a in the same height as a surface of the wafer W is coated, a photoelectric conversion element 52 for photoelectrically converting the exposure illumination light passed through the opening portion 50a into a detection signal, and a signal treatment portion 253 for treating the detection signal S1 from the photoelectric conversion element 52. The treated result from the signal treatment portion 253 is supplied to a main control device 218 shown in FIG. 32. In the illustrated embodiment, as will be described later, by driving the wafer stage 2, the projected image of the pattern on the reticle R is scanned by the opening portion 50a of the imaging characteristic measuring sensor 203. In this case, on the basis of the detection signal S1 outputted from the photoelectric conversion element 52, the signal treatment portion 253 seeks or determines the non-linear magnification error and the curvature of field.

Figure 33:
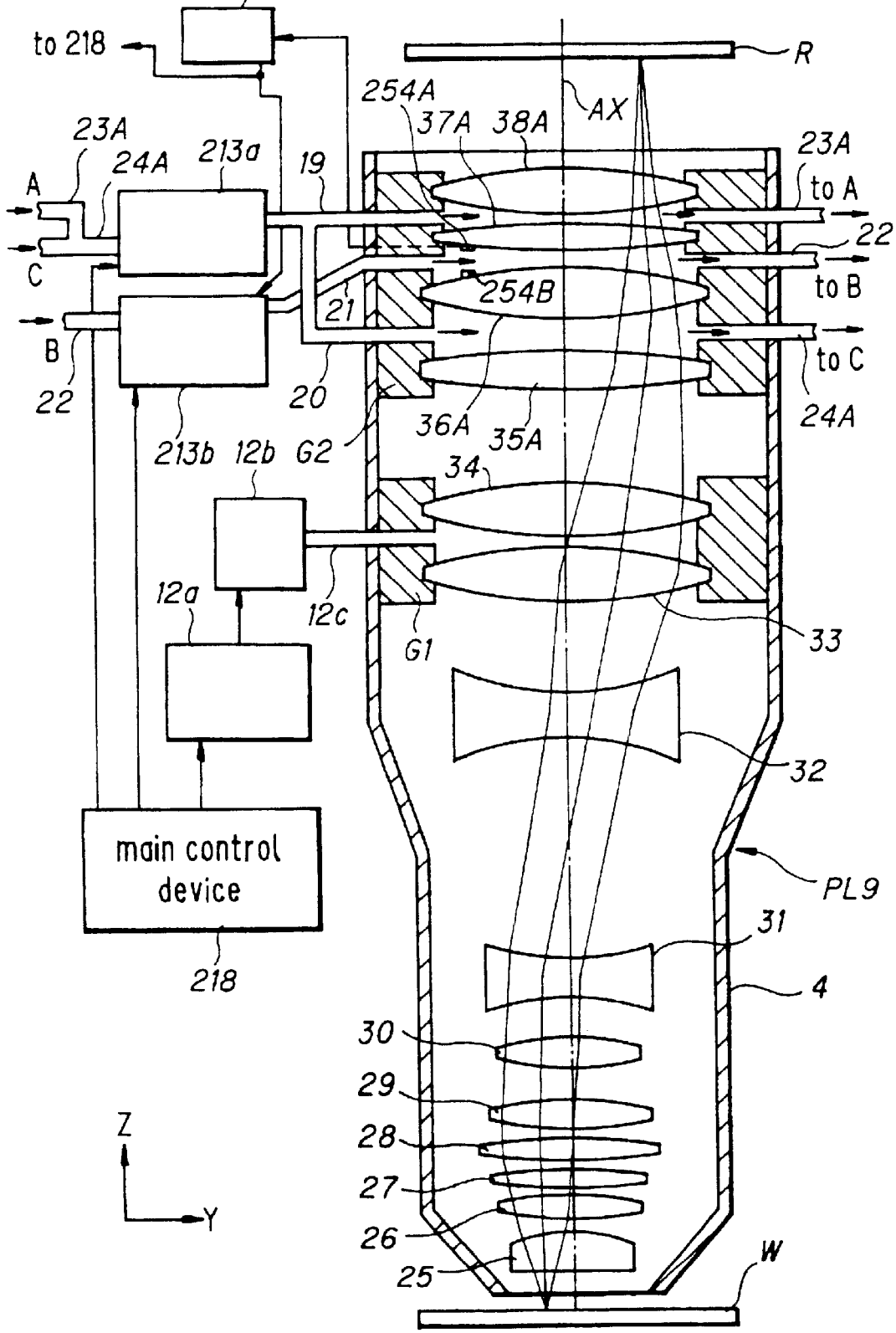
FIG. 33 is an explanatory view showing a projection optical system and an imaging characteristic correcting mechanism used in the ninth embodiment.

FIG. 33 shows the ninth embodiment of the present invention which corresponds to FIG. 18. Thus, the elements corresponding to those shown in FIG. 18 are designated by the same reference numerals and explanation thereof will be omitted.

In FIG. 33, a lens temperature control device 213 for controlling the temperature of one or more lens elements made of fluorite are connected to a projection optical system PL9. In the illustrated embodiment, when the non-linear magnification error (high order magnification error) of the projection optical system PL9, or, curvature of field, or both of them are worsened in accordance with the change in environmental condition or the history of the illumination amount, the imaging characteristic is corrected by the lens control device 213 on the basis of the command from a main control device 218. Further, when the linear magnification error of the projection optical system PL9 is worsened upon the correction of the non-linear magnification error and/or the curvature of field, the linear magnification error is corrected by the lens control device 12.

Temperature sensors 254B and 254A such as thermistors are mounted on the lens elements 36A and 37A at areas through which the exposure illumination light is not passed, and signal terminals of the temperature sensors 254A, 254B are connected to a temperature detection device 255. In the temperature detection device 255, the average temperature of the lens elements 36A, 37A is determined on the basis of the change in electric features of the temperature sensors 254A, 254B. The determined temperature is supplied to the temperature control device 213b and the main control device 218. In the temperature control device 213b, a set temperature of gas supplied through a piping 21 is minutely controlled so that the detected temperature of the lens elements 36A, 37A quickly reaches the target temperature (described later). In the main control device 218, the exposure of the wafer W is started after the detected temperature of the lens elements 36A, 37A reaches the allowable range of the target temperature.

In this way, according to this embodiment, the temperature control device 213 of FIG. 32 is constituted by the temperature control devices 213a, 213b, temperature sensors 254A, 254B, temperature detection device 255, and pipings 19–22, 23A and 24A.

Now, an example of a method for correcting the non-linear magnification error (high order magnification error) of the projection optical system PL9 or the curvature of field in this embodiment will be explained. Incidentally, in the following explanation, while an example that one of the non-linear magnification error and the curvature of field is corrected by controlling the temperature of the fluorite lens elements 36A, 37A of the projection optical system PL9 of FIG. 33 will be explained, this example is for a case where one of the non-linear magnification error and the curvature of field is greatly worsened in accordance with the applied condition of the projection optical system PL9. If both of the non-linear magnification error and the curvature of field are greatly worsened, for example, the temperature of the lens elements 36A, 37A may be set to a value so that the imaging characteristics of these lens elements are included within their allowable ranges. If such set temperature does not exist, the temperatures of the lens elements effective to correct the non-linear magnification error and the curvature of field may be controlled independently in the projection optical system PL9.

Now, an example of a method for measuring the distortion of the projection optical system PL9 and the curvature of field will be explained with reference to FIG. 37.

To this end, a test reticle having a plural pairs (for example, sixteen pairs) evaluating marks disposed equidistantly in the illumination area is used as the reticle R of FIG. 32. In this case, it is desirable that the pairs of evaluating marks include marks at various image heights. Each pair of evaluating marks are constituted by an X axis evaluating mark formed by a line-and-space pattern (in which the lines are spaced in the X direction at predetermined intervals) and a Y axis evaluating mark corresponding to what is obtained by rotating the X axis evaluating mark by 90 degrees. A projected image MY(i) of the i-th (i=1–16) Y axis evaluating mark is shown in a section (a) of FIG. 37.

Figure 37A:
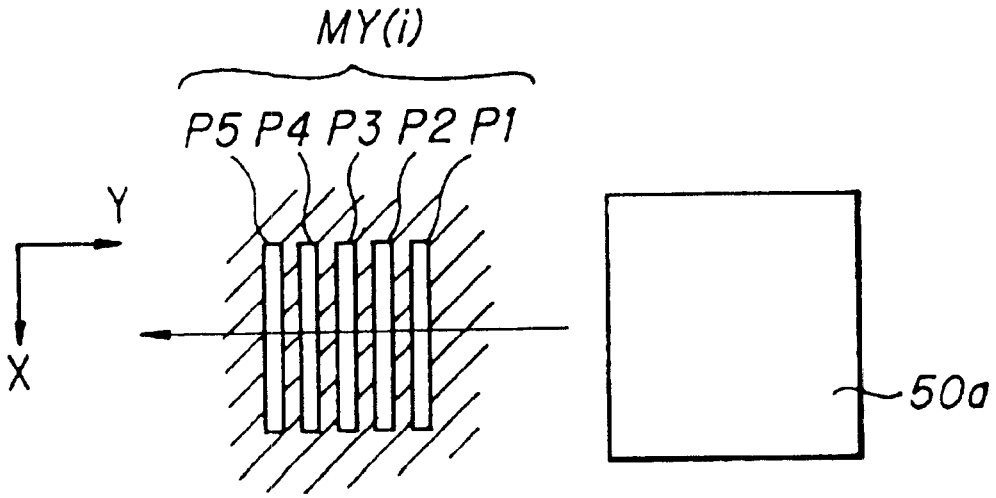
FIG. 37 is a constructural view showing a mechanism for measuring the imaging characteristic, where section (a) is a plan view showing an opening portion of an imaging characteristic measuring sensor 3 and projected images of evaluating marks, and section (b) is a constructional view, in partial section, showing a construction of the imaging characteristic measuring sensor 3.
Figure 37B:
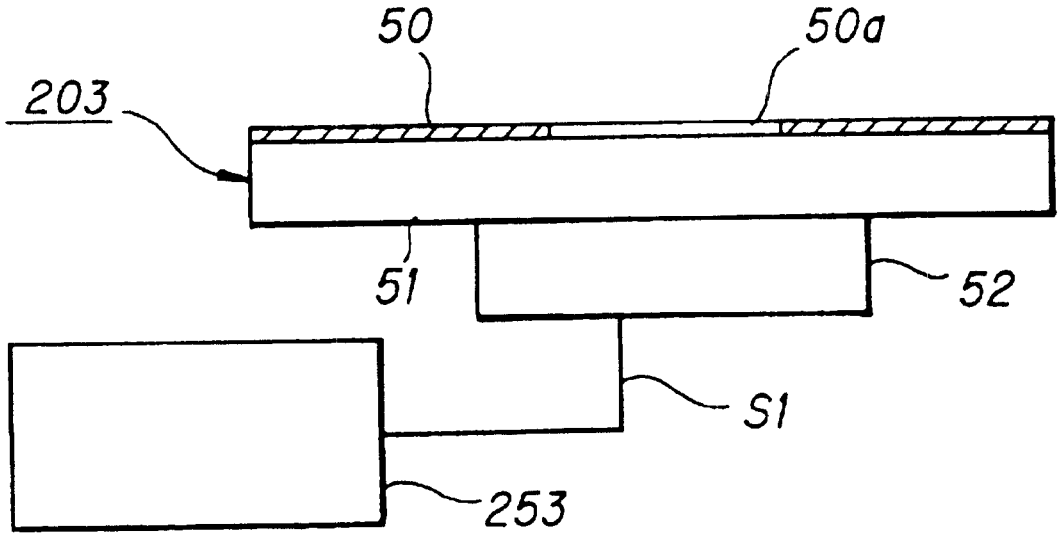

In the section (a) of FIG. 37, the projected image MY(i) has a pattern in which bright portions P1–P5 are disposed at a predetermined pitch in the Y direction, and the projected image MY(i) is scanned in the Y direction by means of the rectangular opening portion 50a of the imaging characteristic measuring sensor 203 by driving the wafer stage 2 of FIG. 32. In this case, the detection signal S1 outputted from the photoelectric conversion element 52 shown in a section (b) of FIG. 37 is A/D (analogue/digital)-converted in a signal treatment portion 253, and the treated result is stored in correspondence to the Y axis value of the wafer stage 2. And, for example, on the basis of a derivative signal of the detection signal S1, the Y axis value and the contrast of the mid point of the projected image MY(i) are determined, and the magnification error at that image height is determined on the basis of a deviation amount of the Y axis value of the mid point from the design value. Further, the focus position of the image plane at that image height is determined by seeking the X axis value at which the contrast becomes highest by changing the X axis value of the imaging characteristic measuring sensor 203. By determining the magnification errors and the focus positions of the image planes of the projected images of all of the evaluating marks, the distortion (including the non-linear magnification error) and the curvature of field can be determined.

Incidentally, regarding a method for determining the target temperature of the fluorite lens elements 36A, 37A, the associated explanations in connection with FIGS. 11 and 26 may be referred to.

Next, an example of a method for actually setting the temperature of fluorite lens elements to the target temperature will be explained with reference to FIGS. 38 to 40.

First of all, a section (a) of FIG. 38 shows the change in temperature of the fluorite lens elements as the time is elapsed. In the section (a) of FIG. 38, the broken line curve 259 indicates the set temperature $T_{ij}$ of the gas supplied from the lens control device 213b of FIG. 33 to the gas chamber between the fluorite lens elements 36A and 37A, and the solid line curve 258 indicates the temperature (fluorite temperature) TF of the lens elements 36A, 37A measured by the temperature sensors 254A, 254B. In the section (a) of FIG. 38, the target temperature of the fluorite elements at an original time point $t_0$ is $T_1$. At the time point $t_0$, the temperature TF of the fluorite lens elements is included within an allowable range ($\pm\Delta T$) of the target temperature $T_1$ having a predetermined allowable width $\Delta T$. In this case, the target temperatures $T_i$ of the fluorite lens elements and the allowable width $\Delta T$ are stored in a common working area 260 (FIG. 40) of the memory of the main control device 218 of FIG. 33 so that the data stored in the common working area 260 can be used by various control portions independently.

Figure 39:
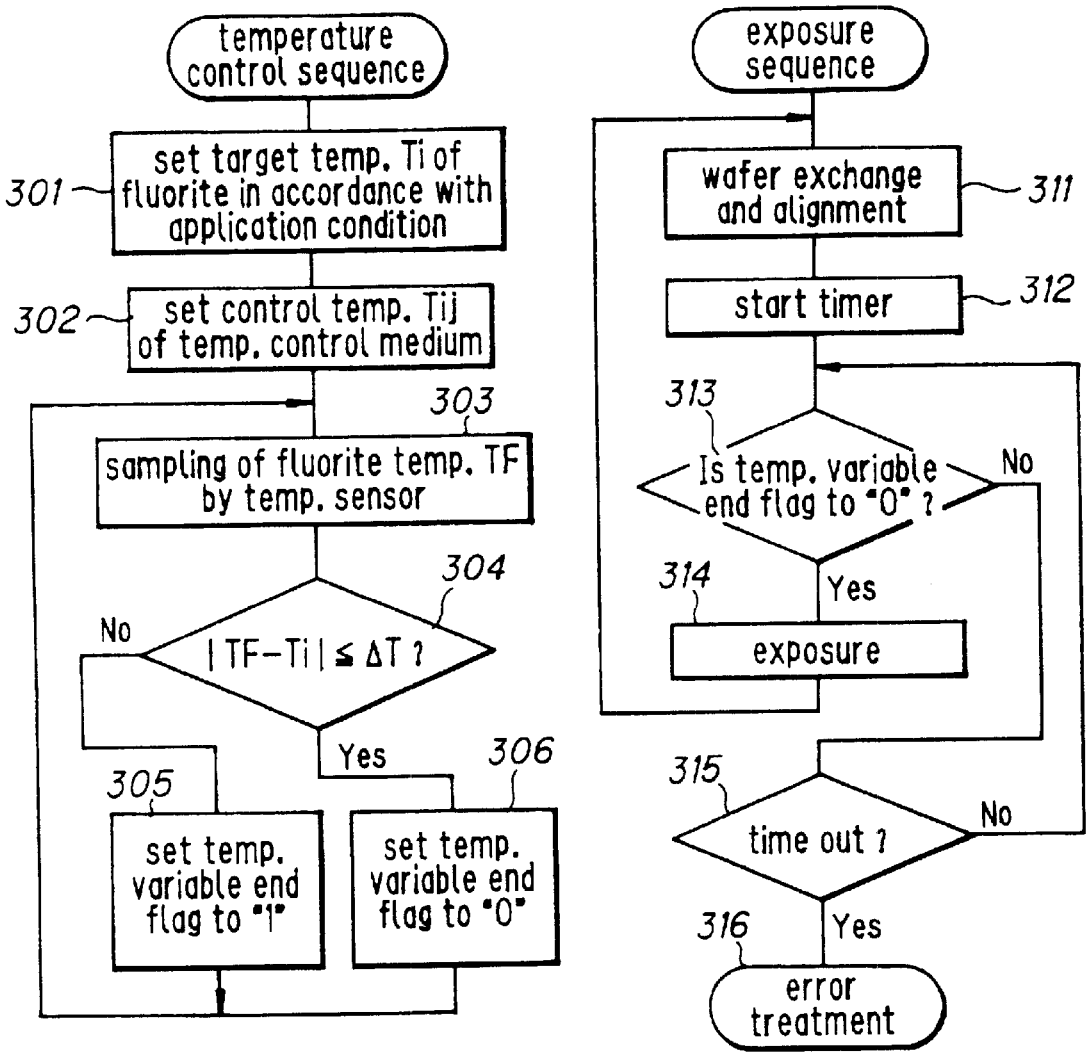
FIG. 39 is a flow chart showing a relation between a temperature control sequence for a lens element made of fluorite and an exposure sequence, according to an embodiment of the present invention.

In a further time point $t_1$, as shown by a step 301 of a flow chart shown in FIG. 39, it is assumed that the target temperature $T_i$ of the fluorite lens element is changed (from $T_1$) to $T_2$ ($T_2>T_1$) in accordance with the applied condition of the projection optical system according to the illustrated embodiment by the temperature control portion in the main control device 218 of FIG. 33. In this case, the target temperature $T_2$ is written or stored in the common working area 260 of FIG. 40 and is transferred to the temperature control device 213b of FIG. 33.

Thereafter, in a step 302 of the flow chart, the temperature control device 213b of FIG. 33 gradually changes the temperature $T_{ij}$ (referred to as "control temperature" hereinafter) of the gas (temperature control medium in the illustrated embodiment) to be supplied in the gas chamber between the lens elements 36A and 37A from the original target temperature $T_1$ to the next target temperature $T_2$ with a predetermined time step, as shown by the broken line curve 259 in the section (a) of FIG. 38. Further, the temperature TF of the fluorite lens elements is also supplied to the temperature control device 213b. Thus, in the temperature control device 213b, the control temperature $T_{ij}$ of the temperature control medium is continuously adjusted in a servo manner so that the temperature TF of the fluorite lens elements coincides with the target temperature $T_2$. Accordingly, in actual, the operation of the step 302 is continuously carried out during the exposure. In this case, since the change in the temperature of the fluorite lens elements 36A, 37A of FIG. 33 includes a predetermined time constant, the temperature TF of the fluorite lens elements is changed with delay with respect to the control temperature $T_{ij}$, as shown by the solid line curve 258.

Thus, in a step 303 of the flow chart shown in FIG. 39, the temperature control portion of the main control device 218 measures the actual temperatures TF of the fluorite lens elements via the temperature sensors 254A, 254B and the temperature detection device 255 of FIG. 33 and reads out the target temperature Ti (here, $Ti=T_2$) and the allowable width ΔT from the common working area 260 (FIG. 40) in the memory of the main control device 218. In a next step 304 of the flow chart, the temperature control portion judges whether the temperature TF of the fluorite lens elements is included within the allowable range of the next target temperature. That is:

$$|TF-T_i|=\leqq\Delta T$$

If the temperature TF of the fluorite lens elements is included within the allowable range, the flow chart (program) goes to a step 306, where the temperature control portion sets a value of a temperature change end flag (having an initial high level "1" value) to a low level "0". Thereafter, the program is returned to the step 303, thereby effecting the sampling of the temperature TF of the fluorite lens elements. On the other hand, in the step 304, if the temperature TF of the fluorite lens elements is not included within the allowable range, in a next step 305, the temperature control portion of the main control device 218 sets the value of the temperature change end flag to the high level "1", and then, the program is returned to the step 303. As a result, in the example shown in the section (a) of FIG. 38, at a time point $t_2$, the temperature TF of the fluorite lens elements reaches the allowable range of the target temperature $T_2$, thereby setting the temperature change end flag of FIG. 40 to the low level "0".

In parallel with the operations in the steps 301 to 306 of the flow chart in FIG. 39, the exposure operation is performed by an exposure control portion of the main control device 218, as shown in steps 311 to 316 of the flow chart. That is to say, after replacement of wafer and alignment of the new wafer are executed in a step 311, in a step 312, the exposure control portion of the main control device 218 starts the count of an internal time. Thereafter, in a step 313, the exposure control portion judges whether the value of the temperature change end flag in the common working area 260 of the main control device 218 has the low level "0" (i.e., whether the temperature of the fluorite lens elements is included within the allowable range of the target temperature). If the temperature change end flag is in the low level "0", in a next step 314, the exposure is performed. Then, the program is returned to the step 311.

On the other hand, in the step 313, if the temperature change end flag is in the high level "2", in a step 315, the exposure control portion of the main control device 218 judges whether the count time of the previously started timer exceeds a predetermined allowable time (time out). If the time out does not occur, the program is returned to the step 313, where the value of the temperature change end flag is checked. On the other hand, in the step 315, if the time out occurs, the program goes to a step 316, where the exposure control portion performs error treatment in which alarm information (indicating the fact that the temperature of the fluorite lens elements does not reach the target temperature) is transmitted to an operator.

As mentioned above, according to the illustrated embodiment, since the temperature control portion and the exposure control portion of the main control device 218 are operated in parallel through the data stored in the common working area 260 in the memory of the main control device 218, the setting of the temperature of the fluorite lens elements of the projection optical system PL9 to the target temperature and the exposure after the temperature was included within the allowable range of the target temperature can be performed smoothly.

From the actual numerical analysis of a model of the projection optical system PL9, it was found that the non-linear magnification error can be corrected by about ±20 nm at the most by changing the temperature of the single fluorite lens elements by ±1° C. Since the maximum resolving power of the temperature control of the fluorite lens element is about 0.01° C., when the non-linear magnification error is corrected by changing the temperature of the fluorite lens element by 1° C., the resolving power of the correction of the non-linear magnification error becomes about ±0.2 nm (=±20/100 [nm]).

Similarly, it was found that the curvature of field of about ±0.2 μm can be corrected by changing the temperature of the single fluorite lens element by ±1° C. Further, since the maximum resolving power of the temperature control of the fluorite lens element is about 0.01° C., when the curvature of field is corrected by changing the temperature of the fluorite lens element by 1° C., the resolving power of the correction of the curvature of field becomes about ±2 nm (=±0.2/100 [μm]). Accordingly, the allowable width ΔT (refer to the section (a) of FIG. 38) of the temperature of the fluorite lens element may be set depending on the actually required correction accuracy of the non-linear magnification error and the curvature of field.

In the example shown in the section (a) of FIG. 38, while an example that the control temperature $T_{ij}$ of the temperature control medium (gas) is monotonously changed from the original target temperature $T_1$ to the next target temperature $T_2$ is explained, in order to bring the temperature TF of the fluorite lens element to the next target temperature $T_2$, as shown by the broken line curve 259A in the section (b) of FIG. 38, the control temperature $T_{ij}$ of the temperature control medium may be overshot over the next target temperature $T_2$ once. Doing so, as shown by the sold line curve 258A, the temperature TF of the fluorite lens element reaches a time point $t_3$ which is earlier than the time point in case of the section (a) of FIG. 38, thereby improving through-put (the number of wafers to be treated per unit time) of the exposure process.

On the other hand, if the next target temperature is smaller than the original target temperature, the control temperature may be undershot below the next target temperature.

In the above-mentioned example, while the temperature TF of the fluorite lens element was actually measured, for example, in the section (a) of FIG. 38, the time duration of time period ($t_2-t_3$) during which the temperature TF of the fluorite lens element is changed from the original target temperature $T_1$ to the allowable range of the next target temperature $T_2$ can be previously be determined by tests as a function of a control width of temperature ($T_2-T_1$). In this case, the function of the control width of temperature ($T_2-T_1$) is stored in the memory of the main control device 218 of FIG. 33, and, in the temperature control portion of the main control device 218, when the target temperature is changed, it may be judged that the temperature of the fluorite lens element is included within the allowable range of the changed target temperature after a time period determined by the function and a predetermined offset time period are elapsed. According to this method, although the exposure time is increased by a time period corresponding to the predetermined offset time period, since the temperature sensors can be omitted, the entire apparatus can be simplified.

Figure 34:
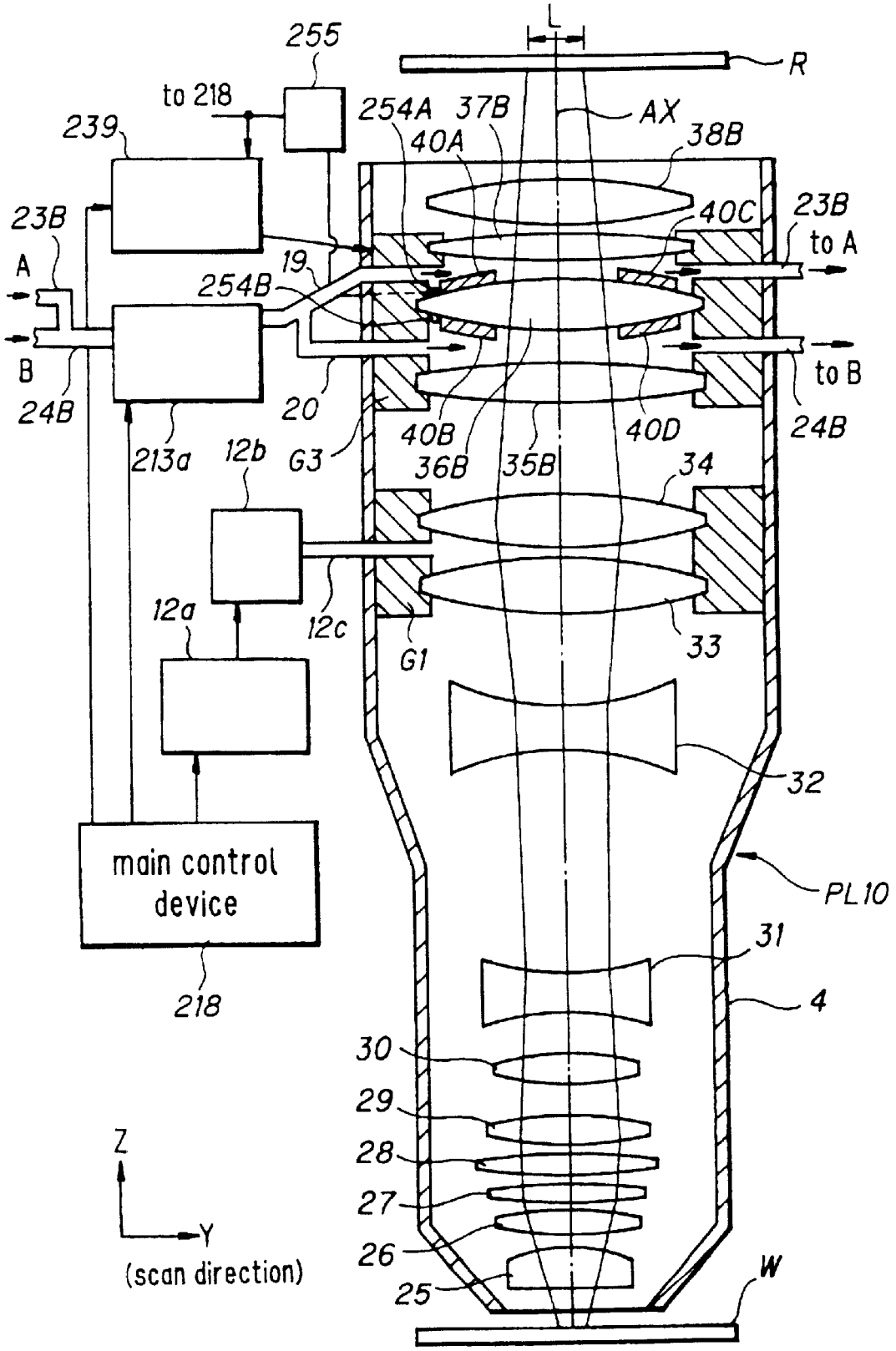
FIG. 34 is an explanatory view showing a projection optical system and an imaging characteristic correcting mechanism used in a tenth embodiment of the present invention.

Next, a tenth embodiment of the present invention will be explained with reference to FIG. 34. Since FIG. 34 corresponds to FIG. 19, the elements corresponding to those shown in FIG. 19 are designated by the same reference numerals and explanation thereof will be omitted. A projection optical system according to this embodiment is suitable to be applied to both projection exposure apparatuses of step-and-repeat type and step-and-scan type.

As is in the sixth embodiment, also in this tenth embodiment, the temperature control elements 40A–40D may be heaters. Peltier effect elements and the like. The Peltier effect elements may be used to effect the heating or the heat absorbing. The temperature sensors 254A, 254B are secured to one end of the lens element 36B in the Y direction and are connected to the temperature detection device 255. The temperature detected by the temperature detection device 255 is supplied to a temperature control device 239. The temperature control device 239 controls the heating or the heat absorbing of the temperature control elements 40A–40D so that the detected temperature becomes the set temperature instructed by the main control device 218. Thus, in this embodiment, the temperature control elements 40A–40D act as temperature control media.

Figure 35:
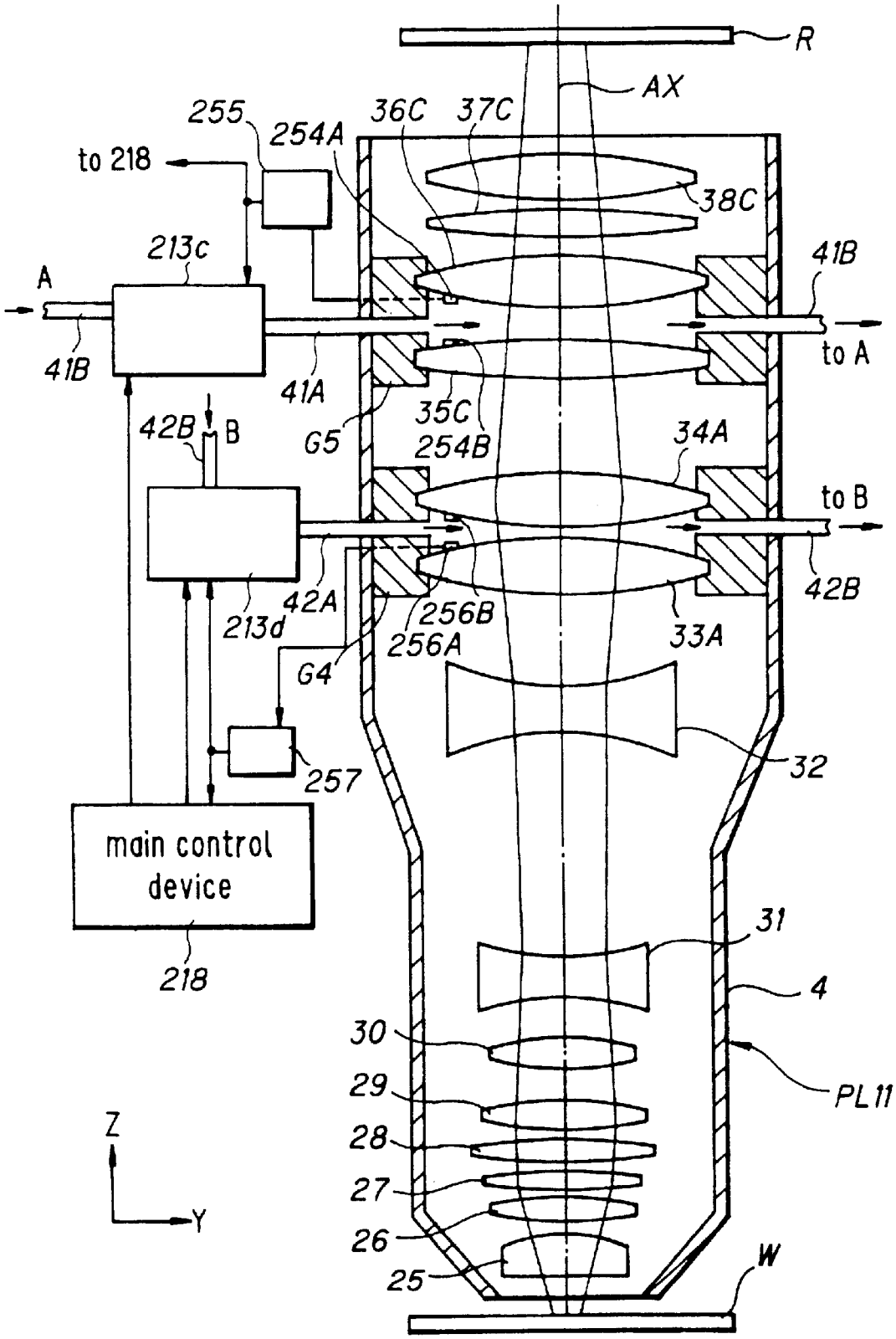
FIG. 35 is an explanatory view showing a projection optical system and an imaging characteristic correcting mechanism used in an eleventh embodiment of the present invention.

Next, an eleventh embodiment of the present invention will be explained with reference to FIG. 35. Since FIG. 35 corresponds to FIG. 20, the elements corresponding to those shown in FIG. 20 are designated by the same reference numerals and explanation thereof will be omitted. A projection optical system according to this embodiment is suitable to be applied to both projection exposure apparatuses of step-and-repeat type and step-and-scan type.

In this embodiment, the temperature sensors 254A, 254B are mounted on opposed ends of the lens elements 36C, 35C at areas through which the exposure illumination light is not passed, and the temperature sensors 254A, 254B are connected to the temperature control device 255 so that the temperatures of the lens elements 36C, 35C detected by the temperature control device 255 are supplied to the lens temperature control device 213c and the main control device 218. Similarly, temperature sensors 256A, 256B are mounted on opposed ends of the lens elements 33A, 34A at areas through which the exposure illumination light is not passed, and the temperature sensors 256A, 256B are connected to a temperature control device 257 so that the temperatures of the lens elements 33A, 34A detected by the temperature control device 257 are supplied to the lens temperature control device 213d and the main control device 218. On the basis of the command from the main control device 218, the lens temperature control devices 213c, 213d set the temperatures of the lens elements 36C, 33A to their target temperatures, respectively.

In this embodiment, when the imaging characteristics (non-linear magnification error and curvature of field) of the projected image of a projection optical system PL11 are to be corrected, the temperature of the lens element 36C is controlled by means of the temperature control device 213c, and the linear magnification error generated upon the correction of the imaging characteristics is canceled by controlling the temperature of the lens element 33A by means of the temperature control device 213d. When the imaging characteristic due to the change in atmospheric pressure differs from the imaging characteristic due to the change in temperature during the illumination of the exposure illumination light onto the projection optical system, so that the third or higher order magnification error is generated greatly, this method can also be utilized to control the imaging characteristics independently by using the corresponding two fluorite lens element. That is to say, for example, the non-linear magnification error or the curvature of field due to the change in atmospheric pressure may be corrected by using the upper fluorite lens element 36C, and the non-linear magnification error or the curvature of field due to the change in temperature during the illumination of the exposure illumination light may be corrected by using the lower fluorite lens element 33A.

Figure 36:
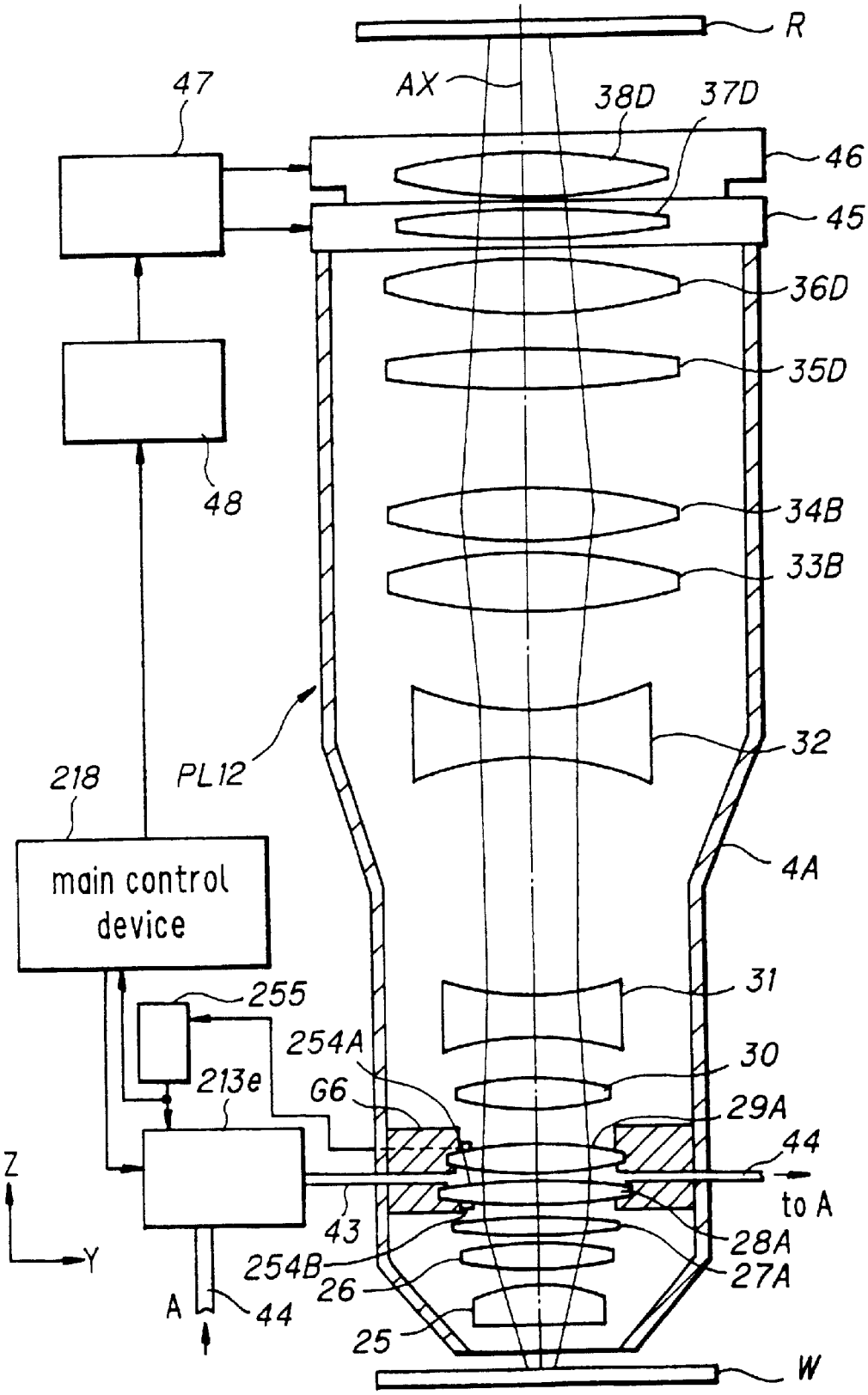
FIG. 36 is an explanatory view showing a projection optical system and an imaging characteristic correcting mechanism used in a twelfth embodiment of the present invention.

Next, an twelfth embodiment of the present invention will be explained with reference to FIG. 36. Since FIG. 36 corresponds to FIG. 21, the elements corresponding to those shown in FIG. 21 are designated by the same reference numerals and explanation thereof will be omitted. A projection optical system according to this embodiment is suitable to be applied to both projection exposure apparatuses of step-and-repeat type and step-and-scan type.

Also in this embodiment, the lens elements 28A, 29A are made of fluorite and the other lens elements are made of quartz. Gas having a variable temperature is supplied from the temperature control device 213e, through the piping 43, to the gas changer enclosed by the lens elements 28A, 29A and the lens frame G6, and the gas circulating the gas chamber is returned to the temperature control device 213e through the piping 44. The temperature sensors 254A, 254B are mounted on opposed ends of the lens elements 28A, 29A at areas through which the exposure illumination light is not passed, and the temperature sensors 254A, 254B are connected to the temperature control device 255 so that the temperatures of the lens elements 28A, 29A detected by the temperature control device 255 are supplied to the lens temperature control device 231e and the main control device 218.

On the basis of the command from the main control device 218, the lens temperature control device 213e sets the temperature of the lens elements 28A, 29A to its target temperature. The supports 45 and 46 can be shifted in a direction parallel to an optical axis AX of a projection optical system PL12 and can be inclined by desired angles, independently, by means of the drive device 47.

Also in this embodiment, the non-linear magnification error and/or the curvature of field of the projected image of the projection optical system PL12 is corrected by controlling the temperature of the fluorite lens elements 28A, 29A by means of the temperature control device 213e, and the linear magnification error generated upon the correction of the non-linear magnification error and/or the curvature of field is corrected by inclining or lifting/lowering the lens elements 37D, 38D via the supports 45, 46. Since not only the magnification error but also the defocus of the focusing position and the trapezoidal distortion can be corrected by combination of the movements of two supports 45, 46, almost all of other aberrations generated during the correction of the non-linear magnification error and/or the curvature of field can be canceled by properly controlling the temperature control device 213e and the drive device 47.

According to the ninth to twelfth embodiments of the present invention, the temperature(s) of the predetermined optical members are controlled, the imaging characteristics of the projection optical system (particularly, non-linear magnification error and the non-linear error such as the curvature of field) which are worsened by the change in the environmental condition such as the atmospheric pressure around the projection optical system, the absorption of the exposure illumination light and the change in the illumination condition can be corrected. Further, since the exposure is started after the temperature of the optical member to be controlled falls in the predetermined allowable range of the target temperature, the imaging characteristic of the projection optical system is maintained in the desired condition during the exposure, thereby always maintaining the imaging characteristic of the projected image projected on the photosensitive substrate in the good condition.

The aligning accuracy of the projected images can be improved by correcting the non-linear magnification error, for example, and the depth of focus of the entire projected image can be widened by correcting the curvature of field.

Further, when the imaging characteristics to be controlled are the non-linear magnification error (high order magnification error) and the curvature of field, and one of the non-linear magnification error and the curvature of field is greater than the other, the temperature of the optical elements (lens elements) effective to the correction of the imaging characteristic having the greater error may be controlled. In projection optical systems in which the non-linear magnification error and the curvature of field are generated simultaneously, the non-linear magnification error and the curvature of field may be corrected independently by controlling the temperatures of the optical members independently, or, the non-linear magnification error and the curvature of field may be corrected simultaneously by controlling the temperature of the optical member effective to correct both of the imaging characteristics.

In the case where the temperature sensors for measuring the temperatures of the optical members to be controlled by the temperature control devices are provided and the exposure control means compares the temperatures measured by the temperature sensors and the target temperatures and judges whether the exposure is to be started, the exposure can be started quickly on the basis of the actually measured temperatures of the optical members to be controlled, and the imaging characteristic is always maintained in the desired condition during the exposure.

On the other hand, in the case where the memory means for storing the time period during which the temperature of the optical member to be controlled by the temperature control means reaches the predetermined temperature is provided, when the exposure control means starts the exposure regarding the photosensitive substrate after a time period corresponding to the time period stored in the memory means is elapsed, since the temperature sensors can be omitted, the start timing of the exposure can be determined by a simple mechanism.

In the case where the temperature of the optical member to be controlled is set to the target temperature by the temperature control means, when an intermediate set temperature (control temperature) obtained by the temperature control means is overshot or undershot with respect to the target temperature, the temperature of the optical member can be set to the target temperature more quickly.

Next, embodiments of the present invention in which the temperature control of the lens elements is not utilized to correct the non-linear error will be explained with reference to FIGS. 41 to 45. In the following thirteenth to sixteenth embodiments, combination of glass materials having opposite effects for contributing to the change in the non-linear error is used.

Explaining more specifically, the relations shown in FIG. 7 can be applied to a relation of a quartz lens element and a fluorite lens element. For example, when two kinds of glass materials, one of which (first glass material) is made of quartz and the other of which (second glass material) is made of fluorite are used and almost all of the lens elements in a projection optical system are formed from the first glass material, regarding the distortion of the imaging characteristics of the projection optical system, the distortion generated by the lens elements made of the first glass material becomes the non-linear magnification error as shown by the curve 61 in the section (a) of FIG. 7. On the other hand, the distortion generated by the lens elements made of the second glass material has the tendency that, as shown by the curve 62A in the section (b) of FIG. 7, the offset of the linear magnification error (shown by the straight line 62B) is added to the non-linear magnification error having the property opposite to that of the curve 61. Thus, by combining the lens elements made of two kinds of glass materials to cancel the non-linear magnification error (curve 61) by the non-linear magnification error (curve 62A), the non-linear magnification error of the projection optical system can be reduced. Accordingly, by such combination, it is possible to provide a projection optical system in which the non-linear magnification error is almost not generated by the change in the environmental condition and/or the absorption of the illumination light.

However, if such combination leaves as it is, the linear magnification error exists. Thus, by reducing such residual linear magnification error by using a linear magnification control means such as a gas pressure control device and a lens drive mechanism, the distortion of the projection optical system can be removed substantially completely.

Further, the relations shown in FIG. 22 can be applied to the relation of the quartz lens element and the fluorite lens element.

The distribution of the focus positions $Z_F$ associated with the lens elements made of the first glass material and depending upon the image height H under a certain condition causes the downwardly-convex curvature of field, as shown by the curve 61A in the section (a) of FIG. 22. On the other hand, the distribution of the focus positions associated with the lens elements made of the second glass material has the tendency that, as shown by the curve 62C in the section (b) of FIG. 22, the offset common to the all of the image heights H is added to the upwardly-convex curvature of field having a property opposite to that of the curve 61A.

Thus, by combining the lens elements made of two kinds of glass materials and by considering the temperature of the lens frame, the temperature of the lens barrel, and the temperature difference between the lens elements to cancel the curvature of field (curve 61A) by the curvature of field (62C), the curvature of field (non-linear defocus) of the projection optical system can be reduced. In this way, it is possible to provide a projection optical system in which the curvature of field is almost not generated by the change in the environmental condition and/or the absorption of the illumination light.

If such combination leaves as it is, the predetermined offset is remaining in the distribution of the focus positions of the projected image, as shown by the straight line 63A in the section (c) of FIG. 22. However, such offset of the focus positions can be removed substantially completely, for example, by adjusting the height of the substrate by means of a focusing position control means such as a stage for controlling the height of the substrate.

Figure 41:
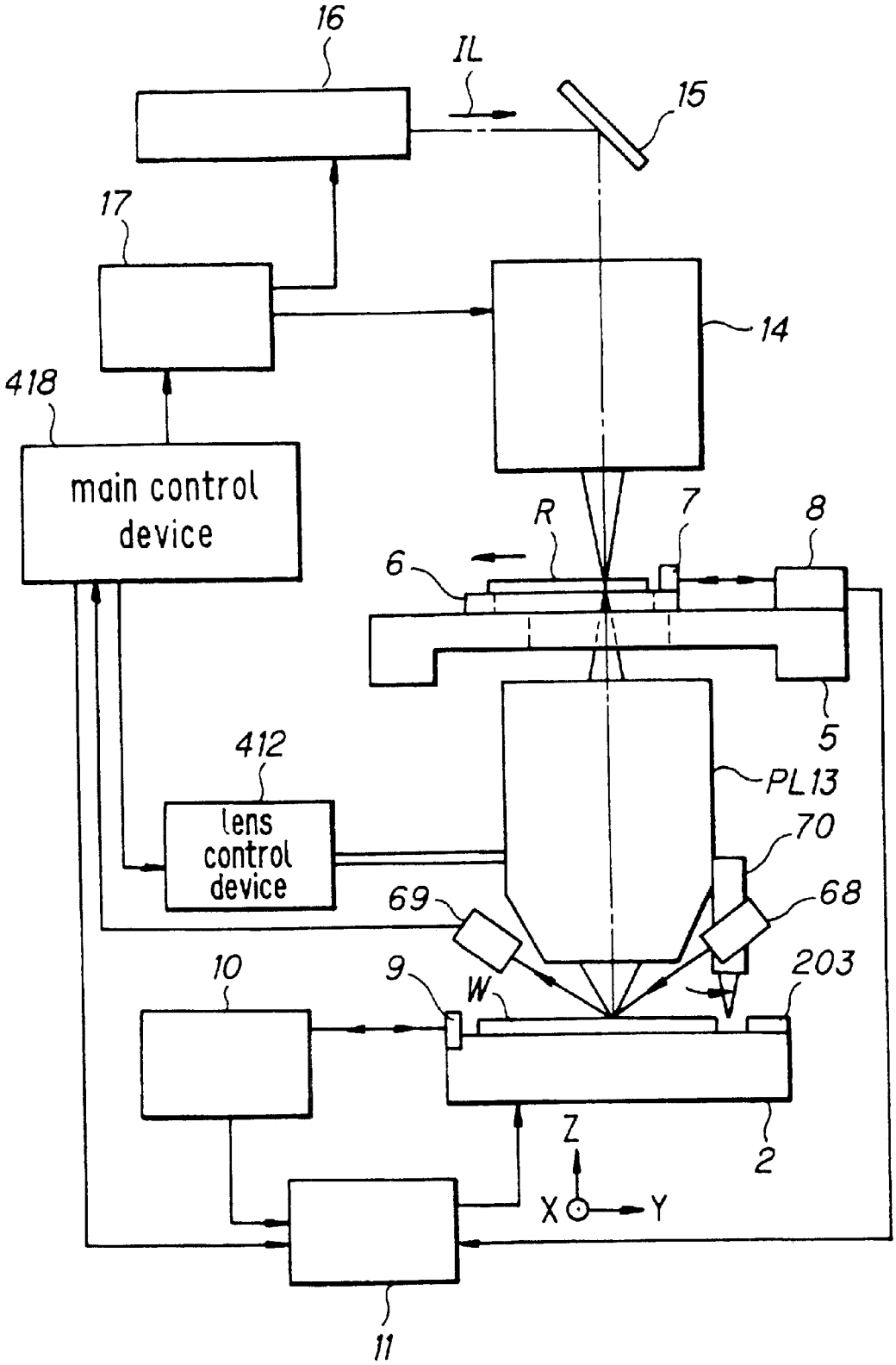
FIG. 41 is a constructural view showing a projection exposure apparatus according to a thirteenth embodiment the present invention.

FIG. 41 shows a construction common to the thirteenth to sixteenth embodiments, which corresponds to the construction shown in FIG. 32. Thus, the elements corresponding to those shown in FIG. 32 are designated by the same reference numerals and explanation thereof will be omitted.

In FIG. 41, among a plurality of lens elements constituting a projection optical system PL13, a large number of lens elements are made of quartz, and the remaining small number of lens elements are made of fluorite. There is provided a lens control device 412 for controlling a gas pressure in a predetermined gas chamber between a predetermined pair of fluorite lens elements. When the imaging characteristics such as the magnification of the projection optical system PL13, the focus position (best focus position) at a center of an average plane of the image plane and the curvature of field are changed in accordance with the change in the environmental condition such as atmospheric pressure and temperature or the history of the illumination amount of the exposure illumination light onto the projection optical system PL13, the imaging characteristics are corrected by the lens control device 412 on the basis of the command from a main control device 418. As the lens control device 412, a lens position control device for controlling the position (along the optical axis AX direction) and inclination of the predetermined fluorite lens element or a reticle position control device for controlling the direction (along the optical axis AX direction) and inclination of the reticle R may be used besides the pressure control device.

In the illustrated embodiment, when the curvature of field of the projection optical system PL13 is canceled by using the lens elements formed from two different glass materials, the offset sometimes occurs in the focus position at the center of the average plane of the image plane. If such offset is generated, the focus position of the wafer W is corrected by an amount corresponding to the offset amount by driving the wafer stage 2, thereby preventing the defocus from being generated between the image plane and the surface of the wafer W.

Next, the projection optical system PL13 according to the thirteenth embodiment will be explained with reference to FIG. 42 and the like.

Figure 42:
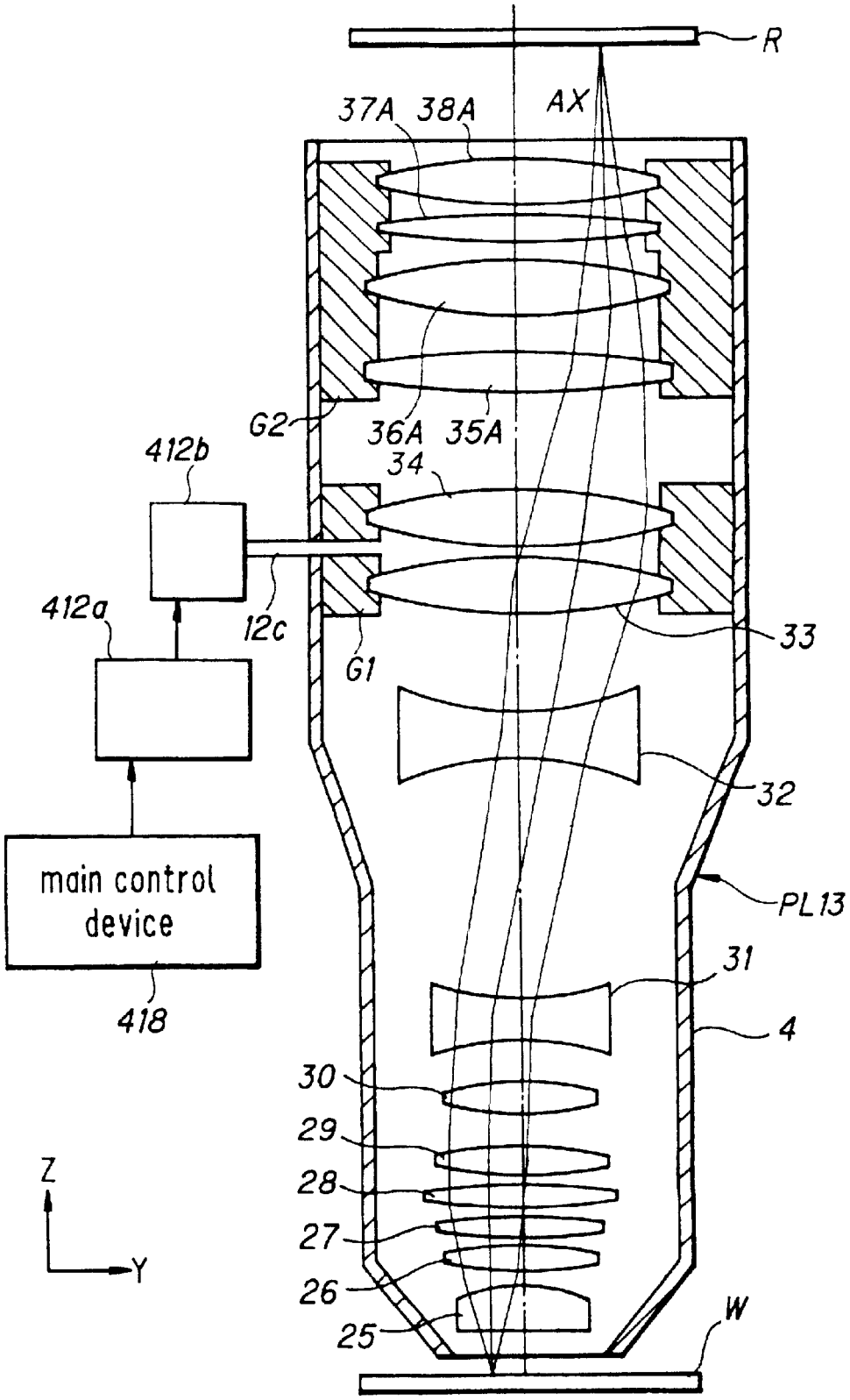
FIG. 42 is an explanatory view showing a projection optical system and an imaging characteristic correcting mechanism used in the thirteenth embodiment.

Since FIG. 42 corresponds to FIG. 33, the elements corresponding to those shown in FIG. 33 are designated by the same reference numerals and explanation thereof will be omitted. As can be seen from FIG. 42, the kinds of the lens elements shown in FIG. 42 are the same as those shown in FIG. 33.

Now, the non-linear magnification error (high order magnification error) and the curvature of field of the projection optical system PL13 will be described. In this example, a case where one of the non-linear magnification error and the curvature of field is canceled by using the fluorite lens elements 36A, 37A in the projection optical system PL13 will be explained. This deals with the case where one of the non-linear magnification error and the curvature of field is greatly worsened in accordance with the applied condition of the projection optical system PL13. Thus, if both of the non-linear magnification error and the curvature of field are greatly worsened, one feasible approach may be, for example, that lens elements effective to correct the non-linear magnification error and the curvature of field, respectively, are made from fluorite.

The glass materials from which the lens elements of the projection optical system PL13 are formed are quartz and fluorite. As the temperature is increased, the quartz is almost not expanded due to its small expansion coefficient, but the index of refraction is increased. Accordingly, as shown in the section (b) of FIG. 6, in the positive quartz lens element 49B, when the temperature is increased, the image plane FB is displaced to approach to the lens element. On the other hand, as the temperature is increased, the fluorite is expanded and the index of refraction thereof is decreased. Accordingly, as shown in the section (a) of FIG. 6, in the positive fluorite lens element 49A, when the temperature is increased, the image plane FA is displaced to move away from the lens element. In other words, the quartz lens element and the fluorite lens element have opposite effects for contributing to the change in the focus position in response to the temperature change.

Now, the distortion of the imaging characteristics of the projection optical system PL13 will be explained with reference to FIGS. 7 and 8. In FIGS. 7 and 8, the ordinate indicates the image height H, and the abscissa indicates the magnification $\beta$ of the projection optical system PL13 at that image height H. And, the magnification on the optical axis (H=0) is represented by the design magnification $\beta_0$. In this case, under a certain environmental condition, after the exposure is continued by a certain time period, the distortion caused by the lens elements made of quartz in the projection optical system PL13 becomes the non-linear error (high order magnification error) in which, as the image height H is increased, the magnification $\beta$ is decreased below the design magnification once and then is monotonously increased, as shown by the curve 61 in the section (a) of FIG. 7.

To the contrary, in the illustrated embodiment, the distortion caused by the lens elements made of fluorite in the projection optical system PL13 is set to have the non-linear magnification error having a feature substantially opposite to that shown by the curve 61 in the section (a) of FIG. 7. However, even when the distortion caused by the lens elements made of fluorite is set in this way, the distortion includes the predetermined linear magnification error as offset. Accordingly, as shown by the curve 62A in the section (b) of FIG. 7, the actual distortion caused by the lens elements made of fluorite in the projection optical system PL13 has a feature obtained by adding the linear magnification error shown by the straight line 62B to the non-linear magnification error having the feature substantially opposite to that shown by the curve 61 in the section (a) of FIG. 7.

Therefore, if the imaging characteristic is not corrected by the lens control device 412 of FIG. 41, the distortion caused by the entire projection optical system PL13 has a feature that is represented by the linear magnification error in which the magnification $\beta$ is linearly increased from the design magnification as the image height H is increased, as shown by the straight line 63 in the section (c) of FIG. 7. Thus, the linear magnification error (shown by the straight line 64) which can substantially cancel the residual magnification error represented by the straight line 63 in the section (c) of FIG. 7 is applied to the projection optical system PL13 by means of the lens control device 412 of FIG. 41. As a result, the distortion of the projection optical system PL13 according to the illustrated embodiment has a feature as shown by the curve 65 in FIG. 8 in which the non-linear magnification error and the linear magnification error are both eliminated.

Next, the curvature of field of the imaging characteristics of the projection optical system PL13 will be explained with reference to FIGS. 22 and 23. In FIGS. 22 and 23, the abscissa indicates the image height H and the ordinate indicates the focus positions $Z_F$ of the image plane of the projection optical system PL13 at various image heights H. The focus position on the optical axis (H=0) is shown as a design focus position. In this case, under a certain condition, after the exposure is continued for a certain time period, the image plane obtained by the quartz lens elements of the projection optical system PL13 has downwardly-convex curvature of field as shown by the curve 61A in the section (a) of FIG. 22.

To the contrary, in the illustrated embodiment, the curvature of field caused by the fluorite lens elements 36A, 37A of the projection optical system PL13 is set to have curvature of field having a property substantially opposite to that of the curve 61A shown in the section (a) of FIG. 22. However, even when the curvature of field generated by the fluorite lens elements is set in this way, the offset which is uniform through the entire range of the image height H is added to the focus positions of the image plane. Accordingly, the distribution of the focus positions of the image plane obtained by the fluorite lens elements of the projection optical system PL13 has a feature in which the curvature of field substantially opposite to the curvature of the curve 61A shown in the section (a) of FIG. 22 is added to the predetermined offset, as shown by the curve 61C in the section (b) of FIG. 22.

Thus, as shown by the straight line 63A in the section (c) of FIG. 22, the focus positions $Z_F$ of the image plane of the entire projection optical system PL13 become substantially constant through the entire range of the image height H, thereby generating the defocus between the image plane and the surface of the wafer W. To cancel the defocus, the focus position on the surface of the wafer W is corrected by an amount corresponding to the defocus by driving the wafer stage 2 in the Z direction with respect to the projection optical system PL13 by means of the drive mechanism. This means that the offset of the focus position as shown by the straight line 64A in the section (c) of FIG. 22 is added to the image plane of the projection optical system PL13. As a result, the distribution of the focus positions $Z_F$ of the image plane of the projection optical system PL13 according to the illustrated embodiment with respect to the surface of the wafer W becomes to that as shown by the curve 65A in FIG. 23, thereby eliminating the curvature of field and the predetermined defocus. Accordingly, the degree of the depth of focus of the entire image plane is made larger in comparison with the conventional techniques, with the result that the projected image can be projected with a higher resolving power as a whole. Even if the environmental condition is changed to some extent, since the curve 61A shown in the section (a) of FIG. 22 and the curve 62C shown in the section (b) of FIG. 22 are changed in the substantially opposite directions, the great curvature of field does not appear.

By canceling the curvature of field by the fluorite lens elements 36A, 37A, the linear magnification error of the image plane (error in which the magnification is changed in proportion to the image height) is often worsened. If such linear magnification error is generated, a linear magnification error which can substantially cancel the generated linear magnification error is added to the image plane by the lens control device 412 of FIG. 41. As a result, the imaging characteristic of the projection optical system PL13 according to the illustrated embodiment has a good feature having no curvature of field and no distortion.

The imaging characteristic is changed, besides the change in environmental conditions, such as atmospheric pressure, by the illumination energy of the exposure illumination light passing through the projection optical system. The imaging characteristic is also changed when the illumination condition of the illumination optical system 14 is switched between the normal condition, the ring illumination condition, the so-called modulated-shape light source condition and the small coherent factor (σ value) condition. Thus, most standard conditions are previously determined, for example, regarding the illumination energy, atmospheric pressure and illumination condition, and, the configurations of the fluorite lens elements 36A, 37A are set so that the non-linear magnification error and the curvature of field become minimum under these standard conditions. By doing so, even if the applied condition of the projection exposure apparatus is changed to some extent, the non-linear magnification error and the curvature of field will not become excessively great.

In the illustrated embodiment, while the excimer laser light source was used as the exposure light source, regarding the illumination energy of the exposure illumination light, when i-ray (having a wavelength of 365 nm) of a mercury lamp is used, the energy of the i-ray is more absorbed than the energy of the excimer laser light in the projection optical system, and, thus, the non-linear magnification error and the curvature of field of the projection optical system are more increased than the excimer laser light. Accordingly, when the method for correcting the imaging characteristic regarding the illumination energy by the fluorite lens elements is applied to a projection exposure apparatus (steppers and the like) using the i-ray of the mercury lamp, the non-linear magnification error and the curvature of field can be reduced more effectively.

When the i-ray of the mercury lamp is used as the exposure illumination light, in place of the glass material (fluorite) associated with the excimer laser light, magnesium fluoride ($MaF_2$) or lithium fluoride ($LiF_2$) may be used as the glass material.

Figure 43:
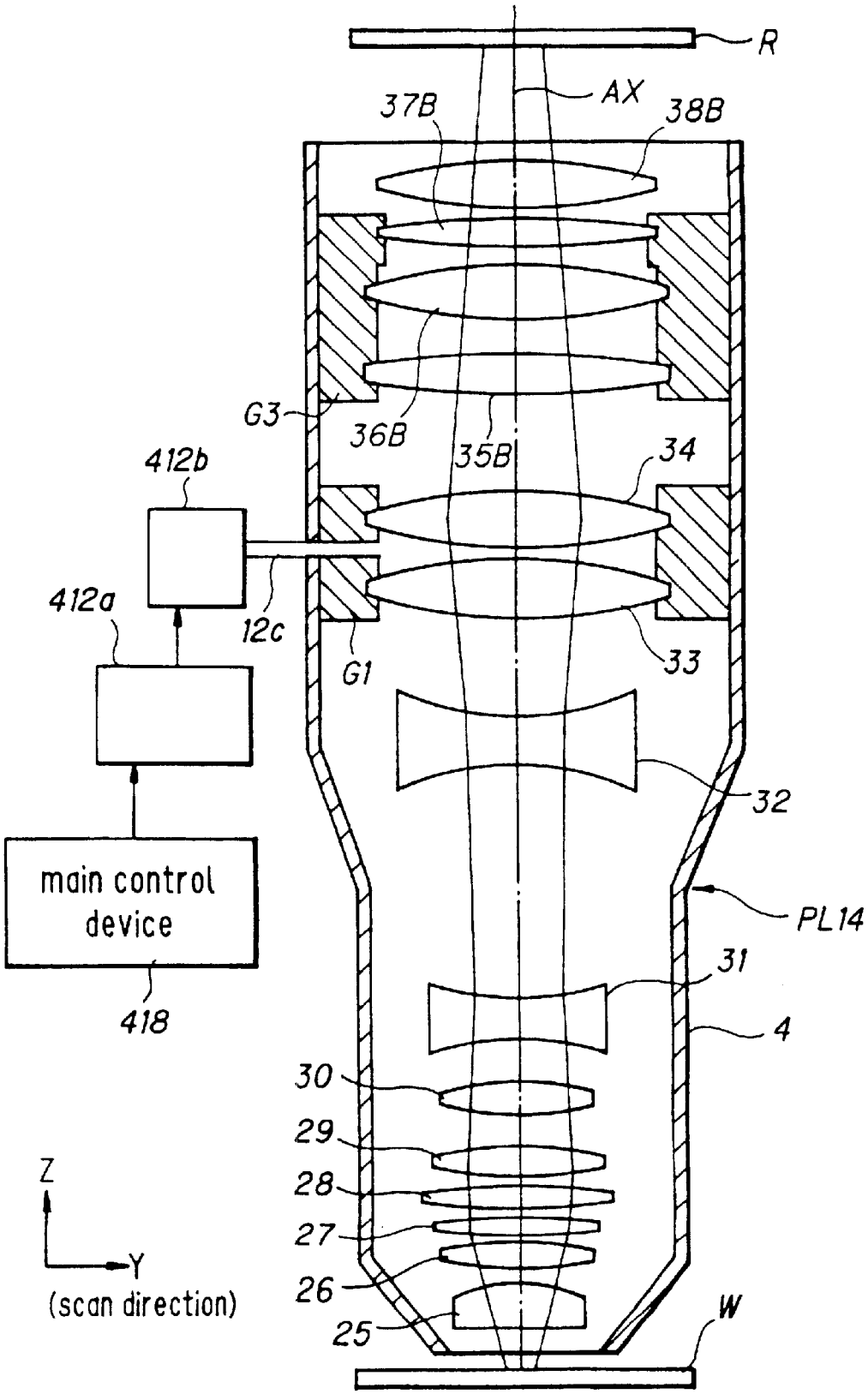
FIG. 43 is an explanatory view showing a projecting optical system and an imaging characteristic correcting mechanism used in a fourteenth embodiment of the present invention.

Next, a fourteenth embodiment of the present invention will be explained with reference to FIG. 43. Since FIG. 43 corresponds to FIG. 34, the elements corresponding to those shown in FIG. 34 are designated by the same reference numerals and explanation thereof will be omitted. A projection optical system according to this embodiment is suitable to be applied to both projection exposure apparatus of step-and-repeat type and of step-and-scan type.

In this case, the lens element 36B alone is made of fluorite and the other lens elements are made of quartz. The other constructions are the same as those of the embodiment shown in FIG. 42. According to this embodiment, since the non-linear magnification error or the curvature of field caused by the other lens elements is canceled by the single fluorite lens element 36B, the non-linear magnification error and/or the curvature of field of a projection optical system PL14 can be suppressed with a simple construction.

Figure 44:
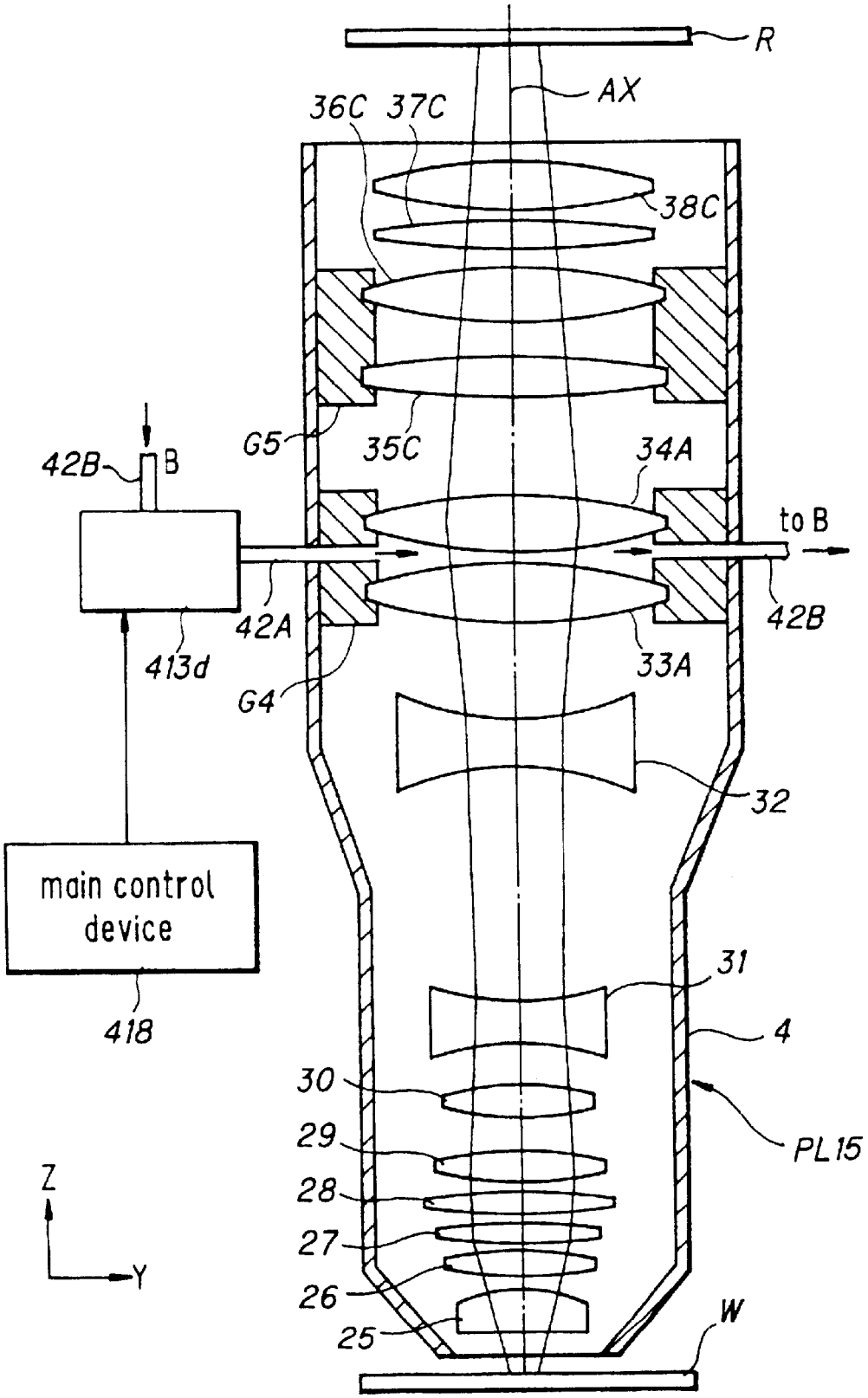
FIG. 44 is an explanatory view showing a projection optical system and an imaging characteristic correcting mechanism used in a fifteenth embodiment of the present invention.

Next, a fifteenth embodiment of the present invention will be explained with reference to FIG. 44. Since FIG. 44 corresponds to FIG. 35, the elements corresponding to those shown in FIG. 35 are designated by the same reference numerals and explanation thereof will be omitted. A projection optical system according to this embodiment is suitable to be applied to both projection exposure apparatus of step-and-repeat type and of step-and-scan type.

In this case, the lens elements 33A, 36C are made of fluorite and the other lens elements are made of quartz. In this example, the non-linear magnification error or the curvature of field is mainly corrected by the upper fluorite lens element 36C, and the feature of the linear magnification error is mainly changed by the change in temperature of the lower fluorite lens element 33A. Gas having a variable temperature is supplied from a temperature control device 413d, through the piping 42A, to the gas chamber enclosed by the lens elements 33A, 34A and the lens frame G4, and the gas circulating in the gas chamber is returned to the temperature control device 413d through the piping 42B.

And, on the basis of the command from a main control device 418, the temperature control device 413d sets the temperature of the lens element 33A to the target temperature value.

In this embodiment, when the imaging characteristics (non-linear magnification error and the curvature of field) of the projected image obtained by a projection optical system PL15 is corrected by the lens element 36C, and the linear magnification error generated upon the correction of the imaging characteristics is canceled by controlling the temperature of the lens element 33A by means of the temperature control device 413d. When the imaging characteristic due to the change in atmospheric pressure differs from the imaging characteristic due to the change in temperature during the illumination of the exposure illumination light onto the projection optical system, so that the third or higher order magnification error or the defocus is generated greatly, this method can also be utilized to control the imaging characteristics independently by using the corresponding two fluorite lens elements. That is to say, for example, the non-linear magnification error or the curvature of field due to the change in atmospheric pressure may be corrected by using the upper fluorite lens element 36C, and the non-linear magnification error or the curvature of field due to the illumination of the illumination light may be corrected by using the lower fluorite lens element 33A.

Figure 45:
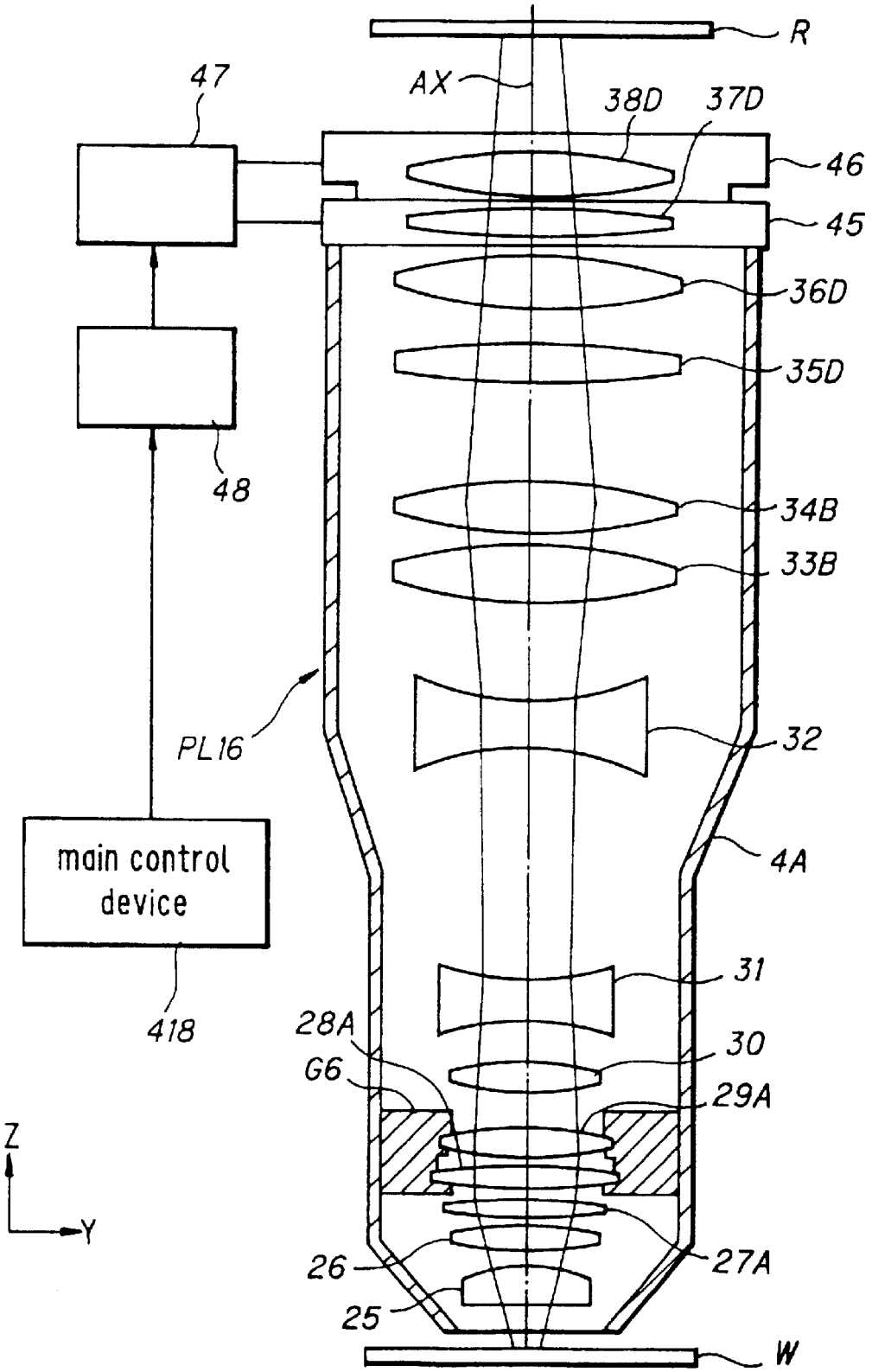
FIG. 45 is an explanatory view showing a projection optical system and an imaging characteristic correcting mechanism use din a sixteenth embodiment of the present invention.

Next, a sixteenth embodiment of the present invention will be explained with reference to FIG. 45. Since FIG. 45 corresponds to FIG. 36, the elements corresponding to those shown in FIG. 36 are designated by the same reference numerals and explanation thereof will be omitted. A projection optical system according to this embodiment is suitable to be applied to both projection exposure apparatuses of step-and-repeat type and step-and-scan type.

In this embodiment, the lens elements 28A, 29A are made of fluorite and the other lens elements are made of quartz. The supports 45, 46 can independently be shifted along a direction parallel to an optical axis AX of a projection optical system PL16 and be inclined by desired angles by means of the drive device 47. The operation of the drive device 47 is controlled by the imaging characteristic control device 48 on the basis of the command from the main control device 418.

Also in this embodiment, the non-linear magnification error and/or the curvature of field of the projected image obtained by the projection optical system PL16 are corrected by the fluorite lens elements 28A, 29A, and the linear magnification error generated by the correction of the non-linear magnification error and/or the curvature of field is corrected by inclining and/or lifting/lowering the lens elements 37D, 38D via the supports 45, 46. By combination of movements of two supports 45, 46, since not only the magnification error but also the defocus of the focusing position and the trapezoidal distortion can be corrected, almost all of other aberrations generated during the correction of the non-linear magnification error or the curvature of field can be canceled by properly controlling the drive device 47.

In the thirteenth to sixteenth embodiments of the present invention, by combining the lens elements made of two kinds of glass materials having different temperature characteristics, even if the environmental condition is changed, the generation of the focus position error and the magnification error can be prevented. However, in actual, the lens elements are supported by the lens frames G1–G6 and the lens barrel 4, 4A of the projection optical system. Therefore, regarding expansion/contraction caused by the change in the environmental condition, the apparatus must be designed in consideration of not only the expansion/contraction of the lens elements but also the expansion/contraction of the lens frames and the lens barrel. Further, when the fluorite is used as the glass material from which the lens elements are formed, it must be realized that the feature of the fluorite is particularly changed greatly in accordance with the change in the environmental condition. To the contrary, the quartz is less influenced upon the change in the environmental condition. Therefore, it is desirable that the fluorite lens elements are disposed at areas where the temperature control must be effected with high accuracy.

According to the thirteenth to sixteenth embodiments of the present invention, since two sets of lens elements made of two kinds of glass materials having different effects for contributing to the change in the focus position in dependence upon the temperature change are used, even if the change in the environmental condition such as the atmospheric pressure surrounding the projection optical system or the absorption of the exposure illumination light occurs to some extent, the imaging characteristics of the projection optical system such as the focus position error, non-linear magnification error (high order magnification error) or curvature of field are not greatly worsened.

Regarding the aberrations including not only the above-mentioned aberrations but also coma and astigmatism, even if the change in the environmental condition such as the atmospheric pressure surrounding the projection optical system or the absorption of the exposure illumination light occurs to some extent or even if the illumination condition is changed, such aberrations are not greatly worsened.

By providing a plurality of lens elements formed from one of two glass materials and by correcting different imaging characteristics for respective ones of these lens elements, various imaging characteristics can be corrected effectively.

In the case where the exposure illumination light is a laser beam emitted from the excimer laser light source and having a wavelength of 100–300 nm and two glass materials are quartz and fluorite, since the non-linear magnification error and the curvature of field of the fluorite lens element has a feature opposite to that of the non-linear magnification error and the curvature of field of the quartz lens element, the non-linear magnification error and the curvature of field of the projection optical system can be suppressed.

In this case, when a set of fluorite lens elements are disposed within the projection optical system in such a manner that the fluorite lens elements are isolated from the environmental gas with the interposition of one or more quartz lens elements, even if the temperature of the environmental gas is changed, since the fluorite lens elements are less influenced upon such temperature change, the imaging characteristics can be stabilized.

Next, a seventeenth embodiment of the present invention will be explained referring to the accompanying drawings. In this embodiment, the present invention is applied to a projection exposure apparatus of stepper type in which pattern images on a reticle are collectively transferred to shot areas on a wafer.

Figure 46:
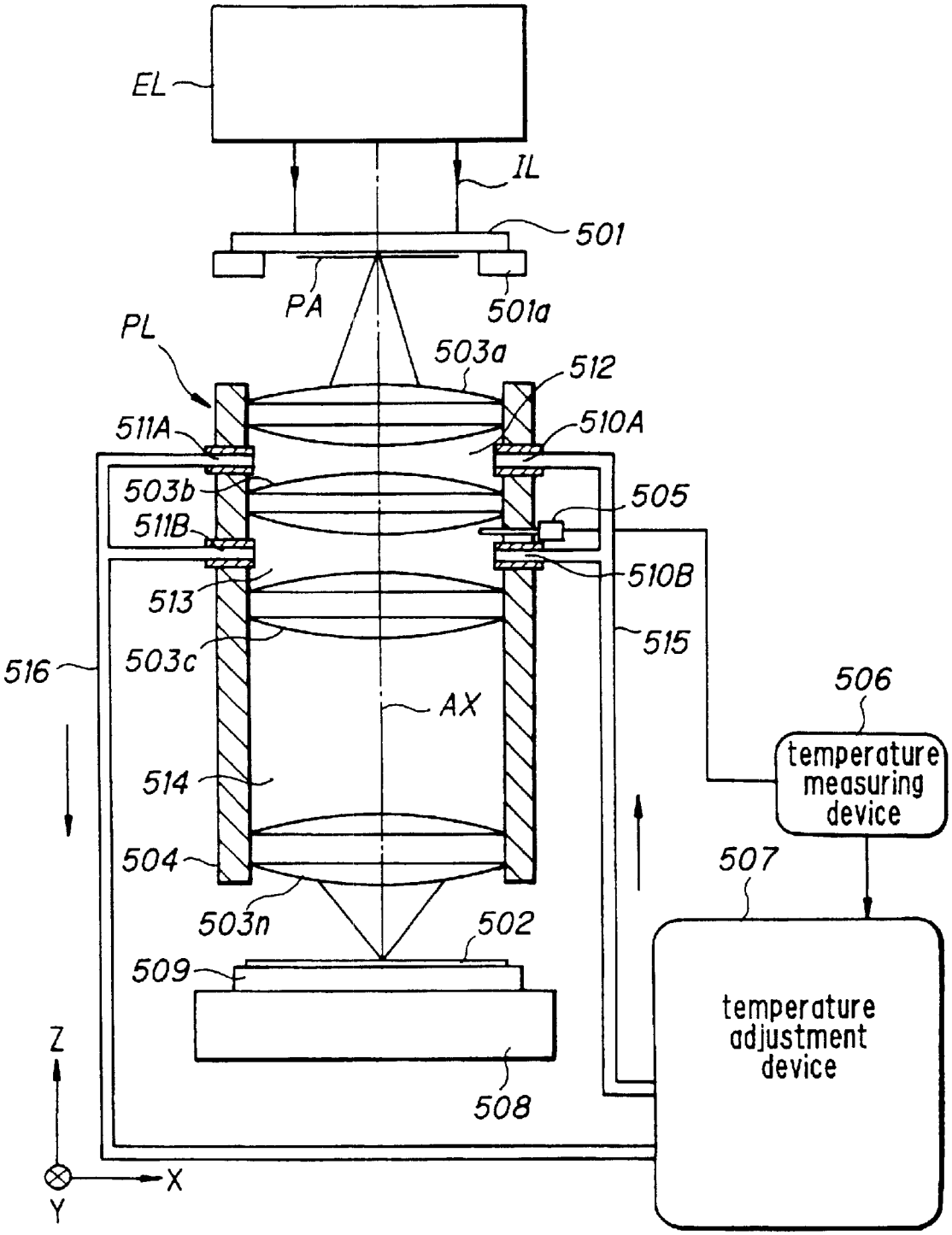
FIG. 46 is a schematic constructural view, in partial section, showing a projection exposure apparatus according to a seventeenth embodiment of the present invention.

FIG. 46 schematically shows, partially in section, a construction of the projection exposure apparatus according to this embodiment. In FIG. 46, illumination light IL emitted from an illumination optical system EL including an ArF excimer laser light source having a narrow band having an oscillation wavelength of about 193 nm and an fly-eye lens for making illumination distribution of illumination light on a reticle 501 uniform is directed onto the reticle 501, so that images of patterns formed in a pattern area PA on a lower surface of the reticle 501 are reduction-projected onto shot areas on a wafer 502 through a projection optical system PL. The illumination light IL may be KrF excimer laser light, high harmonics of copper vapor laser or YAG laser, or bright-line (g-ray, i-ray or the like) in a ultraviolet zone of a high pressure mercury lamp, as well as the ArF excimer laser light. It is assumed that a Z axis is parallel with an optical axis AX of the projection optical system PL, an X axis is parallel with the plane of FIG. 46 and a Y axis is perpendicular to the plane of FIG. 46. The details of the projection optical system PL will be described later.

The reticle 501 is rested on a reticle stage 501a via a reticle holder (not shown). The reticle stage 501a serves to position the reticle 501 in the X direction, the Y direction and a rotational direction.

The wafer 502 is vacuum-absorbed to a wafer holder 509 which is secured to a wafer stage 508. The wafer stage 508 serves to drive the wafer in the X and Y directions in a so-called step-and-repeat manner and to incline the surface of the wafer 502 in any direction and to minutely shift the wafer 502 in the optical axis AX direction (Z direction). The position of the wafer stage 508 on the X-Y plane can always be detected by a laser interferometer (not shown) with a resolving power of about 0.01 $\mu$m, for example. The positional information (or velocity information) of the wafer stage 508 is sent to a main control system (not shown). The main control system serves to control the position of the wafer stage 508 on the basis of the positional information (or velocity information).

Now, the construction of the projection optical system PL will be described. In this embodiment, among the lens elements constituting the projection optical system PL, one or more lens elements (referred to as "controllable lens elements" hereinafter) are formed from a glass material having optical features such as focal length, index of refraction and the like (which are changed by the temperature difference) which are different from those of other glass materials of the other lens elements in terms of amount of change (temperature characteristic). And, among these controllable lens elements, a lens element in which the imaging characteristics (to be controlled) of the projection optical system is changed by the change in the optical feature of that lens element is selected as a lens element to be controlled. By controlling the temperature of the lens element (to be controlled) by fluid (referred to as "control fluid" hereinafter) directly contacting with the lens element to change the optical feature (for example, index of refraction), the imaging characteristic of the projection optical system is controlled. At the same time, a material having small illumination light absorption is selected as such control fluid, thereby reducing loss of the illumination energy. The projection optical system PL according to this embodiment is constituted by quartz lens elements and fluorite lens elements, and the fluorite lens elements are used as the controllable lens elements and nitrogen gas is used as the control fluid.

In FIG. 46, a group of lens elements of the projection optical system PL comprise lens elements 503a, 503b, 503c, . . . , 503n from a reticle side, and the plurality of lens elements 503a–503n are disposed within a space 514 defined by a lens barrel 504 forming a housing of the projection optical system PL in such a manner that peripheries of the lens elements are secured to the lens barrel 504 via lens frames (not shown). Although almost all of the lens elements are made of quartz, at least the lens element 503b is made of fluorite. When the illumination light of far-ultraviolet zone is used as is in this embodiment, the glass materials from which the lens elements of the projection optical system are formed are quartz and fluorite. These glass materials have different coefficients of thermal expansion. For example, the index of refraction of the fluorite is changed more than that of the quartz, and, thus, the fluorite lens element can be used as the controllable lens element.

A closed space 512 is defined by the lens element 503b, an adjacent lens element 503a and the lens barrel 504, and a closed space 513 is defined by the lens element 503b, an adjacent lens element 503c and the lens barrel 504. A part of the lens barrel 504 defining the space 512 has an introduction port 510a for introducing the temperature-adjusted nitrogen ($N_2$) gas from an external temperature adjustment device 507 and a discharge port 511A for discharging the nitrogen gas in the space 512. As is in the space 512, a part of the lens barrel 504 defining the space 513 has an introduction port 510B for introducing the temperature-adjusted nitrogen gas from the external temperature adjustment device 507 and a discharge port 511B for discharging the nitrogen gas in the space 513. The nitrogen gas for adjusting the temperatures in the spaces 512, 513 is introduced into the spaces 512, 513 through the introduction ports 510A, 510B via a supply conduit 515 from the external temperature adjustment device 507. After the temperature in the spaces 512, 513 were adjusted, the nitrogen gas is discharged through the discharge ports 511A, 511B and is returned to the temperature adjustment device 507 through a discharge conduit 516.

A temperature sensor 505 is protruded from a side wall of the lens barrel toward the interior of the space 513, which temperature sensor 505 serves to measure the temperature in the space 513. The temperature sensor 505 is disposed so that a tip end of the sensor is situated out of the exposure area of the projection optical system PL. A measurement signal from the temperature sensor 505 is supplied to an external temperature measuring device 506, so that the temperature adjustment device 507 can compare the temperature measured by the temperature measuring device 506 with a target temperature, thereby controlling the temperature of the nitrogen gas supplied to the spaces 512, 513.

In the illustrated embodiment, while an example that the nitrogen gas is used as the control fluid supplied to the spaces 512, 513 is explained, the control fluid is not limited to the nitrogen gas, but, any gas may be used so long as the following conditions are satisfied. That is to say, the control fluid is used to adjust the temperature of the lens element (i.e., lens element 503b). Accordingly, although both gas and liquid can be used as the control fluid, it is preferable that the control fluid is selected among gases and liquids which does not cause erosion of the materials of the lens elements and the lens barrel defining the spaces 512, 513, is inert, is not harmful and is easy to handle. Further, in the illustrated embodiment, gas or liquid which is photochemically stable with respect to the exposure illumination light and has no wavelength band absorbing the illumination light is selected as the control fluid.

Figure 48A:
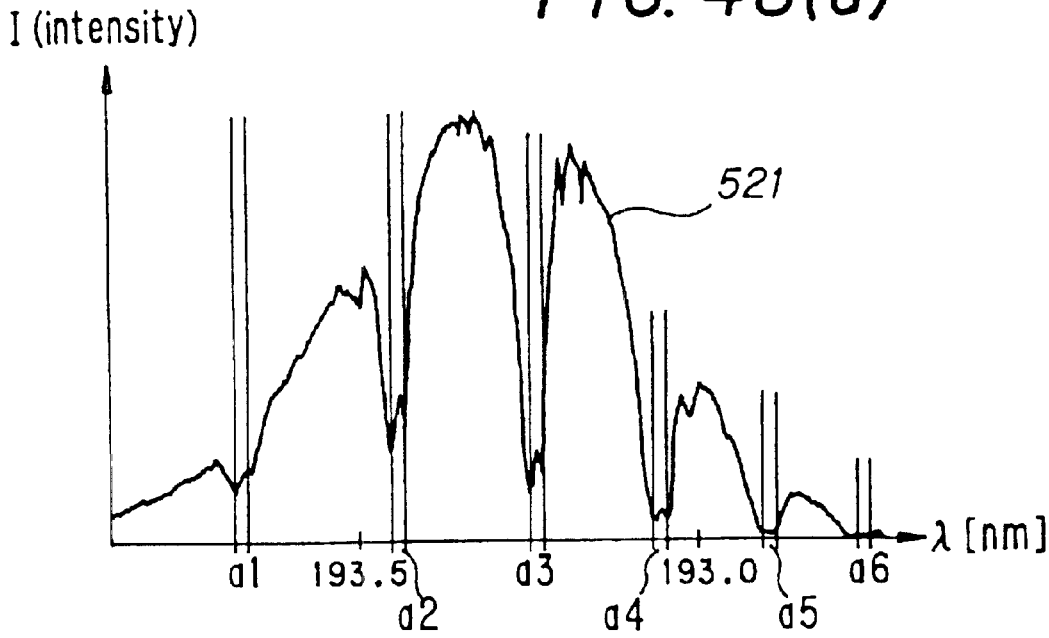
FIG. 48 is a view showing absorption spectrum of an ArF excimer laser in gas, where section (a) shows the spectrum of the ArF excimer laser in air, and section (b) shows the spectrum of the ArF excimer laser in nitrogen gas.
Figure 48B:
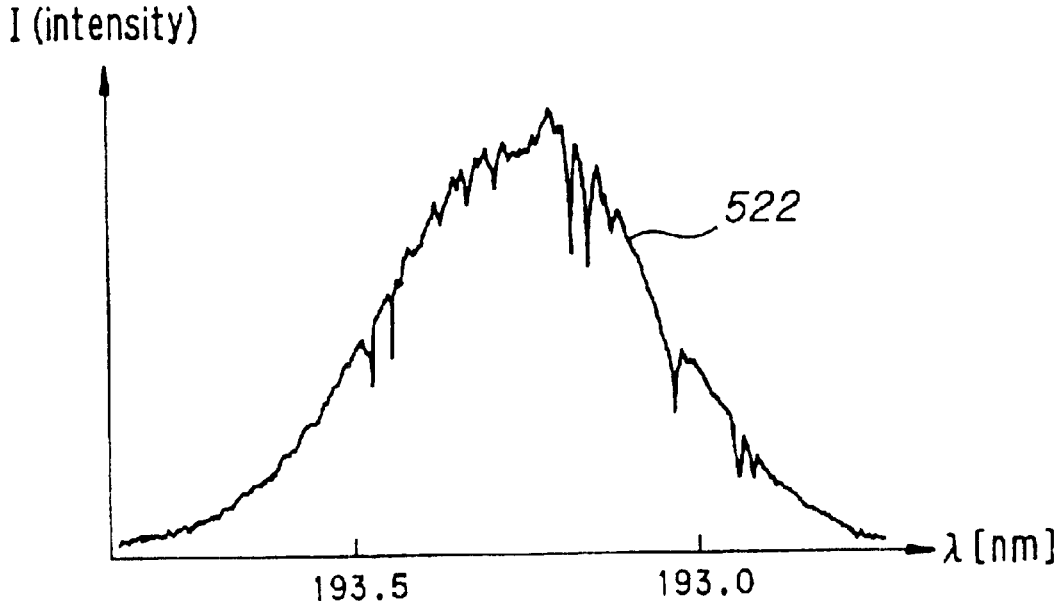

FIG. 48 shows absorbing spectrum of the ArF excimer laser light, where sections (a) and (b) of FIG. 48 show conditions of the absorbing spectrum in air and in nitrogen gas, respectively. In the sections (a) and (b) of FIG. 48, the abscissa indicates the wavelength $\lambda$ [nm] and the ordinate indicates the spectrum intensity I. As shown by the curve 521 in the section (a) of FIG. 48, the ArF excimer laser light has spectrum having a width of a wavelength from about 192.8 nm to about 193.7 nm and a center of the wavelength positioned at about 193.2 nm position. In the wavelength band, there are a plurality of narrow bands (Schumann- Runge bands) for absorbing oxygen ($O_2$). In the section (a) of FIG. 48, such oxygen absorbing bands are shown by a1 (having the longest wavelength) to a6 (having the shortest wavelength).

When the ArF excimer laser light is used, the band narrowing treatment is effected by inserting a band-pass filter in a resonator. However, when the band narrowing treatment is effected, as shown in the section (a) of FIG. 48, it is very difficult to effect the band narrowing treatment for complete elimination of the oxygen absorbing bands, and, thus, it is not avoidable that the narrowed wavelength band overlaps with the oxygen absorbing band(s). Accordingly, it is not preferable that air including oxygen is used as the control fluid.

Ozone ($O_3$) in the air has a strong absorbing band or zone called as "Hartley zone" extending from a wavelength of about 320 nm to a short wavelength zone. In particular, the ozone has a stronger absorbing force than the oxygen. Thus, by merely removing the ozone from the air, the absorbing rate of the illumination energy of the laser light is greatly reduced. Accordingly, when the air from which the ozone is removed is used as the control fluid, the absorption of the laser energy can be greatly reduced in comparison with the case where the air is used as the control fluid.

On the other hand, as shown by the curve 522 in the section (b) of FIG. 48, the nitrogen gas used in this embodiment has no wavelength band (zone) absorbing the ArF excimer laser light, thereby not absorbing the laser energy. For example, when the air is used as the control fluid, impurities such as ammonium ion ($NH_4^+$), sulfate ion ($SO_4^{2-}$) and organic silanol slightly remaining in the air (even if the air is cleaned substantially completely) are activated by the laser energy, thereby producing the fog on the surfaces of the lens elements. However, when the nitrogen gas is used, since the nitrogen gas does not include such impurities and is inert, the fog is not produced on the surfaces of the lens elements, and, thus, the lens elements are maintained in a clean condition. The nitrogen gas can be easily handled, is inert, and particularly has good stability. Thus, the nitrogen gas can be used as the control fluid for almost all of kinds of illumination lights. Incidentally, other than the nitrogen gas and the air from which the ozone is removed, various gas such as carbon dioxide ($CO_2$) can be used as the control fluid. For example, since the carbon dioxide has absorbing bands near the wavelengths of 190 nm and 254 nm, when the ArF excimer laser light (having a wavelength of 193 nm) and the KrF excimer laser light (having a wavelength of 248 nm) are used, the carbon dioxide is not suitable; whereas, the g-ray (having a wavelength of 436 nm) and i-ray (having a wavelength of 365 nm) of the mercury lamp are used as the illumination light, the carbon dioxide can be used as the control fluid.

Now, an operation of the projection exposure apparatus having the above-mentioned construction will be described.

First of all, a relation between the temperature T and the index R of refraction of the lens element to be controlled is previously determined, and the determined relation is stored as a function having the index R of refraction as the variable. Now, the determined function for representing the temperature T is referred to as f(R). Further, a relation between a change amount ΔR of the index of refraction of the lens element 503b and a change amount ΔM of the imaging characteristics of the projection optical system such as magnification, distortion and the like (magnification, in this embodiment) is previously determined, and the determined relation is stored as a function having the change amount ΔM of the magnification as the variable. Now, the function for representing the determined change amount ΔR of the index of refraction is referred to as g(ΔM). Then, a relation between a change amount of environmental data such as atmospheric pressure, humidity and atmospheric temperature and a changed amount of illumination amount of the illumination light during the exposure, and a change amount of the imaging characteristic of the projection optical system PL is checked. When there is provided a measuring means for measuring the imaging characteristic of the projection optical system PL for a short time, the changed amount the imaging characteristic of the projection optical system PL may be measured by using such a measuring means.

Next, a method for correcting the imaging characteristic of the projection optical system PL during the actual exposure will be explained. The present imaging characteristic of the projection optical system PL is calculated on the basis of the environmental data and the illumination amount of the illumination light. Then, a difference between the calculated imaging characteristic and the design imaging characteristic is determined. The target temperature of the lens element 503b is determined to cancel such difference. In this case, the change amount ΔR of the index of refraction of the lens element 503b corresponding to the change amount of the imaging characteristic of the projection optical system PL is determined on the basis of the previously determined function g (ΔM), and then, the target temperature of the lens element 503b is determined on the basis of the function f(R) and the change amount ΔR of the index of refraction.

Then, the temperature-adjusted nitrogen gas is supplied from the temperature adjustment device 507 of FIG. 46 and is circulated through the spaces 512, 513. In this case, the temperature and flow rate of the nitrogen gas are adjusted so that the temperature of the lens element 503b reaches the target temperature. In the illustrated embodiment, while the temperature (average temperature) of the lens element 503b is not directly measured, it is controlled so that the measurement temperature measured by the temperature sensor 505 becomes substantially equal to the target temperature. However, if further accurate control is required, it may be achieved that after the control of temperature adjustment device 507 so that the temperature of the temperature sensor 505 of FIG. 46 becomes the target temperature, a value of the measurement temperature of the temperature sensor 505 at which the imaging characteristic of the projection optical system PL becomes closest to the design value is determined in minute adjustment manner while the imaging characteristic is being actually measured. Thereafter, the control is effected by using the determined temperature value as a target value to be set in the temperature adjustment device 507.

The above-mentioned operation is continued during the actual exposure. Accordingly, the imaging characteristic is kept constant through the entire exposing process of the projection optical system PL. Since the nitrogen gas is used as the control fluid, the spaces (filled with the air in the conventional techniques) are filled with the nitrogen gas. As a result, when the short wavelength light such as the ArF excimer laser light is used as the exposure light source as is in the illustrated embodiment, it can be prevented that the illumination energy is decreased due to the absorption of light energy, unlike the case of the oxygen. In place of air, since the fluid such as nitrogen gas which is chemically and optically inert and is hard to be reacted is used, the disadvantage due to the generation of ozone can be avoided. As is in the illustrated embodiment, since not only the ArF excimer laser light is used as the illumination light but also the fluid having no band or zone absorbing the wavelength of the used illumination light is selected as the control fluid, even when any illumination light is used, the illumination energy of the illumination light is not absorbed by the control fluid, with the result that the illumination light can be directed onto the wafer W efficiently.

Next, an eighteenth embodiment of the present invention will be explained with reference to FIG. 47. In this embodiment, a pellicle (dust-proof film) for preventing foreign matters from adhering to a pattern surface of a reticle is attached to a lower surface of the reticle to form a sealed space between the pellicle and the pattern surface of the reticle. The sealed space is filled with nitrogen gas. Further, a space between an illumination optical system and a projection optical system is also sealed, and this sealed space is filled with nitrogen gas. Since the other constructions of this embodiment are the same as those of the embodiment shown in FIG. 46, the elements same as those shown in FIG. 46 are designated by the same reference numerals and explanation thereof will be omitted.

Figure 47:
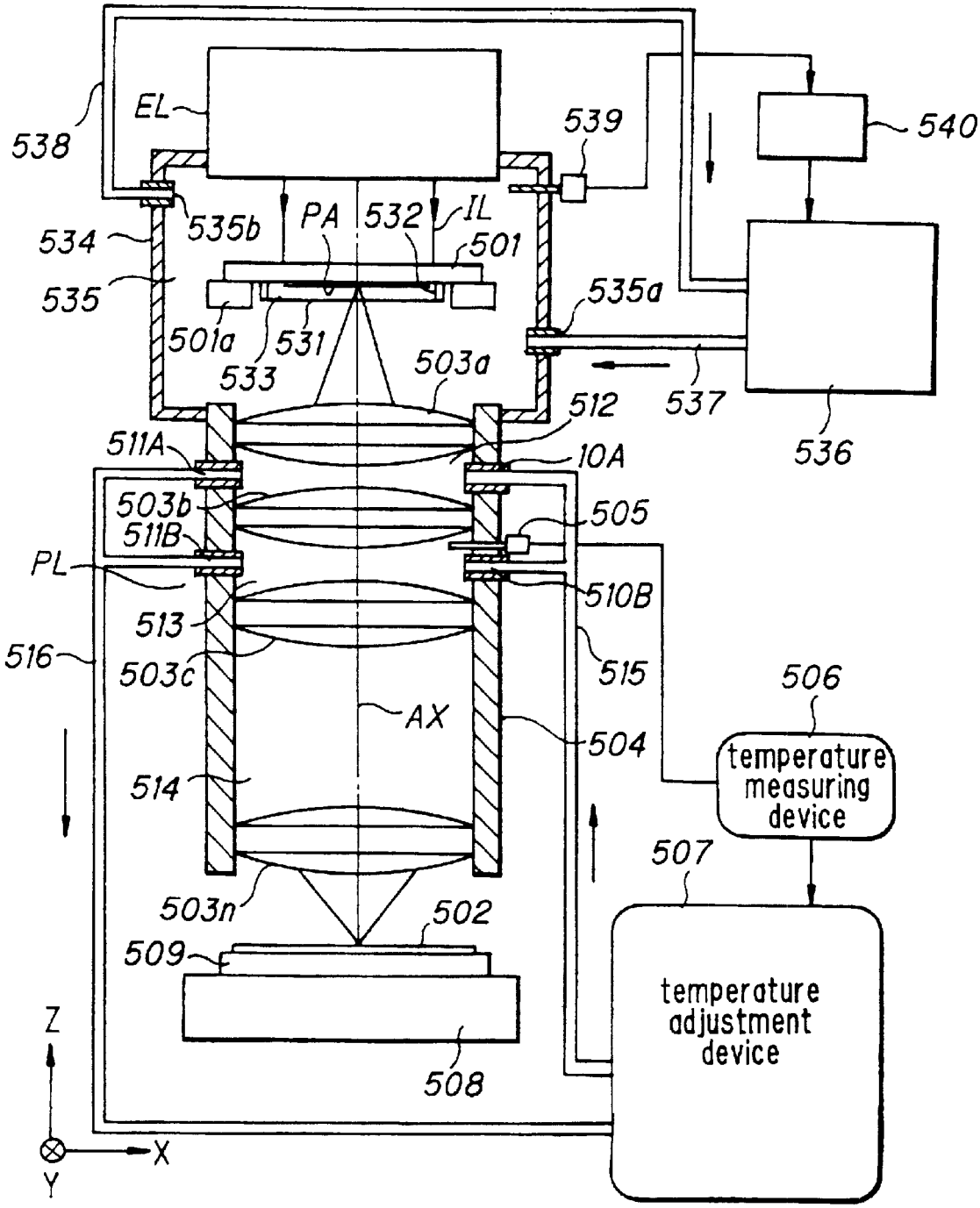
FIG. 47 is a schematic constructional view, in partial section, showing a projection exposure apparatus according to an eighteenth embodiment of the present invention.

FIG. 47 schematically shows a construction of the projection exposure apparatus according to this embodiment. In FIG. 47, the pellicle 531 is mounted on the pattern surface of the reticle 501 via a pellicle frame 532 so that the pellicle becomes in parallel with the reticle and a predetermined space is formed between the pellicle and the reticle. The pellicle 531 is formed from a substantially square transparent thin film, and a closed space 533 covering the entire pattern area PA on the reticle 501 is defined by the pellicle 531, reticle 501 and pellicle frame 532. The space 533 is filled with the nitrogen gas. In order to fill the closed space 533 with the nitrogen gas, the pellicle may be attached to the reticle in a nitrogen gas atmosphere condition, or, when the pellicle film has sufficient strength, after the pellicle is attached to the reticle, a space defined by the reticle, pellicle frame and pellicle may be made in a vacuum condition, and then the space may be filled with the nitrogen gas.

A lower portion of the illumination optical system EL and an upper portion of the lens barrel 504 of the projection optical system PL are secured to a cylindrical frame 534, and a substantially sealed space 535 is defined by a lower surface of the illumination optical system EL, frame 534, lens barrel 504 of the projection optical system PL and the uppermost lens element 503a of the projection optical system PL. The reticle 501 and a reticle stage 501a are disposed within this space 535. The nitrogen gas for adjusting the temperature is circulated through the space 535. The nitrogen gas is supplied to the space 535 from an external temperature adjustment device 536 through a supply conduit 537 and an introduction port 353a formed in the frame 534. After the temperature in the space 535 is adjusted by the nitrogen gas, the nitrogen gas is returned to the temperature adjustment device 536 through a discharge port 535b formed in the frame 534 and a discharge conduit 538. A temperature sensor 539 for measuring the temperature in the space 535 is mounted on the frame 534. A measured value from the temperature sensor 539 is supplied to a temperature measuring device 540 so that the temperature adjustment device 536 compares the measured value from the temperature sensor 539 with the target temperature and controls the temperature and flow rate of the nitrogen gas supplied to the space 535.

In the illustrated embodiment, while an example that two spaces 533, 535 between the pellicle 531 and the reticle 501 and between the illumination optical system EL and the projection optical system PL are provided is explained, one of these spaces may be provided. As is in the embodiment shown in FIG. 46, the gas supplied to the spaces 533, 535 is not limited to the nitrogen gas, but, various gases or liquids can be used in accordance with the kind of the illumination light.

According to the projection exposure apparatus of this embodiment having the above-mentioned construction, the illumination light IL emitted from the illumination optical system EL reaches the projection optical system PL without contacting with the air. Accordingly, in addition to the advantage obtained by the embodiment shown in FIG. 46, the amount of the laser energy absorbed to the oxygen in the air is further decreased while the illumination light from the illumination optical system EL reaches the wafer W, thereby utilizing the energy from the light source effectively. Further, since the space 533 between the pellicle 531 and the reticle 501 is filled with the nitrogen gas, the ozone is not generated, thereby preventing the absorption of the illumination energy due to accumulation of ozone.

Since the temperature in the space 535 is controlled, the temperature of the reticle 501 is also adjusted. Accordingly, for example, the distortion of the pattern and the change in the imaging characteristic caused by expansion of the reticle can be suppressed.

As mentioned above, when the space 533 between the pellicle 531 and the reticle 501 is formed independently from the space 535 enclosing the reticle 501, the nitrogen gas contained in the space 533 does not absorb the ArF excimer laser light and prevents the production of the impurity such as fog due to the laser energy, thereby preventing the smudge of the pattern surface.

Since the pressure in the space defined by the reticle 501, pellicle 531 and pellicle frame 532 is adjusted, it can be designed so that a certain amount of gas is introduced into the space 533 filled with the nitrogen gas, i.e., a vent hole is formed in the pellicle frame 532. With this arrangement, it is considered that the oxygen is gradually entered into the space 533, thereby decreasing the effect of the nitrogen gas. In such a case, as is in the illustrated embodiment, by bringing the entire space enclosing the reticle 501 to the nitrogen gas atmosphere, the desired purpose can be achieved. If the reticle is stored in the place exposed to the oxygen, since the oxygen is gradually entered into the space 533 and/or the space 535, the desired effect cannot be achieved. Accordingly, it is desirable that the reticle is stored in the nitrogen gas atmosphere.

The projection exposure apparatus according to the seventeenth and eighteenth embodiments is not limited to the projection exposure apparatus of stepper type, but, can be applied to a scan-exposure type projection exposure apparatus of step-and-scan type in which a reticle and a wafer are simultaneously scanned so that pattern images of the reticle are successively transferred to shot areas on the wafer.

According to the projection exposure apparatus of the seventeenth embodiment of the present invention, by controlling the temperature(s) of the lens element(s) in the projection optical system by using the temperature-controlled fluid, the imaging characteristics of the projection optical system are corrected. Accordingly, for example, it is possible to suppress the change in the imaging characteristics of the projection optical system caused by the change in the environmental condition and the illumination amount of the illumination light. Further, since the fluid having no absorbing band absorbing the wavelength(s) of the illumination light is used, the loss of the illumination energy of the illumination light can be reduced.

In addition, merely by controlling the temperature of the fluid, the change in the imaging characteristics of the projection optical system can be suppressed. Since the fluid has no absorbing band absorbing the wavelength(s) of the illumination light, the light energy of the illumination light is not absorbed to the temperature control fluid but can reaches the photosensitive substrate.

According to the projection exposure apparatus of the eighteenth embodiment of the present invention, the dust and other foreign matters can be prevented from adhering to the pattern surface of the reticle by the dust-proof film (pellicle). Further, since the fluid has no absorbing band absorbing the wavelength(s) of the illumination light is used, the loss of the illumination energy of the illumination light can be reduced.

What is claimed is:

1. [A projection] *An* exposure apparatus [wherein a mask pattern is projected to a photosensitive substrate,] comprising:

a projection optical system having a plurality of optical members made of glass materials, at least a first optical member having an index of refraction responsive to temperature in a different manner from that of a second optical member; and a temperature control device which is provided in the vicinity of at least one of said optical members and controls the temperature of said at least one of said optical members[, wherein, an imaging characteristic of said projection optical system is controlled by using said temperature control device].

2. [A projection] *An* exposure apparatus according to claim 1, wherein [the] *an* imaging characteristic [to be] *that is* controlled by said temperature control device is a non-linear magnification error.

3. [A projection] *An* exposure apparatus according to claim 2, wherein the non-linear magnification error of said projection optical system is corrected within a range of ±50 nm by changing the temperature of the optical member to be controlled by ±1° C.

4. [A projection] *An* exposure apparatus according to claim 2, further comprising a linear magnification control device for correcting a linear magnification error of said projection optical system, and wherein the linear magnification error remaining after the non-linear magnification error of said projection optical system is corrected to fall in a predetermined allowable range by said temperature control device is reduced by said linear magnification control device.

5. [A projection] *An* exposure apparatus according to claim 1, further comprising a memory system for storing a change amount of [the] *an* imaging characteristic of said projection optical system in accordance with the change in an applied condition of said projection optical system, and wherein the imaging characteristic of said projection optical system is controlled by said temperature control device so that the change amount of the imaging characteristic stored in said memory system is canceled in accordance with the change in the applied condition of said projection optical system.

6. [A projection] *An* exposure apparatus according to claim [1] 2, wherein the imaging characteristic is a position of an image plane of said projection optical system in the direction of an optical axis of said projection optical system.

7. [A projection] *An* exposure apparatus according to claim 6, wherein a curvature of field of said projection optical system is controlled by said temperature control device, and further comprising a magnification error control device for controlling a magnification error of said projection optical system, and wherein the magnification error generated when the curvature of field of said projection optical system is controlled by said temperature control device is reduced by said magnification error control device.

8. [A projection] *An* exposure apparatus according to claim 7, wherein the curvature of field of said projection optical system is corrected to fall in a range of ±0.3 $\mu$m or less by controlling the temperature of said optical member to be controlled within a range of ±1° C. or less by means of said temperature control device.

9. [A projection] *An* exposure apparatus according to claim 6, further comprising a memory system for storing a change amount of a position of the image plane of said projection optical system in accordance with the change in an applied condition of said projection optical system, and wherein the position of the image plane of said projection optical system is controlled by said temperature control device so that the change amount of the position of the image plane stored in said memory system is canceled in accordance with the change in the applied condition of said projection optical system.

10. [A projection] *An* exposure apparatus according to claim 6, further comprising a focus position control device for shifting the image plane of said projection optical system and said photosensitive substrate relative to each other in the direction of the optical axis of said projection optical system, and wherein offset of the focus position remaining after the position of the image plane of said projection optical system is controlled by said temperature control device is reduced by said focus position control device.

11. A projection exposure apparatus wherein a mask pattern is projected to a photosensitive substrate, comprising:

a projection optical system having a plurality of optical members made of glass material, at least a first optical member having an index of refraction responsive to temperature in a different manner from that of a second optical member;

a temperature control device which is provided in the vicinity of at least one of said optical members and sets a temperature of said at least one of said optical members to a variable target temperature determined by a focusing feature of said projection optical system; and an exposure control device for starting an exposing operation regarding said photosensitive substrate after the temperature of said optical member to be controlled by said temperature control device falls in a predetermined allowable range for the target temperature.

12. A projection exposure apparatus according to claim 11, further comprising a temperature sensor for measuring the temperature of said optical member to be controlled by said temperature control device, and wherein said exposure control device compares a measured value of said temperature sensor with the target temperature and judges whether the exposing operation is to be started.

13. A projection exposure apparatus according to claim 11, further comprising a memory system for storing a time period during which the temperature of said optical member to be controlled by said temperature control device reaches a predetermined temperature, and wherein said exposure control device starts the exposing operation regarding said photosensitive substrate after a time period corresponding to the time period stored in said memory system is elapsed.

14. A projection exposure apparatus according to claim 11, wherein, when the temperature of said optical member to be controlled by said temperature control device is changed to the target temperature, an intermediate temperature is set by said temperature control device so that it is overshot or under shot with respect to the target temperature.

15. A projection exposure apparatus wherein a mask pattern is projected to a photosensitive substrate through a projection optical system with predetermined exposure illumination light, and projection optical system comprising:

at least one set of lens element, each set including two lens elements of glass materials having opposite effects for contributing to the change in the focus position in response to temperature change, said glass materials of said set of the lens elements being selected so that at least one of the focus position and a magnification error of the entire projection optical system including a focus position and a magnification error caused by expansion/contraction of a holding member for holding said set of lens elements does not substantially change in response to predetermined temperature change.

16. A projection exposure apparatus according to claim 15, wherein there are two sets of lens elements each of which comprises said lens elements made of the glass materials having opposite effects for contributing to the change in the focus position in response to the temperature change.

17. A projection exposure apparatus according to claim 15, wherein the predetermined exposure illumination light is a laser beam emitted from an excimer laser light source and having a wavelength of 100–300 nm, and the glass materials are quartz and fluorite.

18. A projection exposure apparatus according to claim 17, wherein said lens element made of fluorite in said set of lens elements is isolated from the surrounding gas in said projection optical system by means of at least one lens element made of other glass material.

19. A projection exposure apparatus wherein a mask pattern is transferred onto a photosensitive substrate through a projection optical system with predetermined exposure illumination light, comprising:

a temperature control device for supplying temperature-controlled fluid having no absorbing band for the wavelength of the illumination light to the surroundings of a lens element to be controlled in said projection optical system, and wherein the temperature of said lens element to be controlled is controlled by said temperature control device to control an imaging characteristic of said projection optical system.

20. A projection exposure apparatus wherein a mask pattern is transferred onto a photosensitive substrate through a projection optical system with illumination light from an illumination optical system, comprising:

a temperature control device for supplying temperature-controlled fluid having no absorption band for the wavelength of the illumination light to an illumination light path between said illumination optical system and said substrate, and wherein an imaging characteristic of said projection optical system is controlled by said temperature control device.

21. [A projection] *An* exposure apparatus [wherein a pattern on a pattern forming surface of a mask is transferred onto a photosensitive substrate through a projection optical system with predetermined exposure illumination light,] comprising:

a [light-permeable dust-proof films] *light transmitting member* disposed over [said] *a* pattern forming surface of [said] *a* mask with a predetermined gap and [fluid] *a medium* having [no] *a low* absorption band for the wavelength of the illumination light contained between said mask and said [dust-proof films] *light transmitting member*.

22. A projection exposure apparatus wherein a mask pattern is transferred onto a photosensitive substrate through a projection optical system with illumination light from an illumination optical system, comprising:

a correction device for correcting the change in an imaging characteristic due to accumulation of heat of the illumination light and environmental change, wherein said correction device includes at least two different control systems and a substrate lifting/lowering mechanism so that a non-linear magnification error and curvature of field are corrected by combination of said control system and said substrate lift/lower mechanism.

23. A projection exposure apparatus according to claim 22, wherein said control systems include at least two of:

(a) a control system for driving two lens elements independently in the direction of an optical axis and for changing their inclination;

(b) a control system for changing the pressure in a space between two lens elements; and (c) a control system which is provided in the vicinity of at least one [of said two] lens [elements] *element* and changes the temperature of said at least one [of said two] lens [elements] *element*.

24. [A projection] *An* exposure apparatus [wherein a mask pattern is projected to a photosensitive substrate,] comprising:

a projection optical system having a plurality of *first* optical members made of *a first* glass [materials] *material and at least one second optical member made of a second glass material having an index of refraction responsive to temperature in a different manner from that of said first glass material*;

at least one temperature sensor [for sensing] *which is provided in a vicinity of said at least one second optical member and senses* the temperature of *said* at least [a first] *one second* optical member; and a temperature control device which is provided in the vicinity of *said* at least [said first] *one second* optical member and controls the temperature of *said* at least [said first] *one second* optical member in response to said at least one temperature sensor[; wherein, an imaging characteristic of said projection optical system is controlled by using said temperature control device].

25. A projection exposure apparatus wherein a mask pattern is projected to a photosensitive substrate, comprising:

a projection optical system having a plurality of optical members made of glass materials, at least one of which has a temperature feature of index of refraction different from that of the other glass material; and a temperature control device which is provided in the vicinity of said at least one optical member and controls the temperature of at least one of said optical members; wherein, a focusing feature of said projection optical system is controlled by using said temperature control device; and the focusing feature to be controlled by said temperature control device is a non-linear magnification error.

26. A projection exposure apparatus wherein a mask pattern is projected to a photosensitive substrate, comprising:

a projection optical system having a plurality of optical members made of glass materials, at least one of which has a temperature feature of index of refraction different from that of the other glass material; and a temperature control device which is provided in the vicinity of said at least one optical member and controls the temperature of at least one of said optical members; wherein, a focusing feature of said projection optical system is controlled by using said temperature control device; and a memory system for storing a change amount of the focusing feature of said projection optical system in accordance with the change in an applied condition of said projection optical system, and wherein the focusing feature of said projection optical system is controlled by said temperature control device so that the change amount of the focusing feature stored in said memory system is cancelled in accordance with the change in the applied condition of said projection optical system.

27. A projection exposure apparatus wherein a mask pattern is projected to a photosensitive substrate, comprising:

projection optical system having a plurality of optical members made of glass materials, at least one of which has a temperature feature of index of refraction different from that of the other glass material; and a temperature control device which is provided in the vicinity of said at least one optical member and controls the temperature of at least one of said optical members; wherein, a focusing feature of said projection optical system is controlled by using said temperature control device; and the focusing feature is a position of a focusing plane of said projection optical system in the direction of an optical axis of said projection optical system.

28. A projection exposure apparatus wherein a mask pattern is projected to a photosensitive substrate, comprising:

a projection optical system having a plurality of optical members made of glass materials, at least one of which has a temperature feature of index of refraction different from that of the other glass material;

a temperature control device which is provided in the vicinity of said at least one optical member and sets a temperature of at least one of said optical members to a variable target temperature determined by a focusing feature of said projection optical system;

an exposure control device for starting an exposing operation regarding said photosensitive substrate after the temperature of said optical member to be controlled by said temperature control device falls in a predetermined allowable range for the target temperature; and a temperature sensor for measuring the temperature of said optical member to be controlled by said temperature control device, and wherein said exposure control device compares a measured value of said temperature sensor with the target temperature and judges whether the exposing operation is to be started.

29. A projection exposure apparatus wherein a mask pattern is projected to a photosensitive substrate, comprising:

a projection optical system having a plurality of optical members made of glass materials at least one of which has a temperature feature of index of refraction different from that of the other glass material;

a temperature control device which is provided in the vicinity of said at least one optical member and sets a temperature of at least one of said optical members to a variable target temperature determined by a focusing feature of said projection optical system;

an exposure control device for starting an exposing operation regarding said photosensitive substrate after the temperature of said optical member to be controlled by said temperature control device falls in a predetermined allowable range for the target temperature; and a memory system for storing a time period during which the temperature of said optical member to be controlled by said temperature control device reaches a predetermined temperature, and wherein said exposure control device starts the exposing operation regarding said photosensitive substrate after a time period corresponding to the time period stored in said memory system has elapsed.

30. A projection exposure apparatus wherein a mask pattern is projected to a photosensitive substrate, comprising:

a projection optical system having a plurality of optical members made of glass materials at least one of which has a temperature feature of index of refraction different from that of the other glass material;

a temperature control device which is provided in the vicinity of said at least one optical member and sets a temperature of at least one of said optical members to a variable target temperature determined by a focusing feature of said projection optical system; and an exposure control device for starting an exposing operation regarding said photosensitive substrate after the temperature of said optical member to be controlled by said temperature control device falls in a predetermined allowable range for the target temperature;

wherein, when the temperature of said optical member to be controlled by said temperature control device is changed to the target temperature, an intermediate temperature is set by said temperature control device so that it is over-shot or under-shot with respect to the target temperature.

31. A projection exposure apparatus wherein a mask pattern is projected to a substrate through a projection optical system comprising:

a temperature control device which is provided in the vicinity of at least one optical member and controls the temperature of at least one optical member of said projection optical system *to correct a first imaging characteristic of said projection optical system*; and an imaging characteristic control system provided separately from said temperature control device [for correcting an] *to correct a second* imaging characteristic *which is different from said first imaging characteristic* of said projection optical system.

32. A projection exposure apparatus according to claim 31, wherein said imaging characteristic control system corrects an error in an imaging characteristic which is caused as a result of controlling of imaging characteristics of the projection optical system carried out by said temperature control device.

33. A method of projecting a mask pattern to a substrate through a projection optical system comprising:

correcting a first imaging characteristic of said projection optical system by controlling the temperature of at least one optical member of the projection optical system; and correcting an error in a second imaging characteristic which is different from said first imaging characteristics, said error being caused as a result of controlling the temperature of said at least one optical member.

34. A method of projecting a mask pattern to a substrate through a projection optical system *which has a plurality of optical members made of a first glass material and at least one optical member made of a second glass material having an index of refraction responsive to temperature in a different manner from that of said first glass material, the method* comprising:

controlling the temperature of *said* at least one optical member *of the second glass material* of said projection optical system so that [the] *said at least one* optical member *of the second glass material* has a target temperature; and starting a projection exposure operation after the temperature of [the] *said at least one* optical member *of the second glass material* has reached said target temperature.

35. A projection exposure apparatus according to claim 1, wherein the optical member which is controlled by said temperature control device is made of fluorite.

36. A projection exposure apparatus according to claim 7, wherein the optical member which is controlled by said temperature control device is made of fluorite.

37. A projection exposure apparatus according to claim 11, wherein the optical member which is controlled by said temperature control device is made of fluorite.

38. A method of projecting a mask pattern to a substrate through a projection optical system so as to form a circuit element on the substrate comprising:

controlling the temperature of at least one optical member of said projection optical system so that at least one of a non-linear magnification error and a curvature of field of the projection optical system is corrected; and projecting said mask pattern to said substrate.

39. A method of projecting a mask pattern to a substrate through a projection optical system so as to form a circuit element on the substrate comprising:

correcting a first imaging characteristic of said projection optical system by controlling the temperature of at least one optical member of the projection optical system.

correcting an error in a second imaging characteristic which is caused as a result of controlling the temperature of said at least one optical member; and projecting said mask pattern to said substrate.

40. A method of projecting a mask pattern to a substrate through a projection optical system so as to form a circuit element on the substrate, *wherein said projection optical system has a plurality of optical members made of a first glass material and at least one optical member made of a second glass material having an index of refraction responsive to temperature in a different manner from that of said first glass material, said method* comprising:

controlling the temperature of *said* at least one optical member *of the second glass material* of said projection optical system so that [the] *said at least one* optical member *of the second glass material* has a target temperature; and starting a projection of said mask pattern to said substrate after the temperature of [the] *said at least one* optical member *of the second glass material* has reached said target temperature.

41. A projection exposure apparatus according to claim 1, wherein said temperature control device comprises a temperature control element provided so as to contact said at least one optical member.

42. A projection exposure apparatus according to claim 1, wherein said temperature control device controls the temperature of said at least one optical member without contacting said at least one optical member.

43. A projection exposure apparatus according to claim 11, wherein said temperature control device comprises a temperature control element provided so as to contact said at least one optical member.

44. A projection exposure apparatus according to claim 11, wherein said temperature control device controls the temperature of said at least one optical member without contacting said at least one optical member.

45. A projection exposure apparatus according to claim 22, further comprising a stage on which a photosensitive substrate is mounted, said stage having a light receiving portion, wherein said non-linear magnification error and said curvature of field are measured by shifting said mask pattern and said light receiving portion relative to each other.

46. A method for making a lithographic system, comprising:

providing a projection optical system which has a plurality of optical members made of glass materials, at least a first optical member having an index of refraction responsive to temperature in a different manner from that of a second optical member; and providing a temperature control device which controls the temperature of at least one of said optical members.

*47. A method of projecting a mask pattern to a substrate through a projection optical system comprising:*

*controlling the temperature of at least one optical member of said projection optical system so that at least one of a non-linear magnification error and a curvature of field of the projection optical system is corrected.*

*48. An exposure apparatus comprising:*

*a mask having a surface on which a pattern is formed;*

*a light transmitting member disposed to have a predetermined gap between itself and said surface having the pattern; and*

*a structure defining a chamber to accommodate said mask and said light transmitting member,*

*wherein a space between said surface having the pattern of the mask and said light transmitting member provides a gaseous atmosphere having an absorption characteristic less than that of oxygen with respect to a wavelength of an illumination light with which said mask is irradiated.*

*49. An exposure apparatus according to claim 48, wherein the atmosphere provided in said chamber is the same gaseous atmosphere provided in said space.*

*50. An exposure apparatus according to claim 49, wherein said gaseous atmosphere in said space and said chamber is provided by an inert gas.*

*51. An exposure apparatus according to claim 50, wherein said space is enclosed by said surface having the pattern of the mask, said light transmitting member, and a frame member disposed between said surface and said light transmitting member.*

*52. An exposure apparatus according to claim 51, further comprising a supply device connected to said chamber to supply said gas to said chamber, and wherein said frame member has a vent hole so that the gas supplied to said chamber can enter said space through said vent hole.*

*53. A projection exposure method comprising:*

*providing a gaseous atmosphere in a space between a surface on which a pattern is formed and a light transmitting member disposed to have a predetermined*

*gap between itself and said surface having the pattern, said gaseous atmosphere having an absorption characteristic less than that of oxygen with respect to a wavelength of an illumination light with which said pattern is irradiated; and*

*transferring an image of said pattern onto a substrate while said gaseous atmosphere between said surface having the pattern and said light transmitting member is maintained.*

*54. A method according to claim 53, wherein a gas providing said gaseous atmosphere is an inert gas.*

*55. A mask structure comprising:*

*a surface having a pattern;*

*a light transmitting member disposed to have a predetermined gap between itself and said surface;*

*a frame member disposed between said surface having the pattern and said light transmitting member; and*

*a fluid sealed in a space enclosed by said surface having the pattern, said light transmitting member, and said frame member, said fluid having an absorption characteristic less than that of oxygen with respect to a wavelength of an illumination light with which said pattern is irradiated.*

*56. A mask structure according to claim 55, wherein said fluid is an inert gas.*

*57. An exposure method for transferring an image of a pattern formed on a mask onto a substrate, wherein a mask structure according to claim 55 is used as said mask.*

*58. A method of manufacturing a mask structure according to claim 55, wherein the mask structure is manufactured in a fluidic atmosphere having an absorption characteristic less than that of oxygen with respect to a wavelength of an illumination light with which said mask structure is irradiated.*

*59. A method of manufacturing a mask structure comprising:*

*providing a space enclosed by a surface having a pattern, a light transmitting member disposed to have a predetermined gap between itself and said surface, and a frame member disposed between said surface having the pattern and said light transmitting member;*

*applying vacuum to said space to evacuate said space; and*

*supplying a fluid to said space and sealing the fluid in said space after said space has been evacuated, said fluid having an absorption characteristic less than that of oxygen with respect to a wavelength of an illumination light with which said mask structure is irradiated.*

* * * * *